United States Patent
Hessel et al.

(10) Patent No.: US 6,381,265 B1
(45) Date of Patent: Apr. 30, 2002

(54) FIELD PROGRAMMABLE MODULATOR-DEMODULATOR ARRANGEMENT FOR RADIO FREQUENCY COMMUNICATIONS EQUIPMENT AND METHOD THEREFOR

(75) Inventors: Clifford Hessel; Michael E. Kreeger, both of Rochester, NY (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/184,711

(22) Filed: Nov. 3, 1998

Related U.S. Application Data

(60) Provisional application No. 60/064,097, filed on Nov. 3, 1997, provisional application No. 60/064,098, filed on Nov. 3, 1997, and provisional application No. 60/064,132, filed on Nov. 3, 1997.

(51) Int. Cl.[7] .............................. H04B 1/38; H04L 5/16
(52) U.S. Cl. ...................... 375/219; 375/269; 375/271; 455/84
(58) Field of Search ................................. 375/219, 222, 375/271, 272, 269, 279, 302, 303, 308, 322, 324, 326, 328, 329, 334, 340; 455/78, 84, 85, 86

(56) References Cited

U.S. PATENT DOCUMENTS

| | | | |
|---|---|---|---|
| 5,423,076 A | * | 6/1995 | Westergren et al. ........... 455/86 |
| 5,872,810 A | * | 2/1999 | Philips et al. ................ 375/222 |
| 6,016,422 A | * | 1/2000 | Bartusiak ..................... 455/76 |
| 6,125,148 A | * | 9/2000 | Frodigh et al. |

* cited by examiner

*Primary Examiner*—Chi Pham
*Assistant Examiner*—Phuong Phu
(74) *Attorney, Agent, or Firm*—Duane Morris LLP

(57) ABSTRACT

A digital signal processing circuit for field programmable radio frequency communications system including a digital controlled numerical controlled oscillator (NCO), dual digital signal conditioning circuits, and dual mixer circuits. The various circuits are responsive to digital commands for configuring the digital signal processing circuit to function with a variety of signaling schemes or waveforms. When configuring for angle modulation, a single conditioning and mixer is used and the modulating digital input signal is up converted to the center frequency of the NCO by the conditioning circuit and applied to an offset input of the NCO.

22 Claims, 48 Drawing Sheets

| | | |
|---|---|---|
| CONFIGURATION LOCK (CL) | ADDRESS 0X00 - 0X07 | 136 |
| MODE LOCK (ML) | ADDRESS 0X08 - 0X3F | |
| DOUBLE BUFFERED (DB-M, DB-S, V AND FIFO) | ADDRESS 0X40 - 0X8F | |
| PFIR COEF (ML) | ADDRESS 0XC0 - 0XFF | |

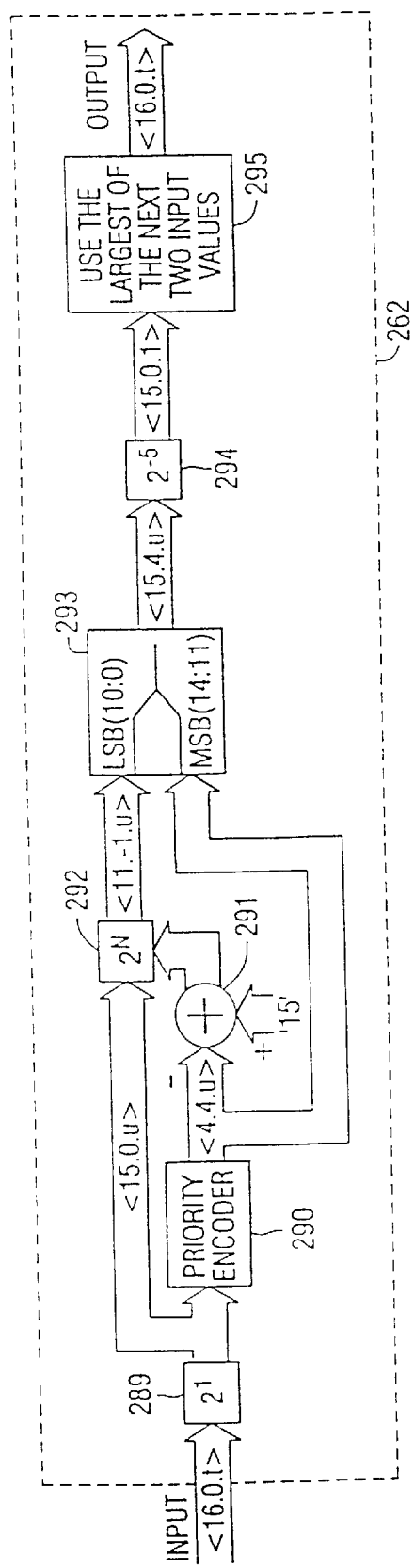
FIG. 25
FIG. 26
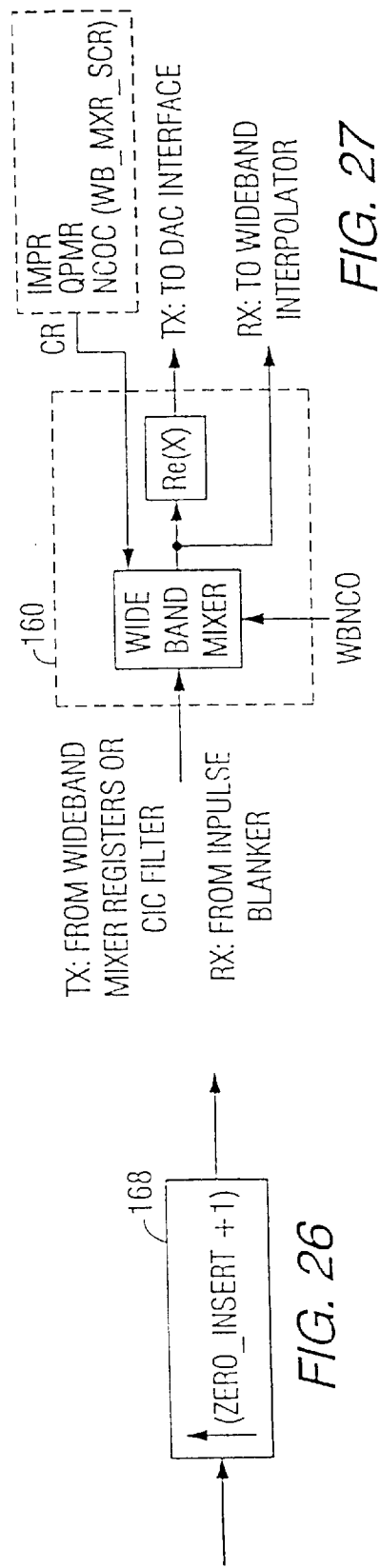
FIG. 27

FIELD PROGRAMMABLE MODULATOR-DEMODULATOR ARRANGEMENT FOR RADIO FREQUENCY COMMUNICATIONS EQUIPMENT AND METHOD THEREFOR

This application claims the benefit of the U.S. Provisional Applications Serial Number 60/064,097, filed Nov. 3, 1997; Ser. No. 60/064,098, filed Nov. 3, 1997; and Ser. No. 60/064,132, filed Nov. 3, 1997.

BACKGROUND OF THE INVENTION

Descriptions of the various components of the system are contained in co-pending patent applications owned by the assignee hereof and filed concurrently herewith, specifically: U.S. Pat. No. 6,091,765, Issued on Jul. 18, 2000, entitled "Reconfigurable Radio System Architecture And Method Therefor"; U.S. patent application Ser. No. 09/184,716, entitled "A Control System For Controlling The Processing Data Of A First In First Out Memory And Method Therefor"; U.S. patent application Ser. No. 09/184,940, entitled "Configurable Circuits for Field Programmable Radio Frequency Communications Equipment and Methods Therefor"; U.S. patent application Ser. No. 09/184,710, entitled "A System For Accelerating the Reconfiguration of a Transceiver and Method Therefor"; U.S. patent application Ser. No. 09/184,709, entitled "A Field Programmable Radio Frequency Communications Equipment Including A Configurable IF Circuit, And Method Therefore"; U.S. patent application Ser. No. 09/184,708, entitled "A Digital Noise Blanker For Communications Systems And Methods Therefor"; U.S. patent application Ser. No. 09/184,712, entitled "TCM Revisiting System and Method"; U.S. patent application Ser. No. 09/184,941, entitled "Least Squares Phase Fit As Frequency Estimate"; U.S. patent application Ser. No. 09/184,715, entitled "Polar Computation of Branch Metrics For TCM"; U.S. patent application Ser. No. 09/184,746, entitled "Efficient Modified Viterbi Decoder"; U.S. patent application Ser. No. 09/184,713, entitled "Receiver For a Reconfigurable Radio System and Method Therefore"; each of which is incorporated herein by reference.

This application relates to field programmable radio frequency communications systems and more particularly to a field programmable digital intermediate frequency (IF) angle modulation circuits and signal processing circuits therefor.

In the use of radio frequency equipment for communications, there is a need for a large a variety of types communication devices, such as receivers, transmitters and transceivers that are able to operate with a large variety of communications schemes, or waveforms such as, AM, AME, A3E, H3E, J3E, CW, SSB, M-PSK, QAM, ASK, and angular modulation, such as, FM, PM, FSK, CMP, MSK, CPFSK etc. as well a need of being able to process the signals within the communications devices, such as by filtering, gain control, impulse noise rejection, etc. To achieve this in the past, a plurality of different dedicated pieces of equipment was required, such as, receivers, transmitters and transceivers, each designed to operate with separate communication schemes or waveforms, or a limited group of schemes or waveforms. Hence it would be desirous to have a configurable type of radio frequency communications equipment that is readily field programmable to function as a transmitter and receiver and to be able to be programmed to function with any of the above mentioned communications schemes or waveforms.

An important building block for a configurable type transceiver is a configurable digital intermediate frequency (IF) transmitter and receiver signal processing circuit that can be field programmed to provide the receiver demodulation functions and transmitter modulator functions and also corresponding waveform filtering and shaping.

Is therefor an object of this invention to provide a new and improved configurable digital signal processing circuit arrangement that can be readily configured by the user in the field to function in plural modulator and demodulator modes of operation.

Is also an object of this invention to provide a new and improved configurable digital signal processing circuit that can be configured by the user in the field to operate as a modulator and demodulator with the use of a plurality of communications scheme or waveforms.

Is also an object of this invention to provide a new and improved configurable digital signal processing circuit for radio frequency communications equipment that can be configured by the user in the field to operate in the modulator and demodulator modes of operation with a plurality of communications schemes or waveforms and configured to provide filtering and wave shaping parameters in accordance with the selected communications scheme or waveform.

Is therefor an object of this invention to provide a new and improved configurable modulator circuit arrangement for radio frequency communications equipment that can be configured by the user in the field.

Is also an object of this invention to provide a new and improved configurable modulator circuit for digital IF signal processing system for radio frequency communications equipment that can be configured by the user in the field to operate with any of a plurality of communications schemes or waveforms.

Is also an object of this invention to provide a new and improved configurable modulator circuit for digital IF signal processing system for radio frequency communications equipment that can be readily configured by the user in the field to operate in any of a plurality of communications schemes or waveforms and configured to provide filtering and wave shaping parameters in accordance with the selected communications scheme or waveform.

These and other objects and advantages of the present invention will be readily apparent to one skilled in the art to which the invention pertains form a perusal of the claims, the appended drawings, and the following detailed description of the preferred embodiments.

BRIEF DESCRIPTION OF THE DRAWINGS

FIG. 25 is a block diagram of a log-linear and take largest of two circuit of the impulse noise blanker circuit of FIG. 24.

FIG. 26 is a block diagram of a wideband interpolator circuit of the receiver demodulator configuration.

FIG. 27 is a block diagram of a wideband mixer circuit of both the transmitter modulator and receiver demodulator configuration.

DESCRIPTION OF PREFERRED EMBODIMENTS

The invention uses an IF (carrier based) digital multi bit signal processing circuits to implement field programmable digital processor type of radio frequency communications functions in configurable hardware under control of a field programmable radio communications system, or a computer. Carrier based, as used herein, means that the signals can be processed at a system intermediate frequency, or at the RF system carrier frequency, although the invention is to be described herein as operating at the intermediate frequency.

1) Field Programmable Radio Communications System Description

The radio communications system described herein is the subject of a separate patent application filed concurrently herewith.

Figure 1:
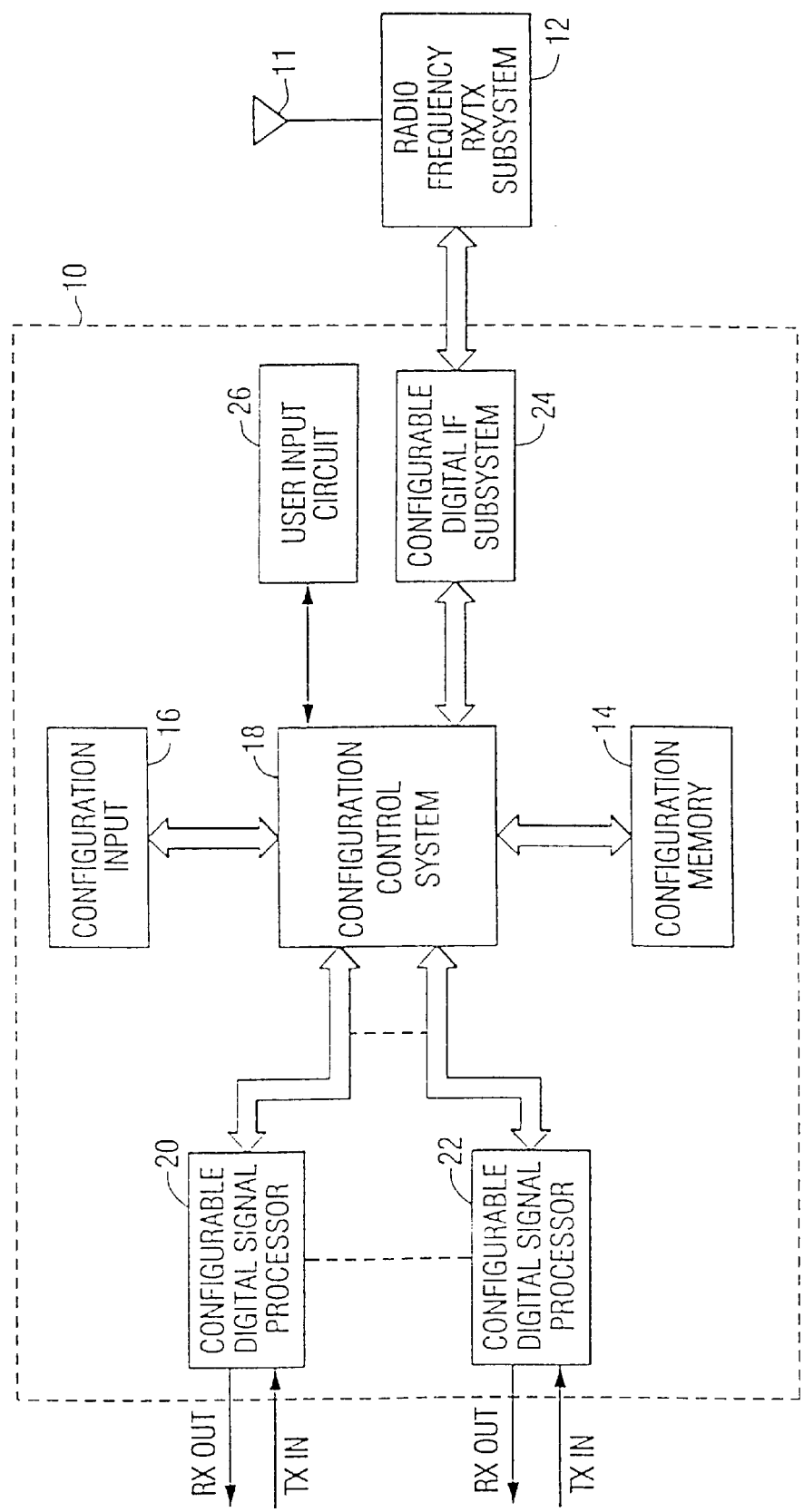
FIG. 1 is a block diagram of a field programmable radio frequency communications system, including a configurable digital IF subsystem, that can be field configured to operate in the receiver or transmitter mode of operation, the selected signaling scheme or waveform, and tailor the circuits with corresponding parameters for signal processing.

FIG. 1 describes a field programmable radio frequency communications system that can be programmed by a user to form a digital signal processing system 10 that is adapted to be coupled to a radio frequency receiver and or transmitter subsystem 12 to configure a radio frequency receiver and/or transmitter system to operate with any of a plurality of radio frequency waveforms or signaling schemes, such as, AM, AME, A3E, H3E, J3E, CW, SSB, M-PSK, QAM, ASK, and angular modulation, such as, FM, PM, FSK, CMP, MSK, CPFSK etc. The multi bit digital instructions, commands and software to configure the digital processing system 10 can be provided from a remote location or stored in a configuration non-volatile memory 14. When using the memory 14, instructions are down loaded into the memory 14 from the configuration input circuit 16 under the control of the configuration control system 18. In response to instructions provided from the user input circuit 26, the configuration control system 18 (in response to instructions or commands stored in the configuration memory 14) connects selected ones of a plurality of configurable digital signal processors (CDSP) 20 and 22, and configures the digital IF subsystem 24 in a receiver or transmitter mode of operation with the radio frequency subsystem 12 to function in accordance with the signaling scheme selected by the user. Hence, the arrangement is such that a single piece of equipment can be, in response to instructions from the user, configured to operate with a radio frequency subsystem 12 as a substantially universal type of radio frequency communications system, controlled the configurations inputted directly or loaded into the configuration memory 14.

Figure 2:
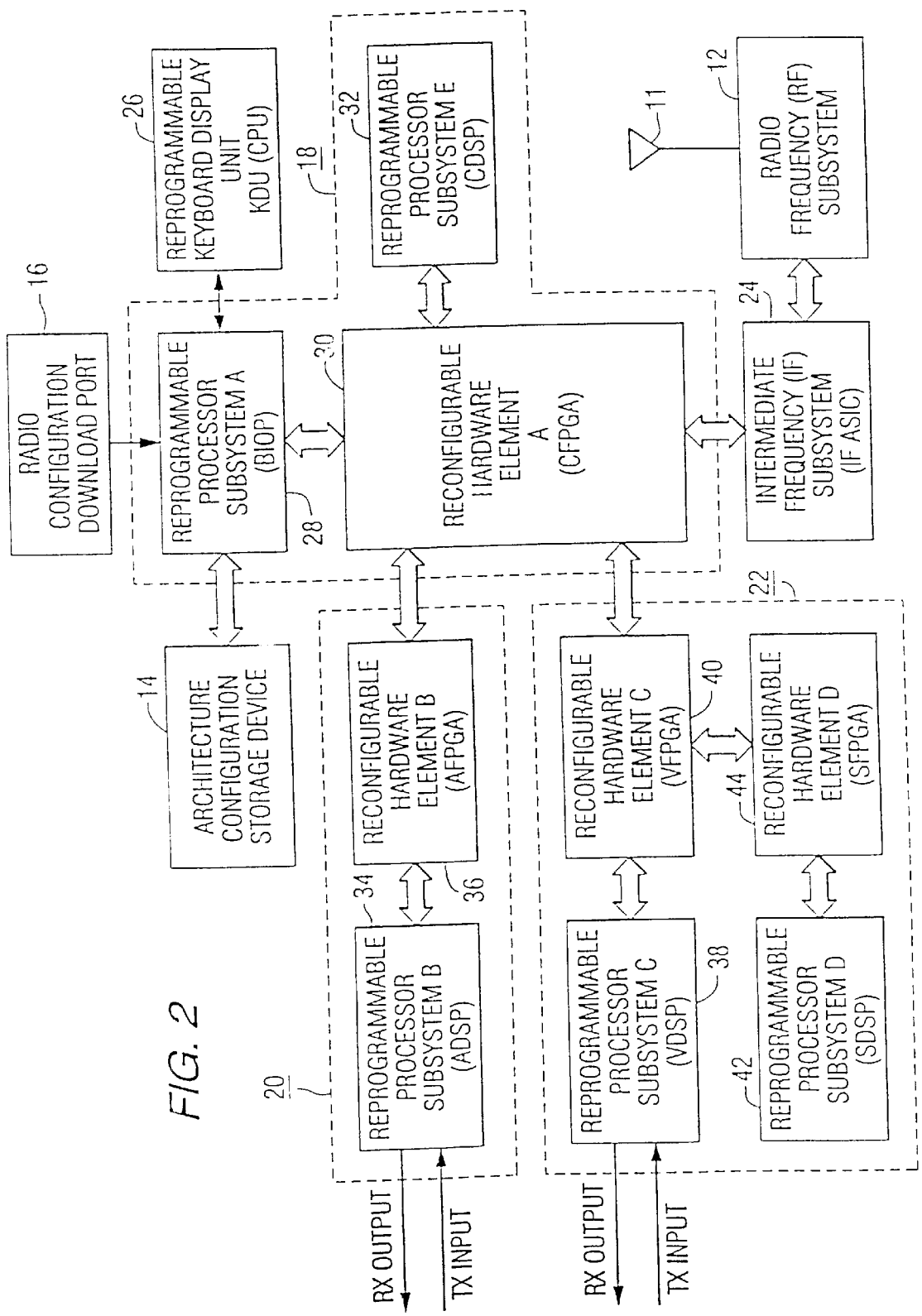
FIG. 2 is an expanded block diagram of the field configurable radio frequency communications system of FIG. 1 illustrating the interconnection of various subsystems.

As illustrated in FIG. 2, the configuration control system 18 includes a re-programmable processor subsystem A (which, for example, can be the central control digital signal processor [BIOP] 28), coupled to the radio configuration download port 16, the re-programmable keyboard display unit (KDU) or computer (CPU) 26, the architecture configuration storage device (which can for example be a large memory 14), and a re-configurable hardware element A (which, for example can be the central control field programmable field array [CFPGA] 30). The central control CFPGA 30 is also coupled to a re-programmable processor subsystem E (which, for example can be the control digital signal processor [CDSP] 32), the intermediate frequency (IF) subsystem which is a configurable as a digital IF modulator or demodulator and configurable baseband signal processing system (which, for example, can be in the form of an application specific integrated circuit [ASIC] 24), the configurable digital signal processor 20 and the configurable digital signal processor 22. The IF subsystem 24 is coupled to the radio frequency subsystem 12 and is configured to provide modulated IF signals to a transmitter, or to receive RF signals to be demodulated.

The configurable digital signal processing circuit 20 includes a re-programmable processor subsystem B (which, for example can be the auxiliary digital signal processor [ADSP] 34) that is coupled through a re-configurable hardware element B (which, for example can be the auxiliary FPGA [AFPGA] 36) to the CFPGA 30. The configurable digital signal processing circuit 22 includes a re-programmable processor subsystem C (which for example can be the voice/data DSP [VDSP] 38) that is coupled through a re-configurable hardware element C (which for example can be the voice/data FPGA [VFPGA] 40) to the CFPGA 30. The configurable digital signal processing circuit 22 also includes a re-programmable processor subsystem D (which, for example can be the security processor system [SDSP] 42) that is coupled through a re-configurable hardware element D (which, for example, can be the security FPGA [SFPGA] 44) to the CFPGA 30. Although the hardware elements A,B, C, and D are identified as field programmable gate arrays (FPGA), the hardware elements can also include a variety of signal processing circuits. Although the digital signal processing system 10 includes a specific combination of interconnected re-programmable processor subsystems, re-configurable hardware element, architecture configuration storage device, and intermediate frequency subsystem, such elements and equivalents thereof could be used in various other arrangements and still include the inventive concepts of the digital signal processing system.

The BIOP 28 is the main control system which controls the loading of the configuration multi bit commands, operating parameters and configuration software from memory 14 (or directly from a remote input) into the various subsystems of the digital signal processing system. It also functions as the interface to the user KDU 26 and down load port 16. The CFPGA 30 is the main interconnect unit involved in configuration of the digital signal processing system for receiver or transmitter modes of operation and to tailor the system 10 for the particular signaling scheme or waveform selected. As the central control element, the CFPGA can be configured to provide two levels of control, ie the software level and the circuit (hardware) function processes, command signal flow, and interconnect. The CFPGA 30 can also include a variety of digital signal processing circuits, such as, for example, active signal processing circuits (such as, a veterbi decoder, RF AGC, peak sample registers, transmit gain, thermal cut back, etc.) as well as providing inter processor communications (such as, reading signal in and out or the IF ASIC 24, and assigning control values to various subsystems).

All other FPGAs in the system can also be configured to include multi bit signal processing circuits. The CDSP 32 functions with the BIOP 28 to operate the system once configured. The VDSP 38 can, for example be configured to process multi bit digital voice and data samples, or signals for the selected signaling scheme or waveform. The VDSP 38 can be programmed to include specific signal processing functions, such as, voice or data compression. The SDSP 42 can be programmed and connected in the system 10 to provide a special functions, such as, for example voice and data encryption. The IF ASIC 24 can be programmed to be configured to provide the demodulation function for multi bit digital signals in the receive mode, the modulation function in the transmit mode, and to provide multi bit digital signal baseband signal processing. The various radio configurations are down loaded into the memory 14 from the download port 16 (or directly inputted from a remote source) under the control of the BIOP 28. If configurations are loaded into the memory 14, all the user needs to do is to select the receiver or transmitter mode of operation, the signaling scheme or waveform, along with other communications system parameters, push the enter button, and the digital signal processing system 10 will automatically configure to the desired RF communications system for the user selected mode of operation. If the configuration is directly inputted, the system selection instruction are directly inputted.

Figure 3A:
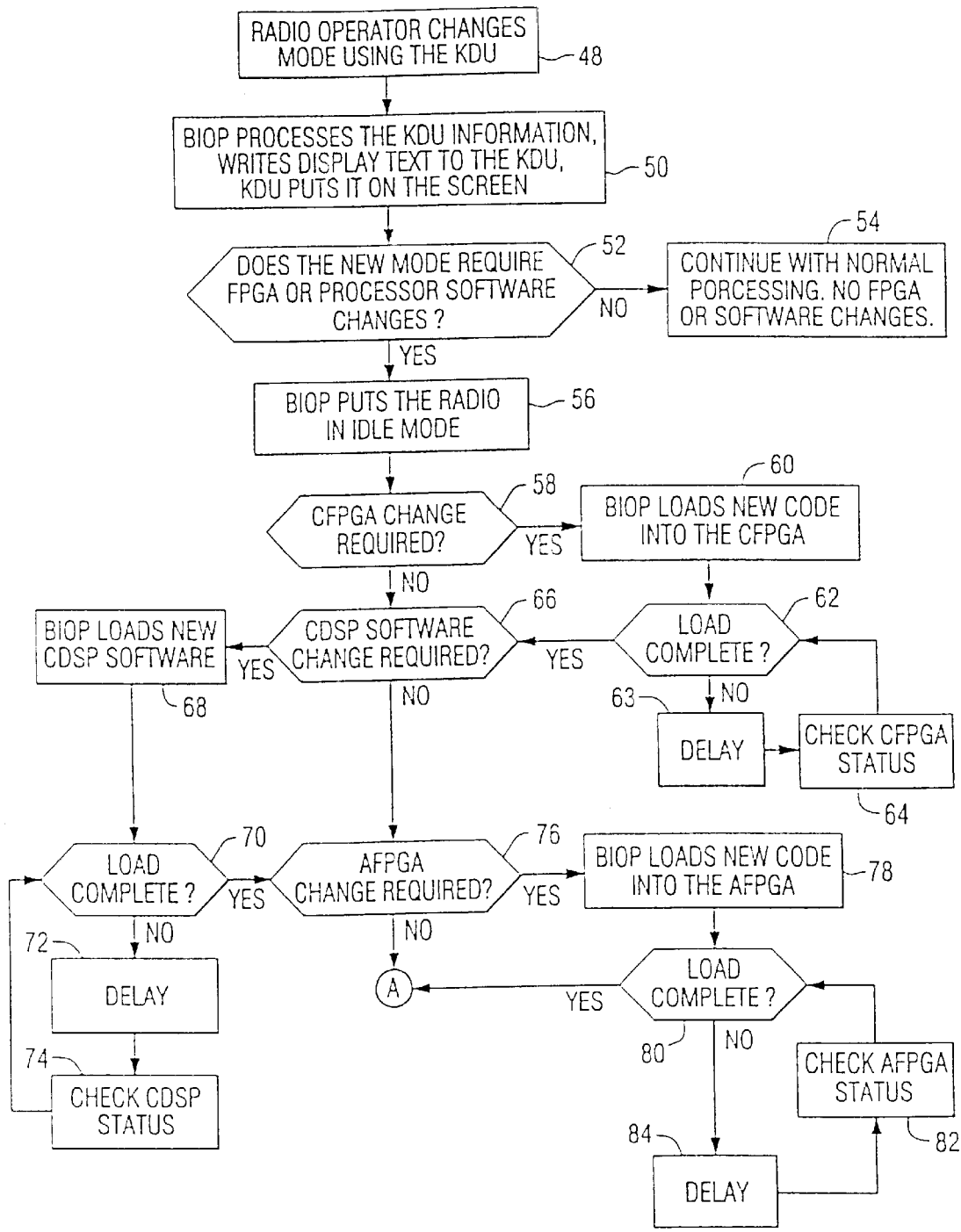
FIGS. 3A and 3B include a flow diagram explaining the steps involved in configuring the field programmable radio frequency communications system.

The flow diagram of FIG. 3 describes the various steps involved in configuring the radio frequency communications system. In step 48, the radio operator enters a change of mode of operation in the KDU 26. The BIOP 28 processes the KDU 26 information and displays text on the KDU screen (step 50) and determines if the mode requires FPGA changes and/or processor software changes (step 52). If not, the radio communications system keeps operating unchanged (step 54). If changes are needed, the BIOP 28 puts the radio communications system in the idle mode (step 56). A determination is made if the CFPGA 30 is to be changed (step 58). If so, the BIOP 28 loads the new multi bit commands or code from the memory 14 into the CFPGA 30 (step 60). A check is made if the load is complete (steps 62, 63 and 64).

If the step 58 determines that a CFPGA 30 changes is not required, or the new multi bit code is successfully loaded (step 62), then a determination is made if the CDSP 32 software requires change (step 66). If so, the BIOP 28 loads the new software in the CDSP 32 (step 68) and a check is made if the load is complete (steps 70, 72 and 74). If the step 66 determines that a CDSP 32 change is not required, or the new code is successfully loaded (step 70), then a determination is made if the AFPGA 36 requires change (step 76). If so, then the BIOP 28 loads the new code in the AFPGA 36 (step 78) and a check is made to verify that the load is complete (steps 80, 82 and 84).

Figure 3B:
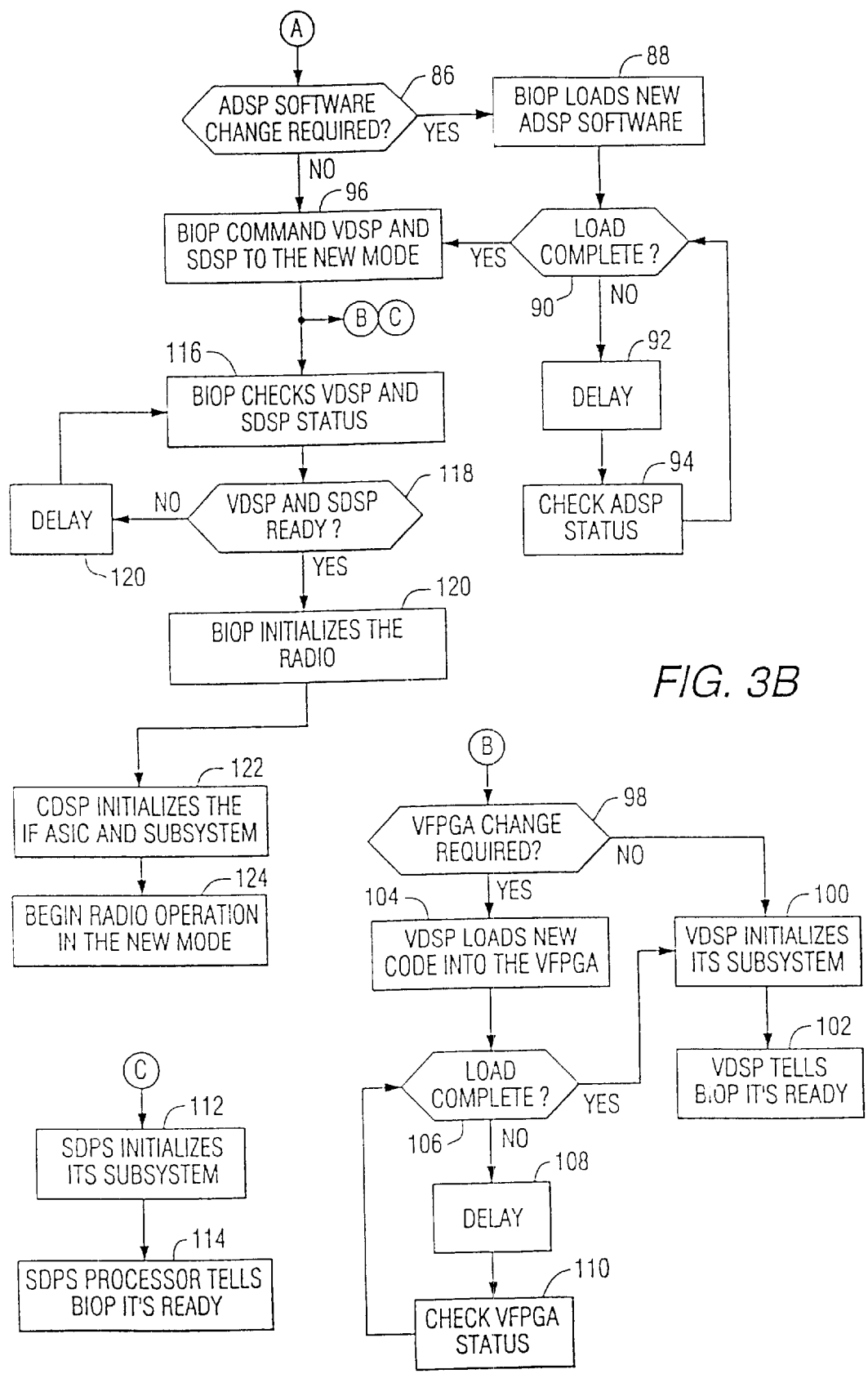

If the step 76 determines that a AFPGA 36 change is not required, or the new code is successfully loaded (step 80), then a determination is made if the ADSP 34 requires a software change (step 86, FIG. 3B). If so, then the BIOP 28 loads the new software in the ADSP 34 (step 88) and a check is made if the load is complete (steps 90, 92 and 94). If the load of step 90 is complete, or no change is required, then the BIOP 28 sends commands to the VDSP 38 and SDSP 42 to configure the DSPs for the new mode and a check is made to verify that the load is complete (steps 90, 92 and 94).

At this time the process separates into three branches. In branch B the step 98 determines if the VFPGA 40 requires a change. If not, the step 100 initialized the VDSP 38 and step 102 notifies the BIOP 28 that the VDSP is ready. If the VFPGA 40 needs a change, the step 104 has the VDSP 38 load new code into the VFPGA 40. The steps 106, 108, and 110 monitor to determine if the new code load in the VFPGA 40 is complete and allows the step 100 to initialize the VDSP 38. In branch C, step 112 initializes the SDPS 42 and the step 114 tells the BIOP 28 that the SDSP 42 is ready.

In the main branch of the process, in step 116 the BIOP 28 checks the status of the VDSP 38 and the SDSP 42. If the step 118 determines that the VDSP and/or the SDSP are not ready, the step 120 delays the process until the VDSP and the SDSP are ready. Thereafter the BIOP 28 initializes the system. Once the system initialization is complete, in the step 122 the CDSP 32 initializes the IF ASIC 24. Thereafter, the step 124 indicates the radio frequency communications system is now in operation in the new user selected mode.

Figure 4A:
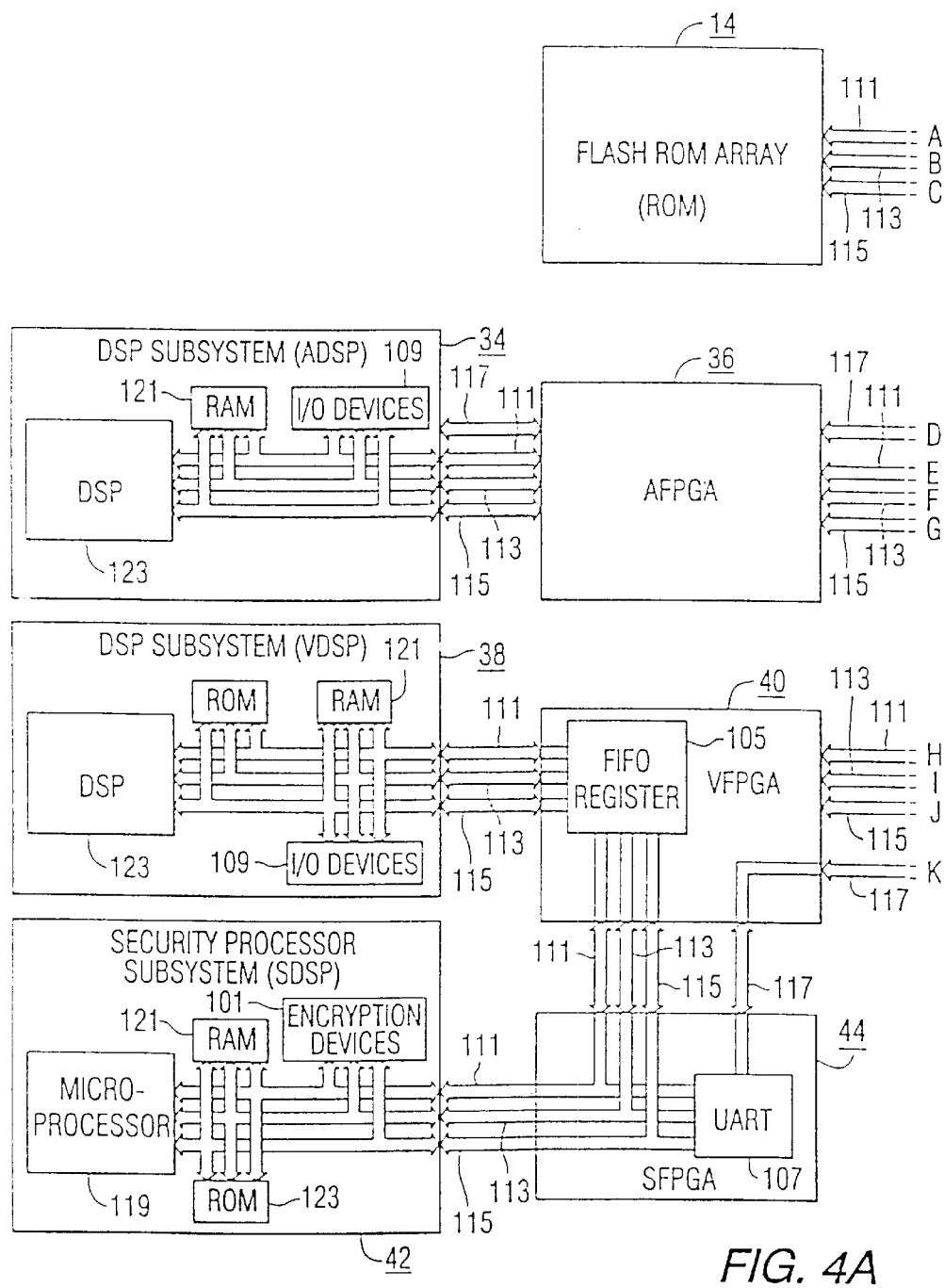
FIGS. 4A and 4B include an expanded block diagram of the field configurable radio frequency communications system showing interconnections between various subsystems when configured in the transmit mode.
Figure 4B:
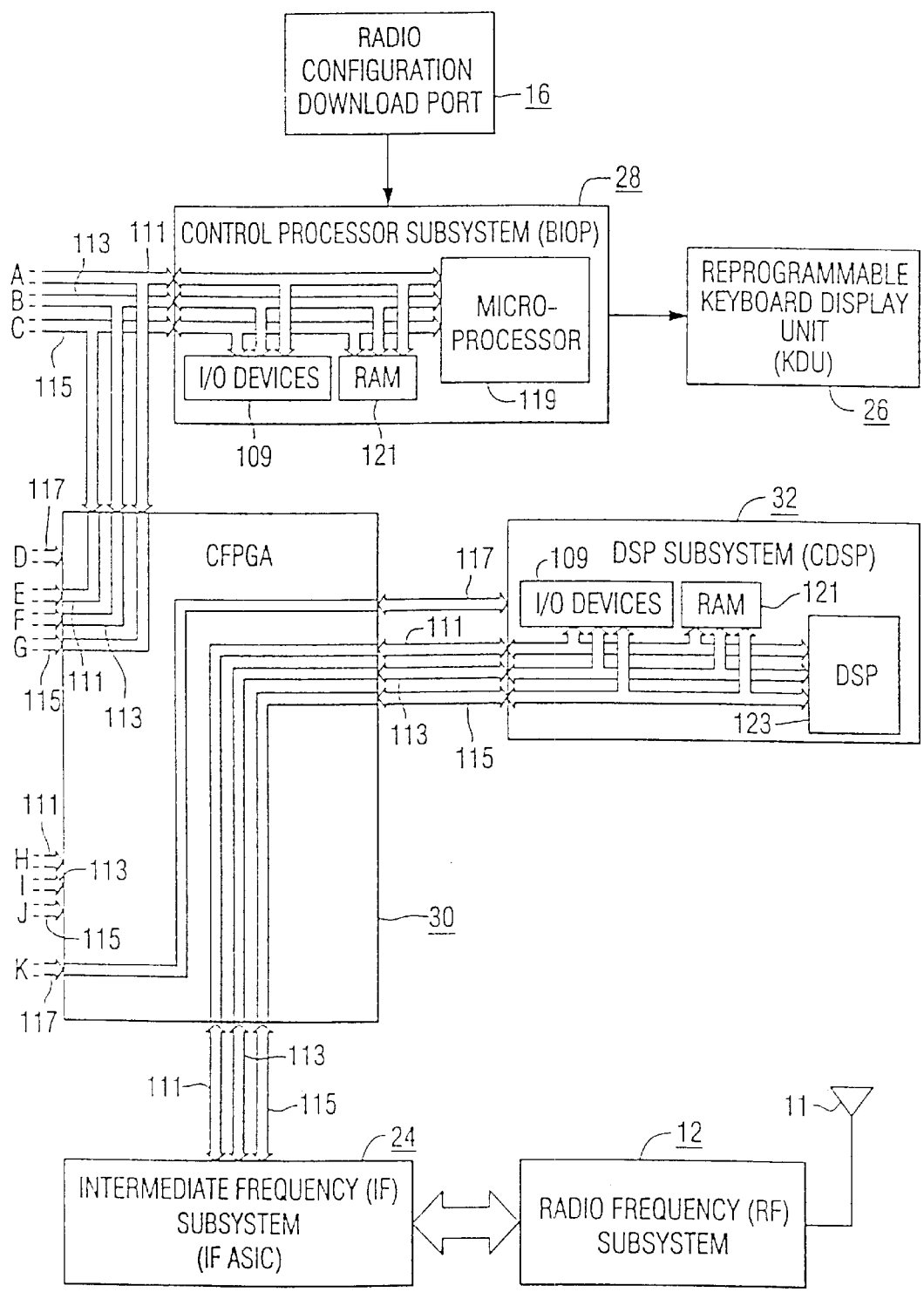

FIGS. 4A and 4B illustrate the interconnection of the various subsystems of the digital RF communications system interconnected to operate in a coded transmit mode. All the subsystems are interconnected by a data 111, address 113 and control 115 bus. In addition, some subsystems are interconnected by a serial data bus 117. The DSP type subsystems 28, 32, 34, 38 and 42 include signal and control processing arrangements including RAM memory 121 and a digital signal processor DSP 123 or microprocessor 119. In addition the DSP type subsystems 28, 32, 34 and 38 include input/output devices 109. The SDSP 42 includes encryption devices 101. The VFPGA 40 is configured to include a FIFO 105 register, while the SFPGA 44 is configured to include a UART 107. The multi bit signals to be transmitted are inputted into the VDSP 38, encrypted by the SDSP 42, and coupled through the SFPGA 44, the VFPGA 40, the CFPGA 30, the CDSP 32, the IF ASIC 24 and the radio frequency subsystem 12 in the transmit mode of transmission via the antenna 11.

Figure 5:
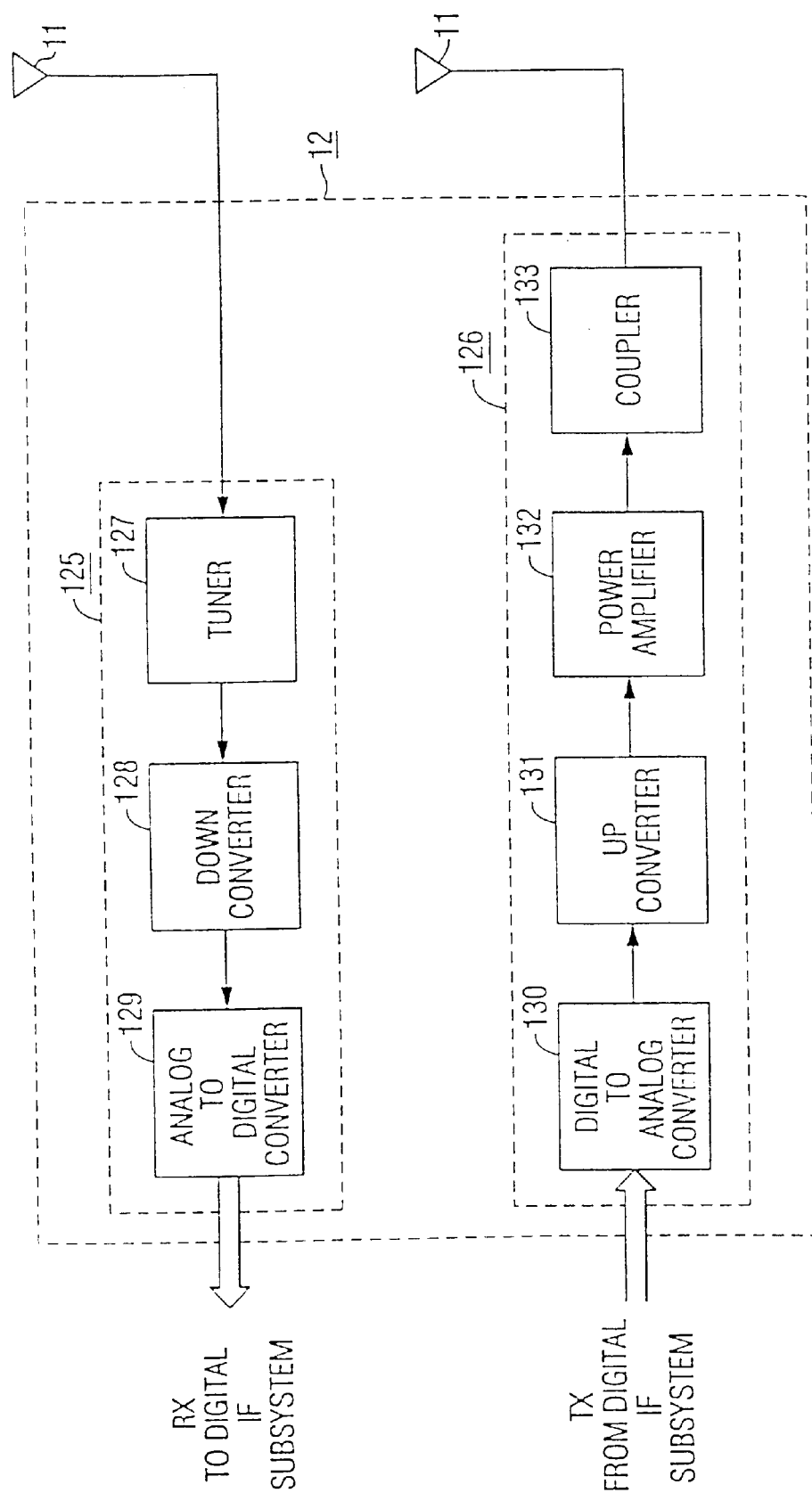
FIG. 5 is a block diagram of the radio frequency subsystem portion of the field configurable radio frequency communications system.

FIG. 5 illustrates the receiver section 125 and the transmitter section 126 of the radio frequency subsystem 12. The receiver section 125 includes a tuner 127, a down converter 128 for converting the radio frequency modulated signals to intermediate frequency modulated signals and a analog to digital converter 129 for outputting received IF signals as multi bit digital samples or signal to the IF ASIC 24. The transmitter section 126 includes a digital to analog converter 130 for converting multi bit digital IF modulated samples or signals received from the IF ASIC 24 into analog form. The analog signals are applied to an up converter 131 for converting the IF modulated analog signals to RF modulated analog signals which are amplified by a power amplifier stage 132 and applied to the antenna 11 via a coupler circuit 133.

The IF subsystem 24 is embodied in a semiconductor chip in the form of an application specific integrated circuit (ASIC) to provide in field programmable semiconductor hardware the multi bit digital demodulation, modulation and signal processing functions for transceivers, capable of being configured into digital receiver or transmitter modes of operation, and employing various types of selected signaling schemes or waveforms, and configured to select operating parameters for the various circuits therein to conform to the selected mode of operation. The advantage of processor configurable functions created in the hardware of an ASIC, rather than totally in software, is that the configurable hardware of the ASIC requires less physical space and consumes less power than software running on general purpose processors running DSP algorithms. This is because the configurable ASIC hardware can be designed to be optimized in its performance.

Figure 6:
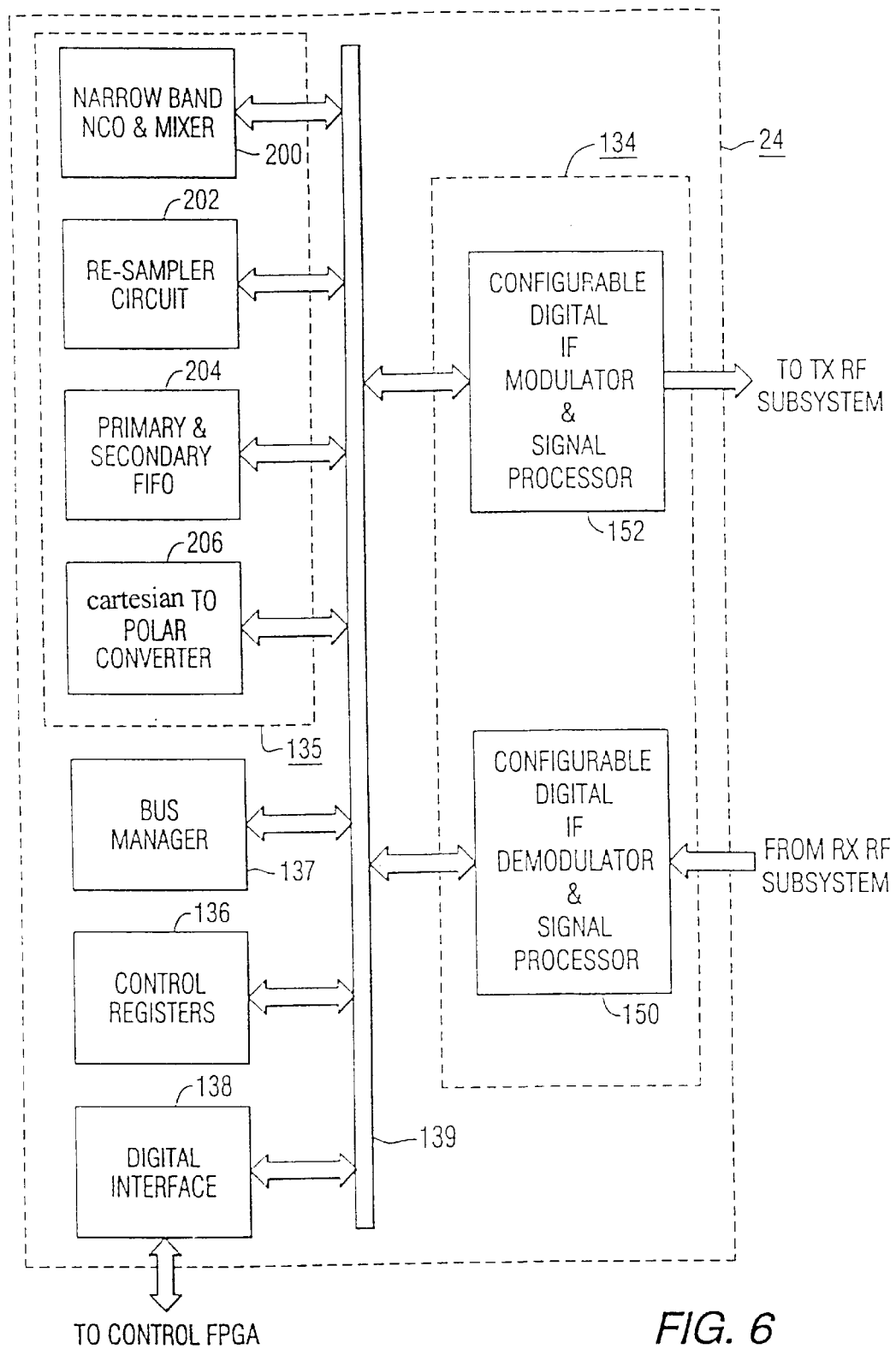
FIG. 6 is a block diagram of the intermediate frequency (IF) sub-system portion of the field programmable radio frequency communications system including demodulation and modulation and signal processing systems, a baseband signal processing system, and bus structure, adapted to be implemented as a applied specific integrated circuit device (ASIC).

The IF ASIC 24 can be the flat pack manufactured by Gray Chip Electronics. As illustrated in FIG. 6, the IF ASIC 24 includes a front end portion 134, a backend portion 135, control registers 136, a bus manager 137, and an interface 138. The front end portion 134 includes a plurality of circuits, responsive to digital commands, that can be selected and interconnected, along setting operating parameters, as a configured multi bit digital IF modulator and signal processing circuit 152 for use in the transmit mode of operation, and as a configured multi bit digital IF demodulator circuit and signal processing circuit 150 for use in the receive mode of operation. The IF ASIC 24 has several multi bit digital baseband signal processing circuits included in the backend portion 135, that can be configured in various ways, for processing the baseband signal input in multi bit digital form to the configured IF modulator 152 in the transmit mode, and for processing the baseband output signals in the multi bit digital form from the configured IF demodulator 150 in the receive mode, depending on the type of signaling scheme or waveform selected by the user. The various circuits of the IF ASIC 24 are configurable by multi bit digital commands from the control registers 136 or directly from the memory 14. The digital commands in the control registers 136 are down loaded from the configuration memory 14 when the digital communications system is configured.

In the configured transmitter mode of operation, the IF ASIC 24 receives multi bit digital signals or samples to be transmitted via the FIFO 204. Digitally modulated carrier based (IF) output signals from the IF ASIC 24 are outputted to the radio frequency subsystem 12. In the configured receiver mode of operation, the IF ASIC 24 receives carrier based (IF) modulated multi bit digital signals or samples from the radio frequency subsystem 12 and outputted via the FIFO 204. The back end portion 135 includes a narrow band NCO and mixer 200, a re-sampler circuit 202 including a polyphase re-sampler and a re-sampling NCO, a FIFO register 204 having primary and secondary portions, and a cartesian to polar conversion circuit 206, all of which are connected to the bus 139.

The IF ASIC 24 may, for example, accept 16 bit input samples at rates up to 5 MSPS in the receive mode and generate 16 bit output samples at rates up to 5 MSPS in the transmit mode. The minimum sample rate may, for example, be 100KSPS. The IF ASIC 24 is register based to allow access to the individual signal processing blocks in that all the various configurable circuits are connected to receive multi bit commands from the control registers 136

By field programmable, it is meant that the configuration of the IF ASIC 24 can be modified by the user at any time, not only as a transmitter or receiver, but also as to the type of signaling scheme or waveform involved and the parameters by which the signals are processed. The IF ASIC 24 is able to be configured to provide signal schemes or waveforms, such as, but not limited to, complex demodulation (quadrature IF down conversion); data rate decimation to reduce the IF sample; narrowband filtering; AM, AME, A3E, H3E, J3E, CW, SSB, M-PSK, QAM, ASK, and angular modulation including FM, PM, FSK, CMP, MSK, CPFSK etc., symbol re-timing; and impulse noise blanking (to reduce impulsive noise), complex modulation (data rate interpolation to raise narrowband sample rate to the IF sample rate); IF carrier generation to place the IF anywhere within half the wideband sample rate; such as for SSB, CW, 21SB, AME, FM, QAM, AM, M-ary PSK etc.; data shaping and narrowband filters to spectrally limit the IF modulation; and linear sampled data gain scale control (GSC). The IF ASIC 24 can provide multiple output for various signal schemes or waveforms, such as, I and Q and phase and magnitude.

Figure 7:
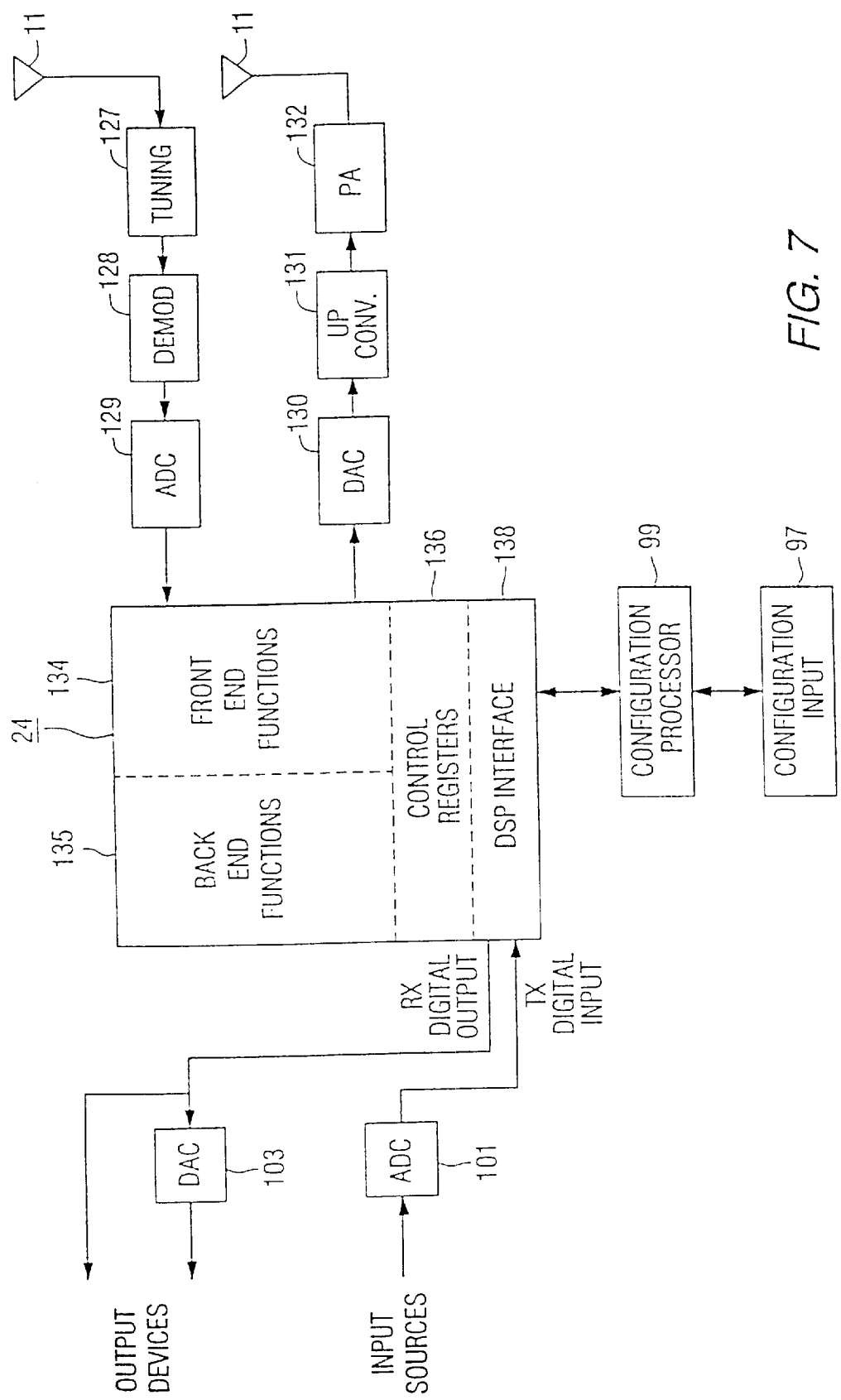
FIG. 7 includes a simplified block diagram of a radio frequency transceiver including the IF sub-system FIG. 8 includes a block diagram of the field configurable digital IF sub-system configured as an IF demodulator and signal processing circuit the for use in the receive mode of operation.

In FIG. 7, the IF ASIC 24 is connected in a simpler transceiver system wherein the configuration of the IF ASIC 24 is controlled by a configuration processor 99 pursuant to instructions from the configuration input circuit 97. The received digital output signals in multi bit form from the IF ASIC 24 are applied to the output digital to analog converter 103. Input signals to be transmitted are received in multi bit form by the IF ASIC 24 via the analog to digital converter 101. The IF ASIC and the radio frequency communications system including the IF ASIC described herein is the subject of a separate patent application filed concurrently herewith.

2) Receiver Demodulator Block Diagram

Although the receiver section 150 and the transmitter section 152 are described herein as separate circuits for purposes of simplifying the explanation, it should be understood that both the receiver and the transmitter sections are configurable that include a plurality common circuits, that in response to digital commands, can be interconnected in the form of a demodulator, a modulator and corresponding signal processing circuits.

Figure 8:
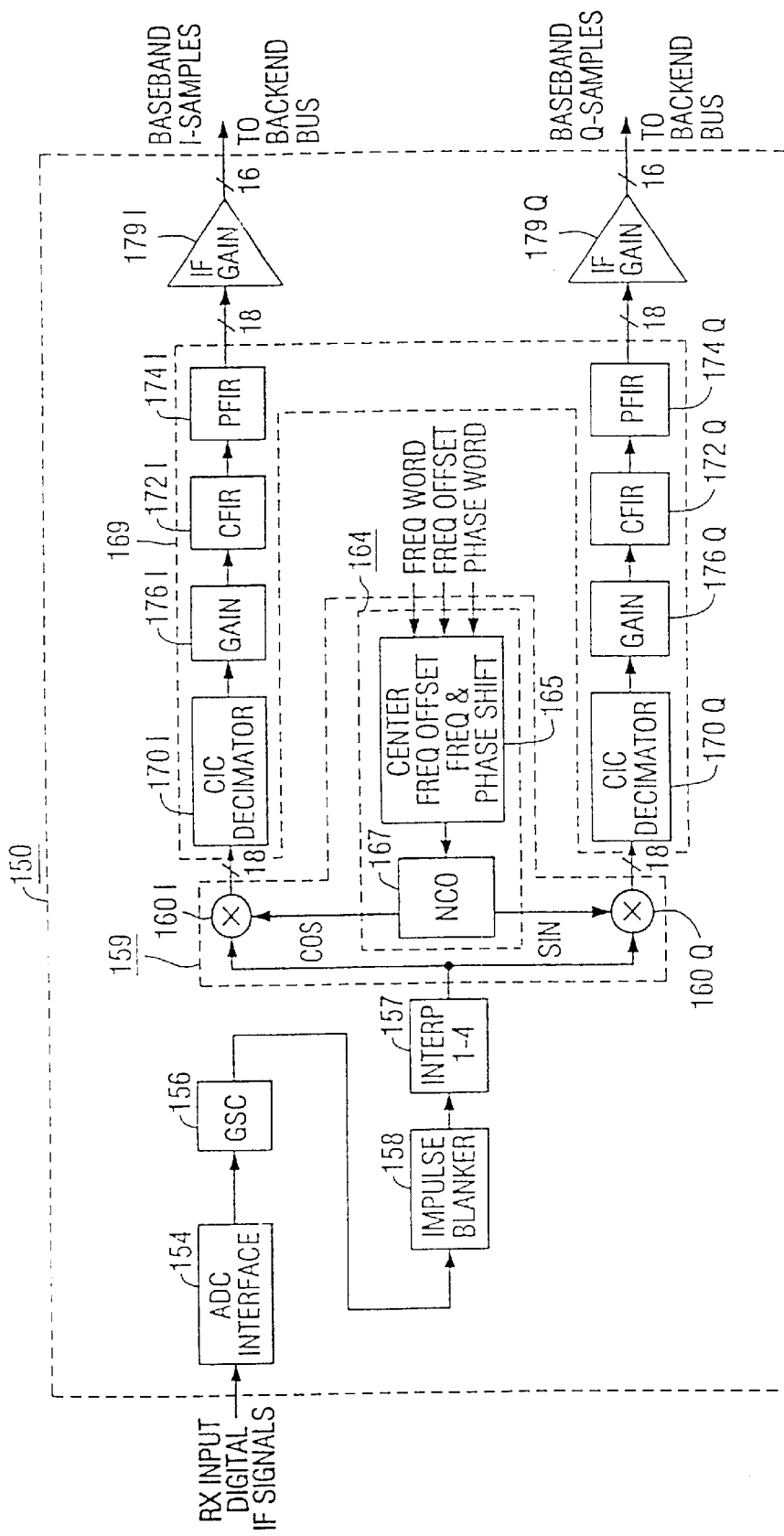

As illustrated in FIG. 8, the IF ASIC 24 includes the various configurable circuits for use in the receiver mode of operation for the above mentioned signal signaling schemes or wavforms, as selected by the user. The configured receiver demodulator and signal processing circuit 150 includes a multi bit digital signal path consisting of an analog to digital converter interface 154, a gain scale control 156, an interpolator circuit 157, an impulse blanker 158, a mixer circuit 159 including a wideband inphase and quadrature mixers 160I and 160Q, a wideband numerical controlled oscillator (NCO) 164 (including a offset frequency and phase shift control circuit 165 and a numerical controlled oscillator [NCO] 167) and also inphase and quadature signal processing circuits each including an up-down sampler and filter circuit 169 which includes a CIC decimation circuit 170 I or 170 Q, a compensating filter 172 I or 172 Q, a programmable filter 174I or 174Q and a gain circuit 176I or 176Q, respectively. The multi bit digital outputs of the PFIR circuits 174I and 174Q are connected to the backend bus 139 via the IF gain circuits 179I and 179Q.

3) Transmitter Modulator Block Diagram

Figure 9:
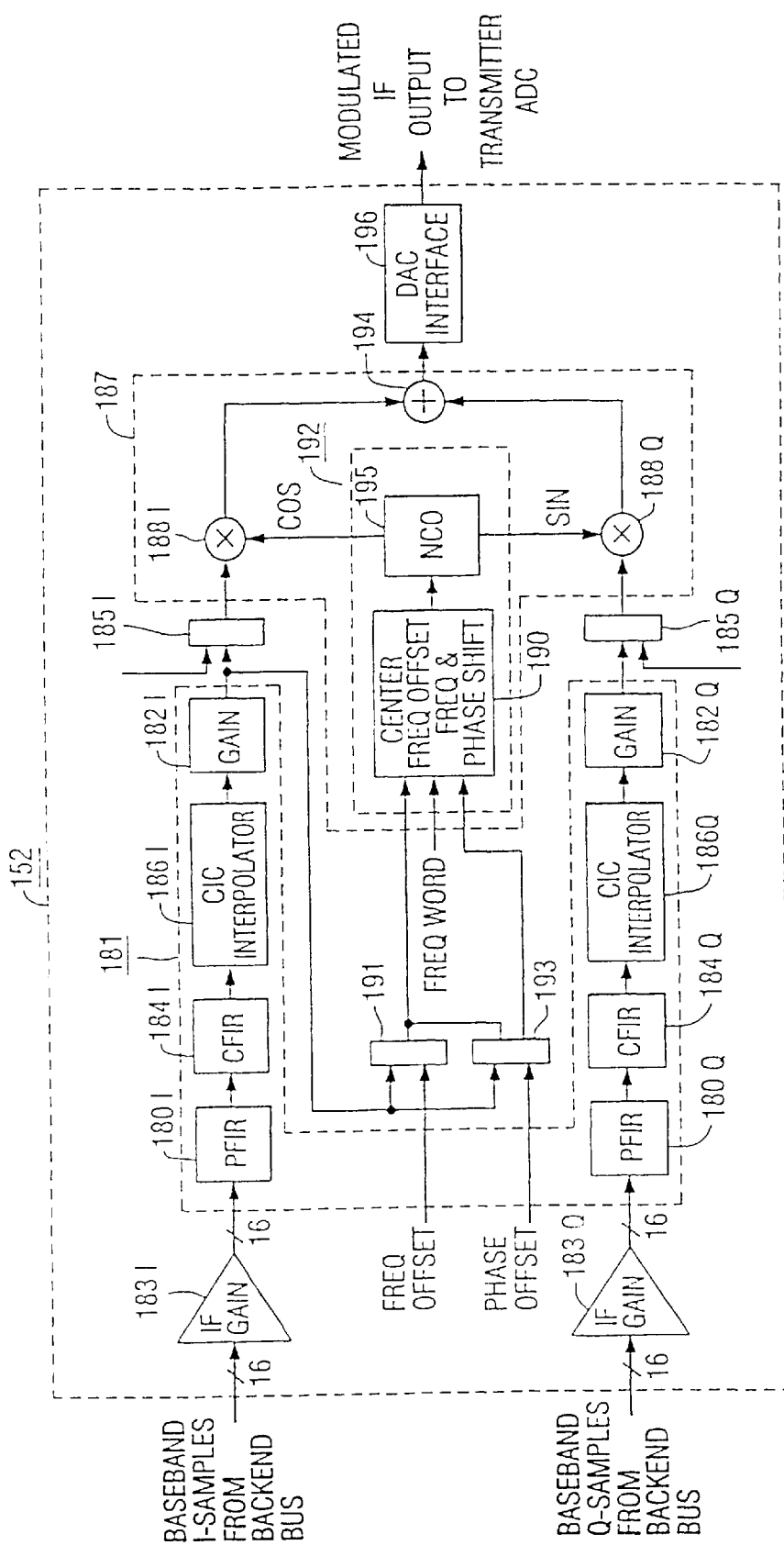
FIG. 9 includes a block diagram of the field configurable digital IF sub-system configured as an IF modulator and signal processing circuit for use in the transmit mode of operation.

As illustrated in FIG. 9, the IF ASIC 24 includes the various configurable circuits for the transmitter mode of operation for the above mentioned signal signaling schemes or waveforms as selected by the user. The configured transmitter section 152 includes a multi bit digital input signal processing path 181 consisting of an inphase and quadrature down and up sampling and filter circuits each including a programmable filter (PFIR) 180I or 180Q receiving input multi bit signals from the bus 139 via the IF gain circuits 183I and 183Q, gain circuits 182I or 182Q, a compensating filter (CFIR) 184I or 184Q, a CIC interpolation circuit 186I or 186Q. The multi bit output from the OR gates 185I and 185Q connect the output of the gain circuits 182I and 182Q to mixer circuit 187 which includes a wideband NCO 192 including a offset frequency and phase shift control circuit193 inphase and quaduature mixers 188I and 188Q and a NCO 195, a modulator adder 194, and a digital to analog interface output circuit 196. If the circuit is configured to function a FM or phase modulator, the multi bit output signals from the gain control 182 I are routed through the gate 191 in case of FM modulation and through gate 193 in the case of phase modulation.

As previously mentioned, the receiver section 150 and the transmitter section 152 are configurable in response to digital commands into the corresponding demodulator and modulator circuits which involves the interconnection of various common circuits into the selected circuit configuration. The common circuits that can be interconnected and configured into both de-modulator and modulator modes of operation include the wideband mixers 160I, 160Q, 188I and 188Q, the decimator and interpolator circuits 170I, 170Q, 186I and 186Q, the gain circuits 176I, 176Q, 182I and 182Q, the CFIR 172I, 172Q, 184I and 184Q, the PFIR 174I, 174Q, 180I, and 180Q, the IF gain 179I, 179Q, 183I, and 183Q, the NCO 167 and 195 and the frequency word, phase offset 165 and 190.

4) Control Registers and Commands

Figures 10, 14:
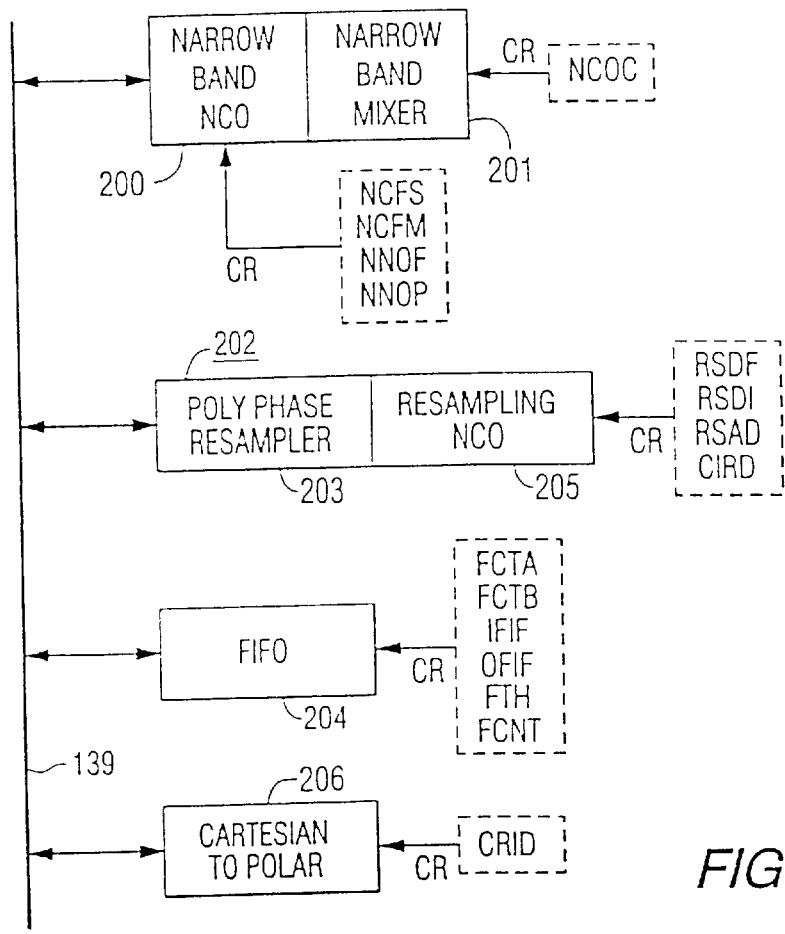
FIG. 10 is a layout of the IF sub-system control registers.
FIG. 14 is a block diagram of the circuits of the backend circuits of the IF subsystem including abbreviated digital control commands for configuring and programming various baseband circuits for the selected mode of receiver or transmitter operation, and baseband signal processing.

FIG. 10 includes a layout of the various registers included in the control registers 136. The register address mapped is divided into four 256 16-bit blocks consisting of configuration lock (CL) 122, mode lock (ML) 114, double buffered (DB), and double buffered (-S,-M) register types 124 and PRIR coefficients (ML) 126. Within the blocks, registers are further subdivided into two 128 16-bit pages (for compatibility and ease of programming by external processors). The mode registers contain the bits for the multi bit digital commands that perform the following functions: IF ASIC 24 reset (both core and clock reset), enable internal self test bit, transmit and receive mode bit, start acceleration mode, wideband interpolator zero insert, and back end clock decimation (used to reduce the clock rate to the back end functions).

The names of the various multi bit digital commands of the registers and their abbreviations are listed in Table 1, including the address number, the type of register, and the configuration values (decimal) column and the configuration values (HEX) column contain the values in the control registers 136 for configuring the IF ASIC 24 in the transmit configuration for a 20K wideband FSK system.

TABLE 1

| Register Long Names | Register Short Names | Configuration Value (HEX) |
| --- | --- | --- |
| CLOCK_GEN | CGEN | 0X00F8 |
| KEEP_ALIVE | KEEP | 0X0000 |
| IO_CTL | IOC | 0X05C1 |
| WB_RAMP | WRMP | 0X000A |
| NCO_CONFIG | NCOC | 0X0085 |
| CIC_FACTOR | CIFC | 0X0004 |
| FIR_CONFIG | FIRC | 0X0071 |
| NB_RAMP | MRMP | 0X000A |
| CART_RES_ID | CRID | 0X0080 |
| FIFO_CLTA | FCTA | 0X0000 |
| FIFO_CLTB | FCTB | 0X0800 |
| MODE | MODE | 0X0000 |
| BLK_COUNT | BCNT | 0 |
| BLK_LONG_AVE | BIGA | 0X000C |
| BLK_DUR_THRESH | BDTH | 0X7FFF |
| BLK_THRESH | BTH | 0X7FFF |
| BLK_LONG_VALUE | BIGV | 0 |
| BLK_SHORT_AVE | BSHT | 0X000C |
| BLK_DUR_GAIN | BDGN | 0X0000 |
| BLK_ENABLE | BEN | 0X0002 |
| WNCO_CNTR_FREQ_S | WCFS | 0X0000 |
| WNCO_CNTR_FREQ_M | WCFM | 0XFC00 |
| WNCO_OFST_FREQ | WOF | 0X0000 |
| WNCO_OFST_PH | WOP | 0X0000 |
| NNCO_CNTR_FREQ_S | NCFS | 0X2C3D |
| NNCO_CNTR_FREQ_M | NCFM | 0X0054 |
| NNCO_OFST_FREQ | NNOF | 0X0000 |
| NNCO_OFST_PH | NNOP | 0X0000 |
| ID_O | IDO | 0 |
| ID_* | ID1 | 0 |
| ACCEL_COUNT | ACNT | 0X07CF |
| LOCK | LOCK | 0X0000 |
| ISR | ISRA | 0X00FF |
| IMR | IMRA | 0X0070 |
| WB_CHECKSUM | WCHK | 0 |
| IF_GAIN | GAON | 0X7FC1 |
| PRI_FIFO | IFIF | 0 |
| SEC_FIFO | GFIF | 0 |
| NB_CHECKSUM | NCHK | 0 |
| FIFO_COUNT | FCNT | 0 |
| FIFO_THRESH | FTH | 0X000A |
| RNCO_DECIMATE_F | RSDF | 0X0000 |
| RNCO_DECIMATE_I | RSDI | 0X0080 |
| RNCO_ADJUST | RSAD | 0X0000 |
| INPH_MIXER_REG | IPMR | 0X0000 |
| QUAD_MIXER_REG | QPMR | 0X0000 |
|  | TAGVAL | 0X0000 |

5) Receiver Demodulator and Transmitter Modulator with Abbreviated Commands

Figure 11:
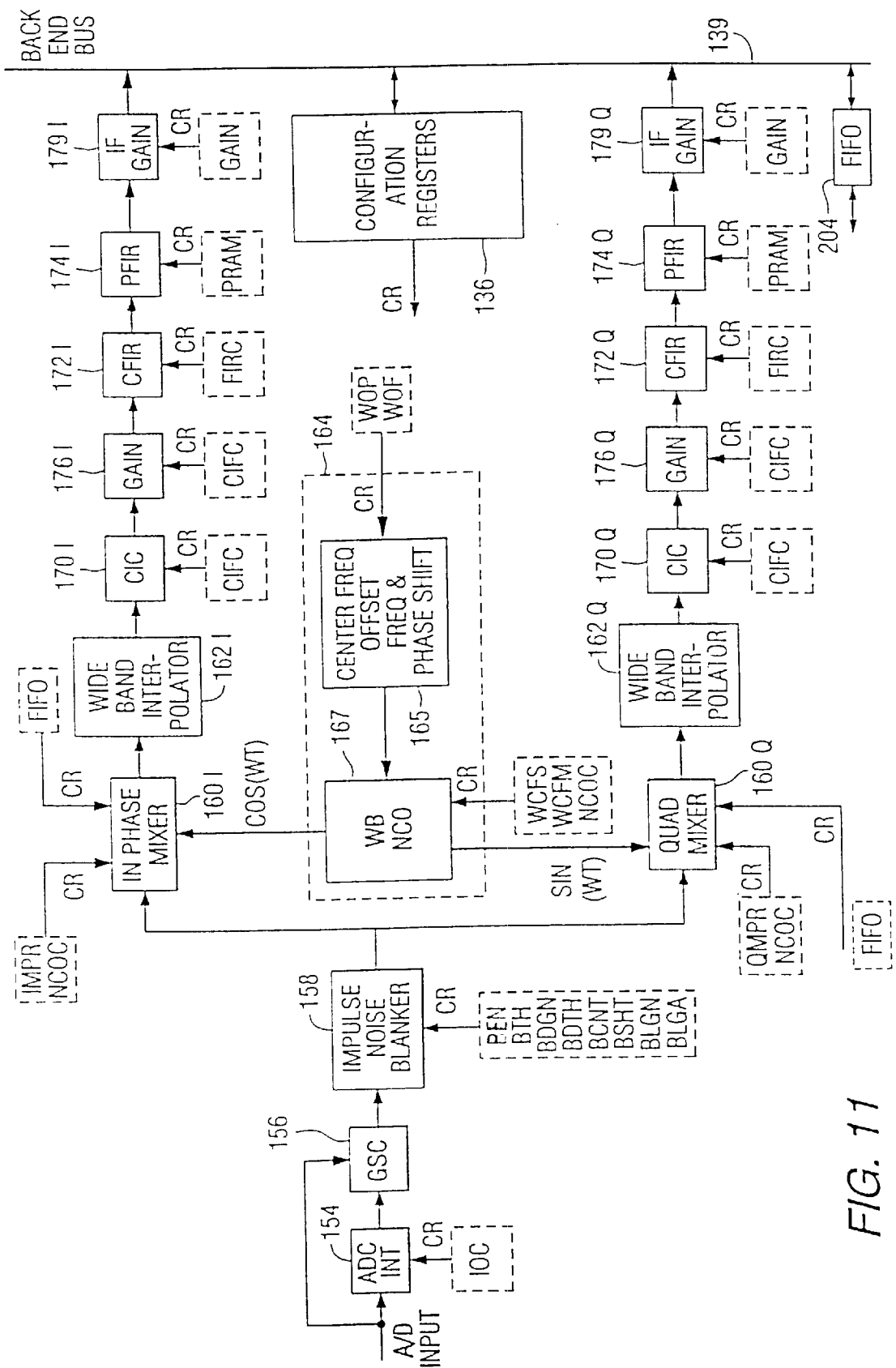
FIG. 11 is a block diagram of the digital IF subsystem configured as a digital demodulator and signal processing circuit including abbreviated digital control commands for programming operating parameters for various circuits for the receive mode of operation, signaling scheme or waveform, and signal processing thereof.

FIG. 11 includes the various processing circuits of the configured receiver circuit 150 with various multi bit command signals from the control registers 136 being applied thereto (as indicated by the various abbreviated commands in the dashed blocks and designated with the letters CR). However the embodiment of the configured receiver section 150 of FIG. 11 includes wideband interpolator circuits 162I and 162Q after the inphase and quadrature mixer 160I and 160Q instead of before the mixers of FIG. 8

Figure 12:
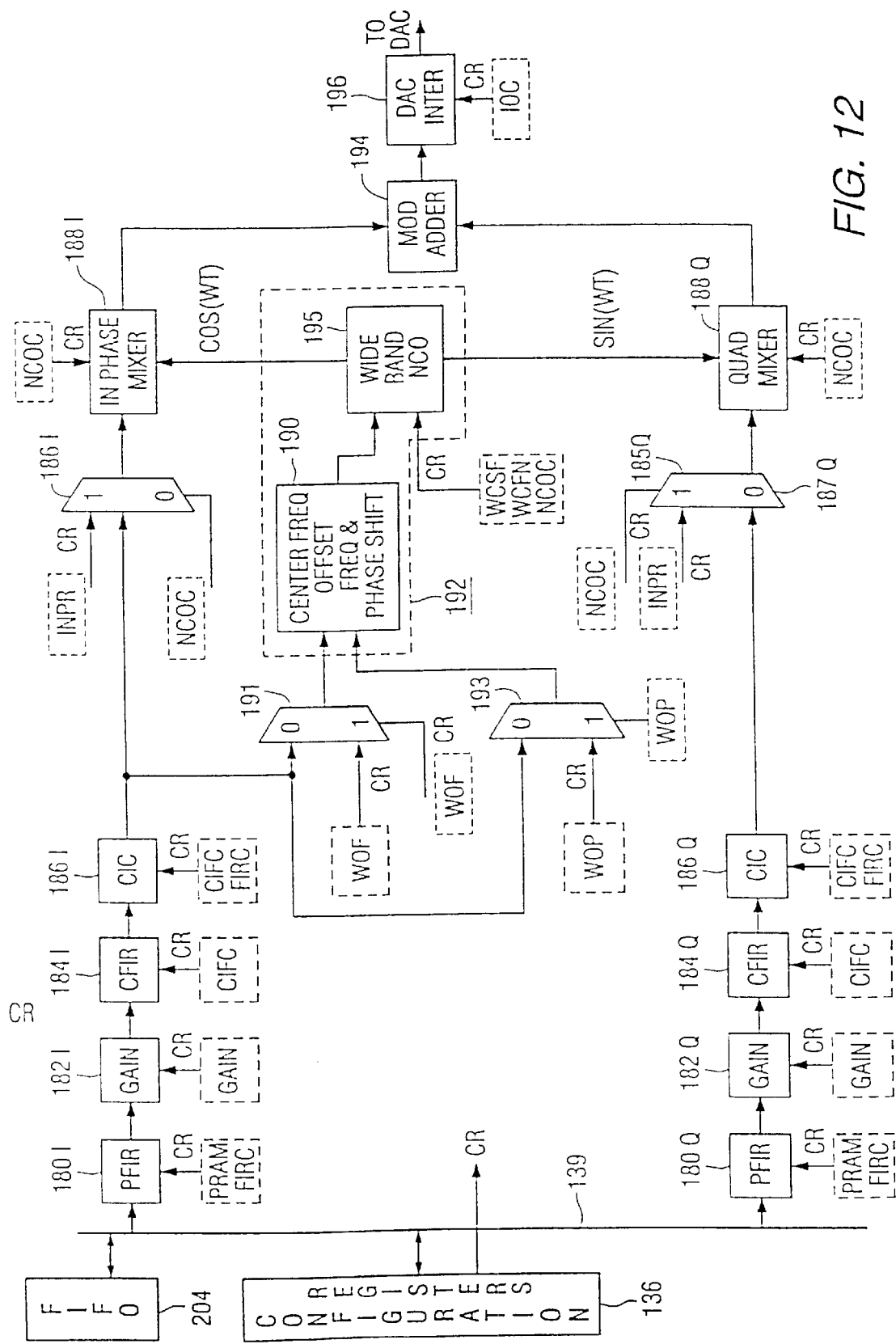
FIG. 12 is a block diagram of the IF subsystem configured as a digital modulator and signal processing circuit including abbreviated digital control commands for programming operating parameters for various circuits for the transmit mode of operation, signaling scheme or waveform, and signal processing thereof.

FIG. 12 includes the various processing circuits of the configured transmitter circuit 152 with various multi bit control command signals from the control registers being applied thereto (as indicated by the various abbreviated commands in the dashed blocks and the letters CR adjacent to the command line). However, the embodiment of FIG. 12 includes the IF gain circuits 182 I and 182 Q between the PFIR filters and the CFIR filters instead of to the bus 139 of FIG. 9.

6) Angle Modulator

The angle modulator described herein is the subject of a separate patent application filed concurrently herewith.

Figure 13:
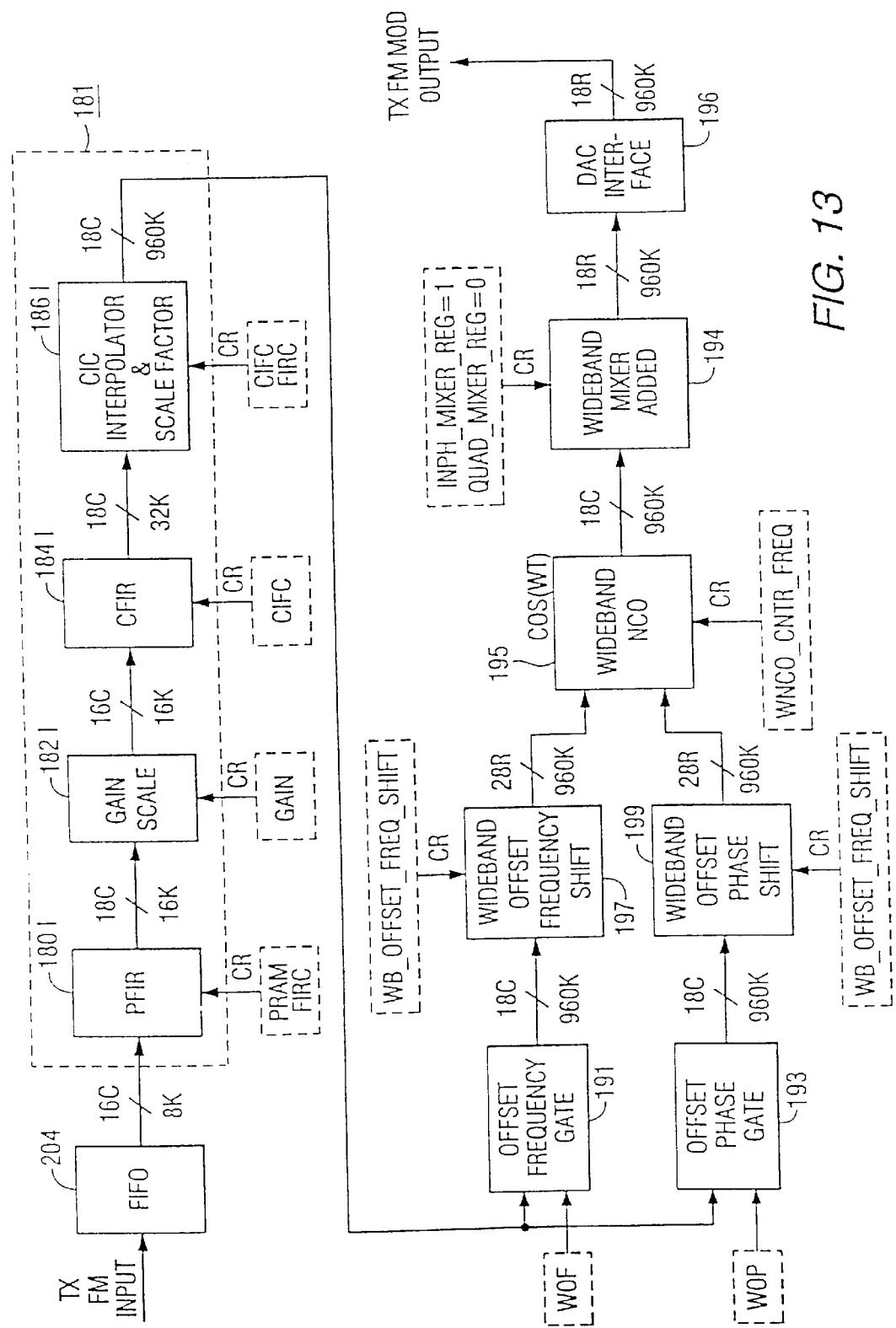
FIG. 13 is a block diagram of the IF subsystem configured as a modulator and signal processing circuit including abbreviated digital control commands for programming operating parameters for various circuits for the angle modulation for the transmit mode of operation.
Figure 15:
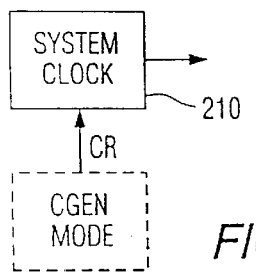
FIG. 15 is a block diagram of the system clock circuit of the IF subsystem including abbreviated digital control commands for programming the system clock circuit.

FIG. 13 includes a block diagram of the configured modulator circuit 152 of FIG. 12, with abbreviated multi bit commands from the control registers applied to various circuits, illustrating how the modulator circuit is configured to operate with angle modulation, such as, CPM, FM, PM, MSK and CPFSK. Although, the block diagram of FIG. 13 is more specifically described with regard to FM and PM, the concepts will apply to all types of angle modulation. Only a portion of the configurable modulator circuit 152 is used for angle modulation. Only that portion of the dual paths marked I are used and that marked Q is not. The multi bit signal or samples, such as 16 bit digital signals, to be transmitted, are applied via the FIFO 204 at a 8K clock rate to the PFIR 180I. An 18 bit signal is outputted from the PFIF 180I at a 16K clock rate to the gain scale 182I, which provides a 16 bit signal at the 16K clock rate. The CFIR 184I outputs the input from the gain scale at 18 bits at a 32K clock rate to the CIC interpolator and scale factor circuit 186I, which in turn provides a multi 18 bit signal at a 960K clock rate.

Depending if the FM or phase modulation is to be used, the offset frequency gate 191 or offset phase gate 193 is enabled. In such case, 18 bit digital signals at the 960K clock rate are applied to the wideband offset frequency shift circuit 197 or the wideband offset phase shift circuit 199, respectively. A 28 bit signal at the 960K clock rate is applied from either the offset frequency shift circuit 197 or the offset phase shift circuit 199 are applied to the wideband NCO 195 to frequency, or phase, modulate the NCO about the programmed NCO center frequency. Only the COS output from the NCO 195 is allowed to pass to the wideband mixer adder 194 as a modulated 18 bit signal at the 960K clock rate and outputted via the DAC interface 196. This arrangement has the particular advantage of allowing the FIFO 204 to operate at a low sample rate (such as 8K) for all types of modulations and demodulation schemes, while the up sampler and filter circuits 181 can be used to increase the signal sample rate to the IF center frequency (960K) for angle modulation as described.

7) Block Diagrams of Backend

FIG. 15–19 includes the various processing circuits of the backend section 135 with various control command signals from the control registers 136 being applied thereto (as indicated by the various abbreviated multi bit commands in the dashed blocks and designated as CR). FIGS. 15, 16, 17, 18 and 19 are the various other processing circuits including the system clock 210, turns around accelerator 212, the mode registers 214, and the keep alive clock 218 with various control command signals from the control registers 136 being applied thereto (as indicated by the various abbreviated commands in the dashed blocks).

8) Digital to Analog Converter Interface

Figure 20:
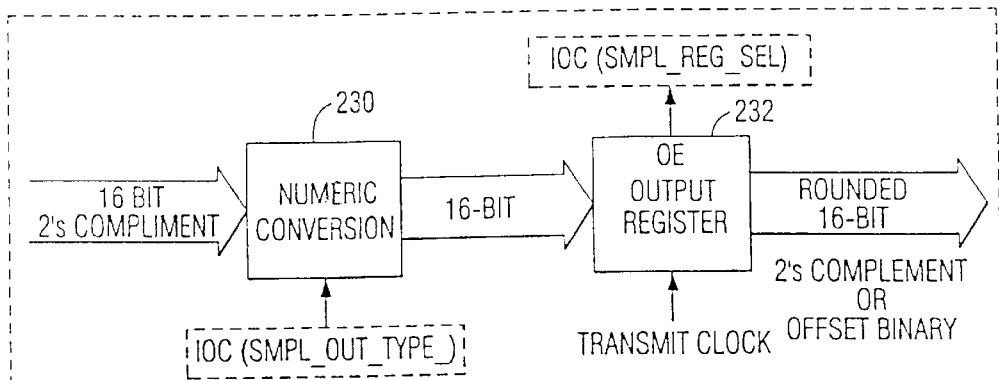
FIG. 20 is a block diagram of digital to analog converter interface circuit of the transmitter modulator configuration.

A block diagram of the of the digital to analog converter (DAC) interface circuit 154 in the configured transmitter circuit152 is illustrated in FIG. 20. The DAC interface circuit includes a numerical conversion circuit 230 and an output register 232. The inputs to the interface 154 are the sample output enable and carrier based modulated data. The sample output type is controlled by the processor and is parallel numeric formatted data.

Figure 21:
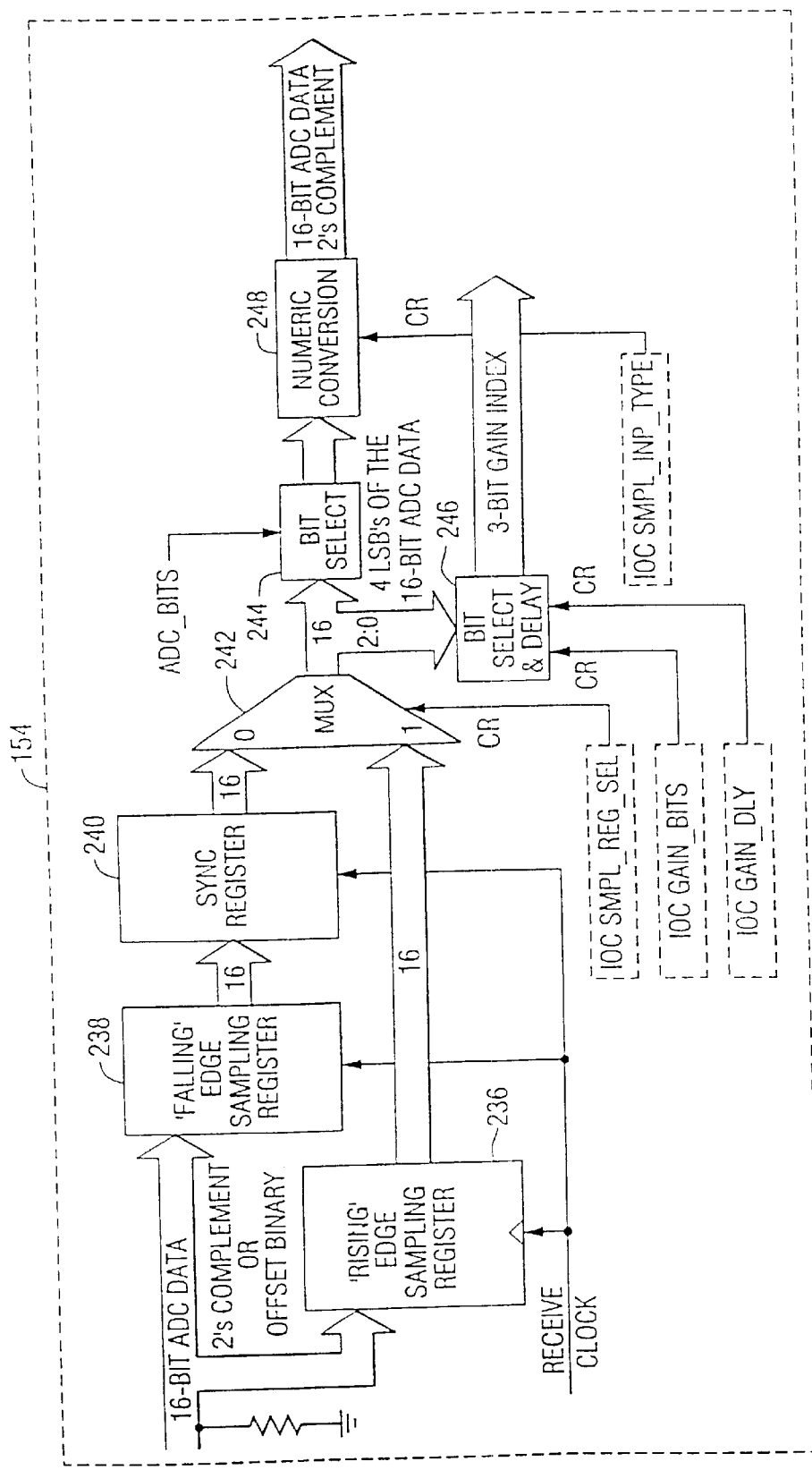
FIG. 21 is a block diagram of analog to digital converter interface circuit of the receiver demodulator configuration.

A block diagram of the of the analog to digital converter (ADC) interface circuit 154 in the configured receiver circuit 150 is illustrated in FIG. 21. The ADC interface circuit 154 includes a rising edge sampling register 236, a falling edge sampling register 238, a synd register 240, a mux 242, a bit select 244, a bit select and delay 246 and a numeric conversion 248.

The ADC interface 154 accepts 12 to 16-bit data samples multiplexed with 4 to 0-bit gain index values. ADC value bits that are not used should be tied low. The data is registered on both the rising and falling edge of the receive clock as selected by the configuration processor for input into the numeric conversion sub-functions. The ADC interface 154 shall provide weak internal pull-downs to logic '0' allowing for data widths less than a preset number of bits to be zero extended. Following the registering of samples, the input sample data numeric format as programmed by the configuration processor is converted to the internal numeric data. Attenuation indexes to the IF ASIC 24 are selected by the configuration processor. A n-bit Gain Delay (GAIN_DLY) $0 \leq$ Gain Index $\leq$ GAIN_BITS value shall allow for programmable delays for alignment of the gain into the GSC. The n-bit Gain Index (Gi) shall be time delayed within the ADC interface 154 to align Gi with the sample data. The inputs to the ADC interface 154 is the gain delay as configured by the processor and the data/gain index. The sample input type and the sample register select are also configured by the configuration processor. The output includes the gain index value and the ADC data.

The configuration commands applied to the ADC interface 154 are listed in Table 2.

TABLE 2

| Register | Command | Description |
|---|---|---|
| IO_CLT (IOC) | SMPL_INP_TYPE | Receive - type of A/D converter, selects sample input numeric format of conversion to internal data format. |
| | SMPL_REG_SEL | Selects rising or falling edge sample |
| | GAIN_BITS | Selects the number of least significant bits input to the gain scalar |
| | GAIN_DLY | Delay gain compensation by n samples |
| | SMPL_OUT_TYPE | Transmit - selects conversion of internal numeric formatted data to DAC format |

9) Gain Scale Control

Figure 22:
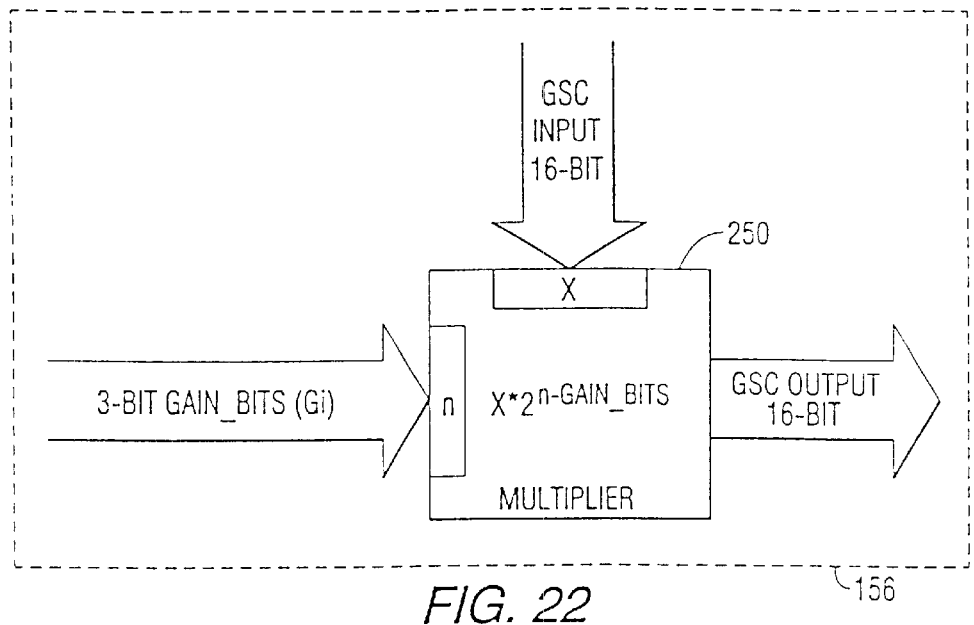
FIG. 22 is a block diagram of a gain scale control circuit of the receiver demodulator configuration.

FIG. 22 includes a block diagram of the gain scale control (GSC) circuit 156 in the configured receiver circuit 150 including a multiplier 250. The purpose of the GSC circuit 156 is to correct the input sample data for external attenuation. This is accomplished by passing the sample data through the $2^{n-gainBits}$ multiplier 250. The GSC circuit 156 accepts n-bit data from the ADC interface 154. Prior to entering the IF ASIC 24, the sample data has been adjusted by a modulo 2 attenuation supporting zero to four steps. For example, if a 12 bit A/D is used then the data outputs of the A/D are attached to the MSB of 16 bit inputs. The 12bit number is sign extended and scaled by $2^{-\overline{GAIN}-BITS}$ to put it into the LSB of the 16 bit word. Lastly, the value is shifted up by the Gain Index. The input to the GSC circuit 56 is the gain index from the analog to digital converter and the output is gain controlled data to the impulse blanker circuit 158.

10) Adder

The adder 194 of the configured transmitter circuit 152 accepts inputs from the in phase and quadrature phase components of the modulator mixers 188I and 188Q. The inputs are added together and outputted in real form to the DAC interface 196.

11) Impulse Noise Blanker

The inpulse noise blanker circuit and the exponential averaging circuit described herein are the subjects of a separate patent application filed concurrently herewith.

Figure 23:
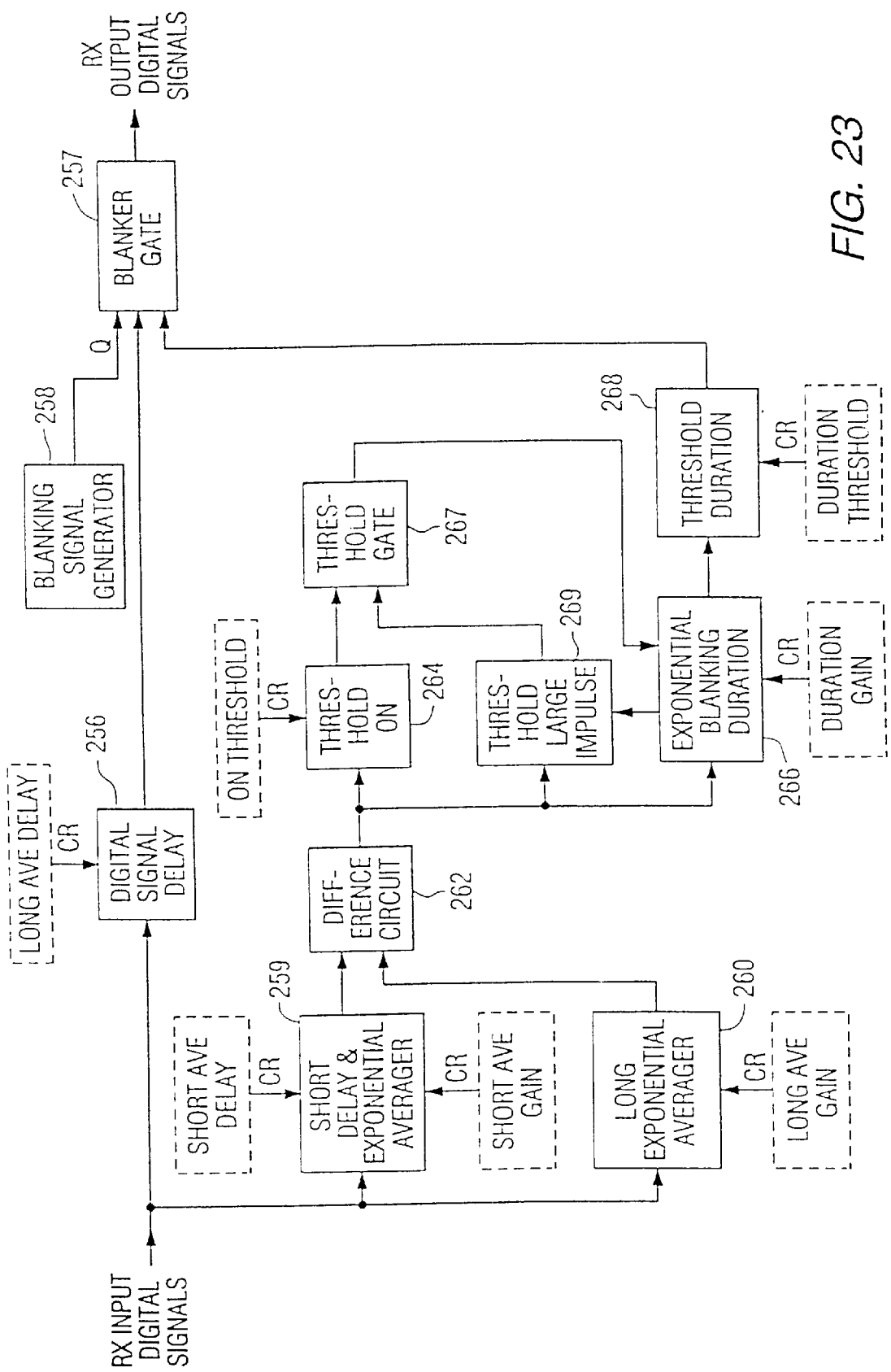
FIG. 23 is a block diagram of a impulse noise blanker circuit of the receiver demodulator configuration.

FIG. 23 includes a block diagram of the impulse blanking circuit 158 used in the receive mode of operation. The purpose of the impulse noise blanker 158 is to prevent impulse noise from ringing the narrowband filters downstream with high energy, short duration, impulse noise. The input noise blanker 158 uses multi bit digitized signal samples. The method of comparison used for noise blanking is to compare energy that is around for a long time to energy of short duration. Radio frequency noise can be characterized as short term wide bandwidth energy while signal of interest can be characterized as long term limited bandwidth energy. Signal of short duration is compared to the signal of interest is assumed to be impulse noise and is to be blanked. A long term average energy is made and compared to the short term average energy. The absolute value of the signal is used as an approximation for the signal energy. The difference between the long term average energy and the short term average energy is used as a decision metric and is compared to a threshold and a blanking decision is made. The threshold of the blanking period is dependent upon the characteristics of the selected signaling scheme of waveform. For example, the threshold for FSK can be set at a low level while the threshold for SSB is required to be set at a higher level. The duration of the blanking period is set to approximate the impulse ringing characteristics of the radio system filters, as configured.

The impulse noise blanker circuit 158 is configured by multi bit commands from the control registers 136 which have received instructions from the memory 14 approximating the impulse noise ringing time of the analog filters in the system. The digital IF input signals are applied to a digital signal delay circuit 256 because of the delay in the averaging process, the signal itself is held in a digital delay line so that the actual samples that cause the blanking decision can them selves be blanked. As illustrated in FIG. 23, the multi bit digital IF input signal including the noise impulse therein is applied to a blanker gate 257. The control line of the blanker gate 257 is connected to receive the blanking signal from the noise detection and processing circuits to actuate the gate to substitute "0" signals from the blanking signal generator 258 for the digital IF input signal during the duration of the blanking signal.

The digital IF input signals including the impulse noise thereon is also applied to a short delay and short exponential averaging circuit 259 which provides an output signal representative of the average magnitude of the short duration noise impulses, and are also applied to a long average exponential averaging circuit 260, which provides and output signal representative of the average magnitude of the input signal. An additional delay line is included before the short energy averaging circuit 259 to align its output to those of the long averaging circuit 260 which has a larger delay so that the outputs from both the circuits are approximately in synchronized in time when applied to a difference circuit 262. The difference circuit 262 subtracts the magnitudes of input signals and applies the difference to a threshold on circuit 264. Simultaneously the difference signal is also applied to a exponential blanking exponential duration circuit 266. When the difference signal exceeds the threshold level (indicating the presence of a noise impulse) a signal is applied by the threshold on circuit 264 to the threshold gate 267 which in turn activates the exponential blanking duration circuit 266 to receive the difference signal and initiate the generation of the duration signal based upon the magnitude of the difference signal. The duration of the blanking period is determined by setting the gain of the exponential decay circuit 266 and setting the duration level of the threshold duration circuit 268. The output of the exponential blanking circuit 266 is applied to a threshold duration circuit which provides a blanking signal to the blanking gate 257 which in turn blanks the digital IF input signal as long as the input from the threshold duration circuit 266 exceeds the threshold level.

The difference signal is also applied to a threshold large impulse detection circuit 269 which compares the magnitude of the output of the exponential blanking duration circuit 266 to the magnitude of the difference signal. If after a blanking sequence has been initiated a second noise impulse is received, and if the difference signal resulting from the subsequent noise impulse is less than the output from the exponential blanking duration circuit 266, the prior blanking sequence continues without change. If the difference signal resulting from the subsequent noise impulse is greater than the output of the exponential blanking duration circuit 266, the threshold large impulse detection circuit 269 reactivates the threshold gate 267 to enable the exponential blanking duration circuit start another blanking duration sequence based upon the magnitude of the difference of the subsequent noise impulse.

The impulse noise blanker 158 utilizes exponential smoothing in the short averaging circuit 259, the long averaging circuit 260 and in the exponential blanking duration circuit 266 to provide an equivalent N-period moving average where $N=(2/\alpha)-1$. A smoothed signal is created based on weighted samples and previous values then compared against the present sample to generate an error signal.

A log function circuit 272 compresses input data and maps the data into the log2 domain. This allows the register sizes and signal paths in the exponential smoother circuits to be small without reducing the dynamic range of the impulse blanker circuit. Once a blank decision is made, the size of the decision metric is used to determine the length of the blanking interval. The reason for doing this is that there is some filtering that occurs in the system before the blanking process of the impulse blanker circuit and the filter will ring for some time after the actual impulse is gone, making the signal unusable for a longer period of time than the duration of the impulse itself. The length of the ringing is proportional to the size of the impulse when compared to the size of the signal. The method of determining the duration of the blanking interval is to put the decision metric into an exponential filter whose delay time is programmed to be proportional to the ringing envelope of the system filters. The proportionality of the blank is expected to be a benefit in the processing of data waveforms which are more susceptible to longer blanking intervals than voice waveforms.

Figure 24:
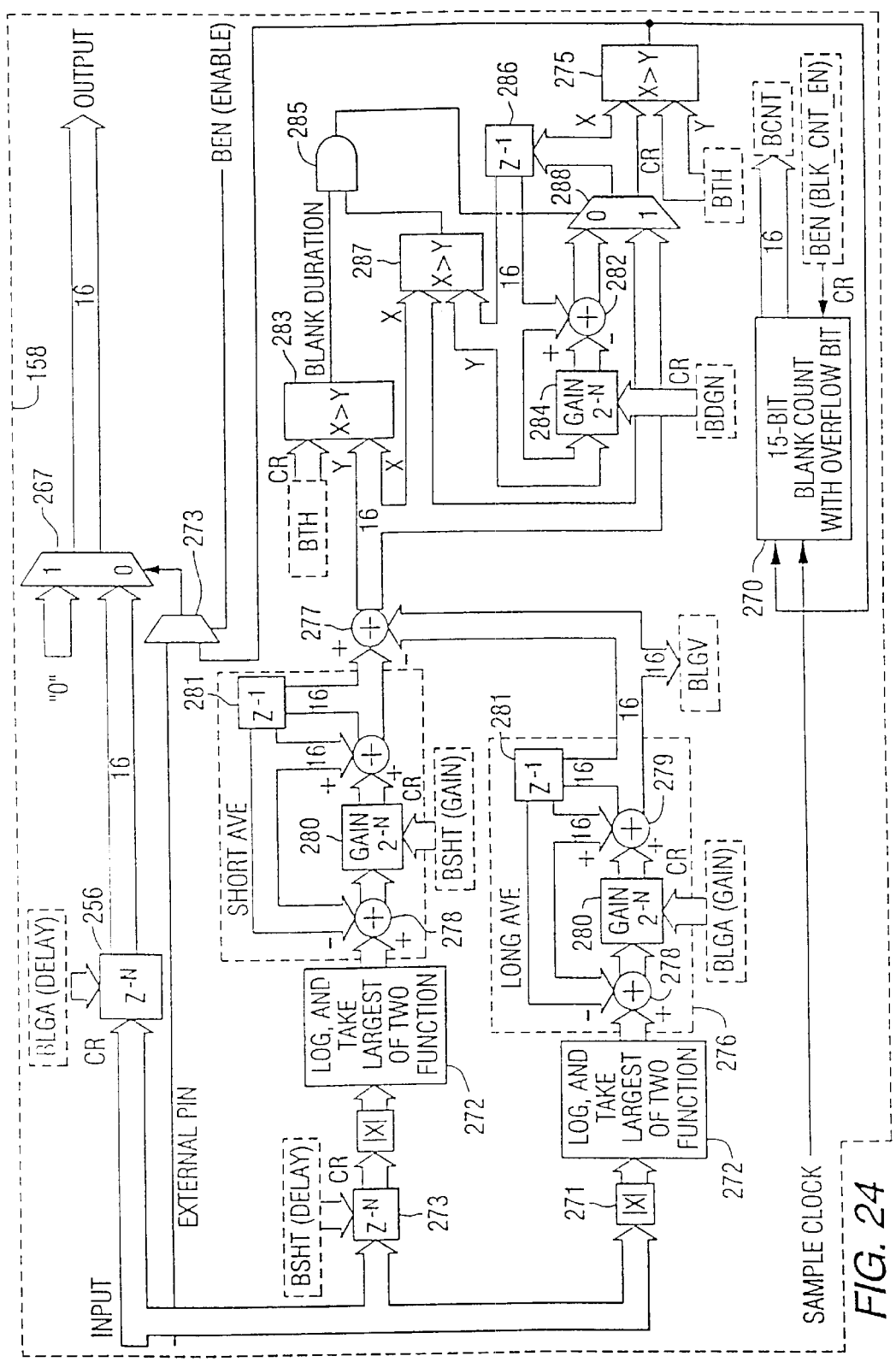
FIG. 24 is an expanded block diagram of the impulse noise blanker of FIG. 23 including abbreviated configuration commands applied thereto.

FIG. 24 includes an expanded block diagram of the impulse blanker circuit 158 with the various configuration commands from the control registers 136 applied to corresponding circuits as designated by the dashed blocks and CR. The short term exponential smoothing circuit 274 and the long term exponential smoothing circuit 276 each include a pair of difference circuits 278 and 279, a gain circuit 280 and a feedback circuit 281 (delay of one sample) interconnecting to provide the short term and long term exponential averaging, respectively. The exponential blanking duration circuit 266 includes an exponential signal decay circuit including a difference 282, a gain circuit 284 and a feedback circuit 286 (delay of one sample) interconnected with a gate 288 applied to a difference circuit 277. The difference between the short and the long averaging circuit gives an estimate of the ratio of short term energy to long term energy. The long averaging circuit responds to low bandwidth changes. The short averaging circuit responds to wide bandwidth changes. Impulses are considered wide bandwidth as compared to the signal of interest. The input signal is delayed so it can non-causally detect and blank impulse noise. The output of the summer is applied to a comparitor 283 which compares the difference signal to a reference and when the difference is greater than the reference the gate 285 receives a first enable signal. The difference signal is also applied to a second comparitor 287 which compares the difference to an output from the exponential decay circuit, and if the difference is greater, the second enable signal is applied to the gate 288 to enable the gate to apply its output to a third comparitor 277. If the output of the gate 288 is greater than a reference, the counter 270 and the gate 273 are enabled. When enabled, gate 273 substitutes 0 samples for the portion of the signal to be blanked. The blank count circuit 270 is used to help determine the blanking period duty cycle to insure proper blanking operation. The blank count is a bit counter with an overflow bit. The blanked sample counter of the blank count circuit 270 is set by the BLK__CNT__EN bit. This resets and starts the blanked sample counter. After an elapsed time set the BLK__CNT__EN bit is to zero and this stops the counter. The BLK__CNT register is read and sets the BLK__CNT__EN bit to reset the counter and start the count again. An overflow will occur if the BLK__CNT__EN is not reset (=0) before $2^{15}-1$ blanked samples. The $16^{th}$ bit can be set if there is an overflow. The BLK__LONG__AVE__EN bit allows the BLK__LONG__VALUE to track the long term average. Clearing the enable bit (=0) causes the value to be held. The value may then be safely read without concern over metastability. The BLK__THRESH__EN register allows the blanker to be bypassed when no blanking is desired. If the blanker is disabled (BLK__THRESH__EN=0) an external pin is used to blank samples if a more sophisticated algorithm is to be implemented. The external pin must be held low and the BLK__THRESH__EN register must be set to 0 in order to disable the noise blanker.

The log-linear and take largest of two circuit 272 is illustrated in greater detail in FIG. 25 and includes a shift up circuit, a priority encoder 290, a summer 291, a shift up circuit 292, a combiner 293, a down shift by 5 circuit 294 and a circuit for using the largest of the next two input values circuit 295.

A mathematical discussion of exponential smoothing is included in the book entitled "Operations Research in Production Planning Scheduling and Inventory Control" in section 6–4 entitled "Exponential Smoothing Methods" pages 416–420, by Lynwood A. Johnson and Douglas C. Montgomery of the Georgia Institute of Technology, published by John Wiley & Sons, Inc. The exponential smoothing circuits 274 and 276 of FIG. 25 are essentially estimators of signal power and noise power, respectively. All that is needed in memory is the last estimate of signal power or noise power to which the current estimate is compared. Essentially, the exponential smoothing circuits incorporate all history without storing the values which has to be multiplied by one constant. The same applies to the exponential smoothing circuit included in the exponential blanking duration circuit 266.

The log and take largest of the next two input value circuit 272 converts the input signal magnitudes (noise and signal) into log form. With the log form, the single multiplication is avoided by using only add functions, which when digitally processed, can be done by bit shifts. When using the log form of the signal magnitudes, as the magnitude approaches zero, the log signal tends to disappear. To avoid this problem, the use the largest of the next two input values circuit 295 would avoid this problem by selecting a non-zero magnitude.

The following 'C' code defines the operation of the LOG function and is used prior to the exponential smoothers:

```
/* Log2 function provides about 8 bit accuracy */
#include <math.h>
#include <stdio.h>
maino( )
{
int y,s, x;
double reallog2, err, maxerr;
int i, hwlog2;
maxerr=0;
for(i=0; i<32*1024; i=i+1) {
    /* input is 15 bit magnitude. */
    /* We can safely scale up by 2 */
    /* to get increased precision */
    x=i<<1;
    /* do the hardware approximation to log2 */
    /* Generate the integer portion of log2(x) */
    s=0;
    y=X;
    if(y<256) {s=8; y=y<<8;}
    if(y<4096) {s+=4; y=y<<4;}
    if(y<16384) {s+=2; y=y<<2;}
    if(y<32768) {s+=1; y=y <<1;}
    s=(~s)&0xf;
    /* Drop the leading 1 and use the shifted word to
        approximate the fractional portion and combine
        with the integer portion. Since the input is
        always an integer multiplied by two all outputs
        are positive except when the input is 0. For this
        algorithm we prefer hwlog2(0) to be 0
        rather than -Inf so all outputs are non-negative.
    */
    hwlog2=(((y>>3)&0xfff)|(s>>12))>>1;
    /* now do a real log2 except when x=0 define log2(0)=
        0*
    if(x>0)
        reallog2=2048.0*log2((float) x); /* compare against a real
        log2(x) */
    else reallog2=0;
    err=fabs(reallog2-hwlog2);
```

```
if(err>maxerr) maxerr=err;
printf("%d %lf %d %lf\n",x,reallog2,hwlog2, err);
}
fprintf(stderr, "Maximum error is %lf\n", maxerr):
```

The configuration commands to the impulse blanker circuit 158 are listed in Table 3.

13) Wideband Mixer

In FIG. 27, the wideband mixers 160 perform a complex frequency mix. In the configured receiver circuit 150, of the output of the impulse noise blanker 158 is mixed by the wideband mixers 160I and 160Q with the complex frequency output of the wideband NCO 164 and applied to the

TABLE 3

| Register | Command | Description |
| --- | --- | --- |
| BLK_ENABLE (BEN) | THRESH | Impulse Blanker Enable/ Disable Control<br>0 = disable<br>1 = enable |
| | BLK_CNT_EN | Enable (=0) blank counter, or<br>hold (=0) blank counter allowing BLK_COUNT<br>register to be read, also clears the BLK_COUNT<br>register. |
| | LONG_AVE | Allow BLK_LONG VALUE register to track (=1)<br>or hold (=0) the value to guarantee the<br>BLK_LONG_VALUE register can be safely read. |
| BLK_THRESH (BTH) | THRESHOLD | The blanking threshold, the duration accumulation<br>will be loaded with difference value when the<br>difference between the short average circuit and the<br>long average circuit is greater than the threshold<br>value. |
| BLK_DUR_GAIN(BDGN) | GAIN | Sample gain ($\alpha$) = $1/2^{n+3}$ where n = (0–7) for a<br>scale rage from $2^{-3}$ to $2^{-10}$ |
| BLK_DUR_THRESH (BDTH) | THRESHOLD | Blanking duration threshold. The input samples will<br>be blanked while the blanking duration accumulator<br>is greater than this register value. |
| BLK_COUNT (BCNT) | COUNT | Number of blanked samples since the last time the<br>counter was enabled. The most significant bit<br>indicates when the counter has overflowed or not<br>(0 = valid count, 1 = counter has wrapped around<br>count may not be valid). The counter is tied to the<br>BLK_ENABLE BLK_CNT_EN register which<br>clears, enables and disables the count value. |
| BLK_SHORT_AVE (BSHT) | GAIN | Sample gain ($\alpha$) = $1/2^{n+3}$ where n = (0–7) for a<br>gain range from $2^{-3}$ to $2^{-10}$. |
| | DELAY | Short term smoother delay. A number ranging<br>from 0 to 127 |
| BLK_LONG_VALUE (BLGV) | VALUE | The value of the accumulator for the long average.<br>To safely read this register clear the<br>BLK_ENABLE.BLK_COUNT bit. |
| BLK_LONG_AVE (BLGA) | GAIN | Sample gain ($\alpha$) = $1/2^{n+3}$ where n = (0–7) for a<br>gain range from $2^{-3}$ to $2^{-10}$. |
| | DELAY | Sample delay used to align input sample with<br>detection algorithm. A number ranging from<br>0 to 127. |

12) Wideband Interpolator

In FIG. 26, the wideband interpolator circuits 168I and 168Q of the configured receiver circuit 150 shall insert zeros into the sample stream to raise the effective sample rate of the stream and negate the effects of fixed decimation further down stream in the processing. The ranges of interpolation is 1 (no interpolation), 2 or 4. ZERO_INSERT (interpolation factor −1) is the number of zeros inserted between samples. The input to the wideband interpolator circuits are bits from the impulse blanker 158, and the output is to wideband mixers 160 I and 160Q. The configuration command to the wideband interpolators is from the mode register, command ZERO_INSERT, that provides the interpolation factor, ie the number of zeros to be stuffed between samples.

wideband interpolators 168I and 168Q The wideband mixers accepts a m-bit output from the wideband NCO 167 or 195. The output a bit result, up shifted if necessary to remove any sign bit growth that might occur due to the multiply. This operation occurs at the maximum wideband interpolation rate. In the transmitter portion 152, of the output of the CIC filter circuits 186I and 186Q are mixed by the wideband mixers 188I and 188Q with the complex frequency output of the wideband NCO 195 and sent to the modulator adder 194. One of the wideband mixer inputs will also be able to take data from outside the IF ASIC 24 through an input register to facilitate the creation of some waveforms. The source of the information is programmable. The wideband mixers operate in a hardware write mode where in-phase and quadurature-phase data is directly written into.

The configuration commands to the wideband mixers are listed in Table 4.

TABLE 4

| Register | Command | Description |
| --- | --- | --- |
| INPH_MIXER_REG (IMPR) | External data | External data input to in-phase mixer |
| QUAD_MIXER_REG (QPMR) | External data | External data input to quadrature mixture |
| NCO_CONFIG (NCOC) | WB_MXR_SCR | Transmit mode, selects the wideband mixer as either CIC output of INPH_MIXER_REG and QUAD_MIXER-REG. |

14) Wideband NCO

Figure 28:
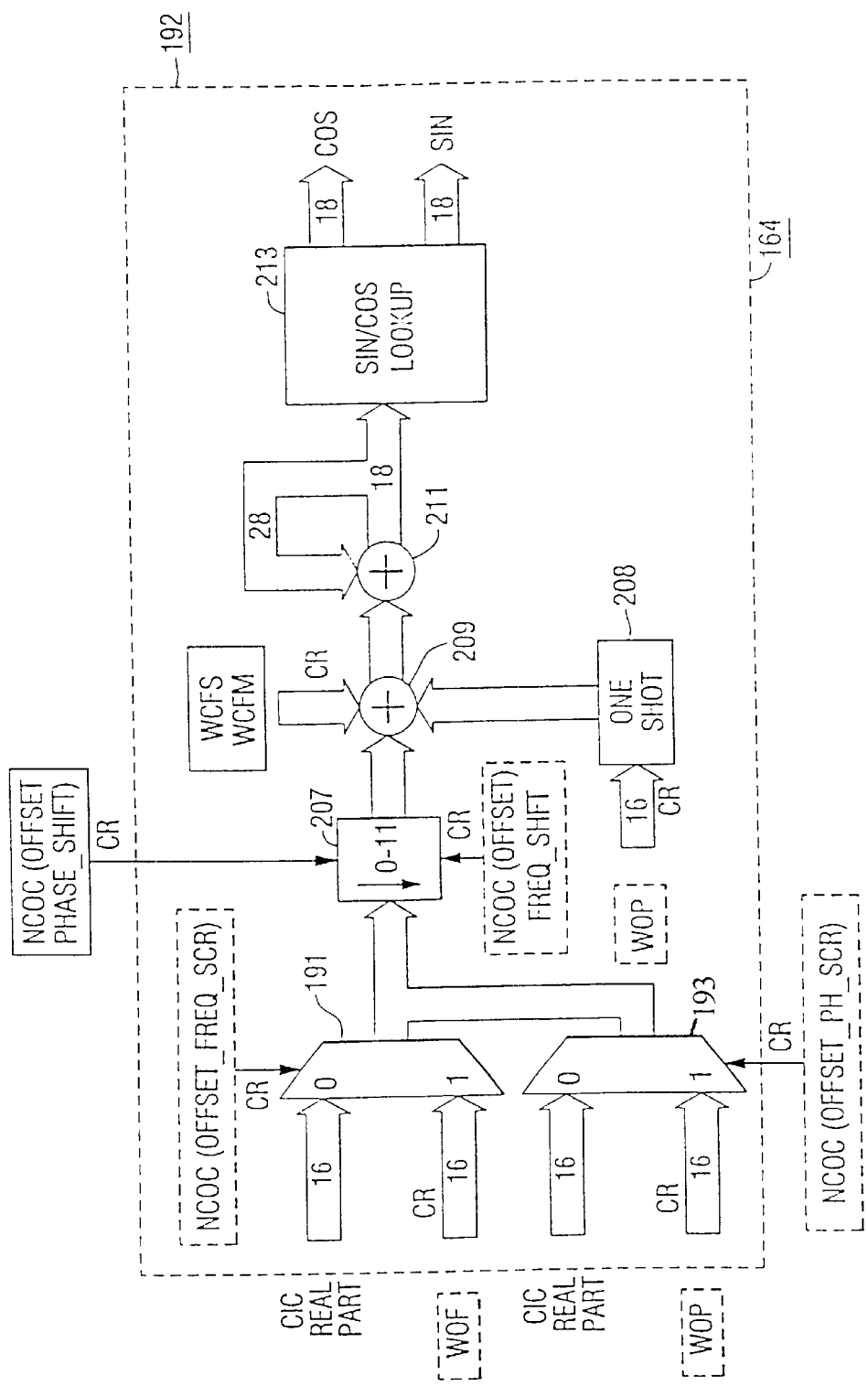
FIG. 28 is a block diagram of a wideband numerical control (NCO) circuit of both the transmitter modulator and receiver demodulator configuration.

The Wideband NCO 164 of FIG. 28 of the configured receiver circuit 150, and 192 of the configured transmitter circuit 152, include a summer 299 (receiving an input from a one shot 209)and a summer 211 which applies and output to a sine/cos look up table 213 to provide the cosine and sine outputs for the in-phase (I) cosine component and a quadrature phase (Q) sine component to the wideband mixers 160I and 160Q and 188I and 188Q respectively. The frequency and phase of the quadrature sinusoids are controlled by the frequency and phase control circuits 165 and 190. The outputs from gates 191 and 192 are applied to a shift circuit 207. The wideband NCO 164 and 192 operate at the input sample rate when in receive and at the output sample rate in transmit. The internal frequency offset register (WNCO_OFST_FREQ) supports update rates as fast as the operating sample rate. Updates shall take effect on the next phase update calculation following the sample clock. The wideband NCO 164 and 192 is be able to control the offset frequency, or phase, from one of two sources, the output of the CIC interpolator and a frequency or phase offset word via configuration processor. For any one mode of operation, only one source will be programmed into the registers. A $2^n$ division (n=0,1,2, . . . ,11) shall be applied to the frequency or phase offset values prior to summation with the center frequency value. The phase offset input is a differential phase, that is, the phase offset input is added prior to the phase accumulator so the phase shift will remain for all time. A one shot 208 will allow the phase offset to be added in once per write. This permits the software process to add a delta phase without concern of wrap-around. The wideband NCO operates the same in transmit and in receive modes except for the carrier mixer sign reversal.

The configuration commands to the wideband NCO are set forth in Table 5.

15) Wideband Decimation and Compensation

Figure 29:
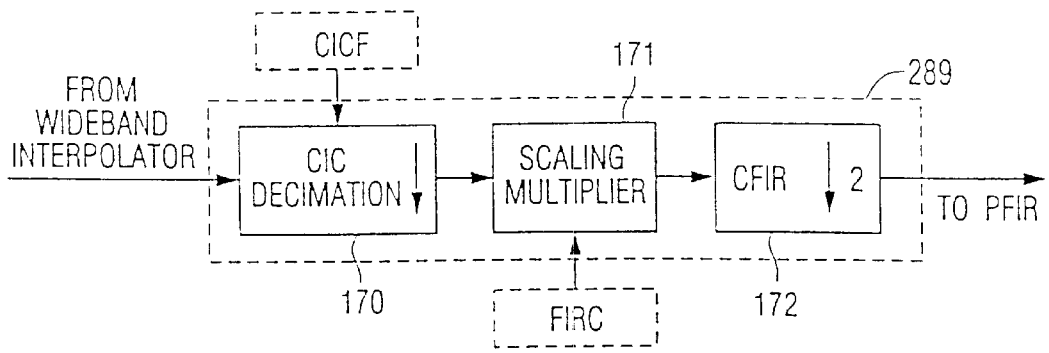
FIG. 29 is a block diagram of a wideband decimation and compensating FIR filter circuit of the receiver demodulator configuration.

The wide band decimation and compensation filter 289 of FIG. 29, including the CIC filter 170, a scaling multiplier 171 and the CFIR 172, in the configured receiver circuit 150, has multirate filters that are used to reduce the bandwidth of an input signal. After the bandwidth is reduced the sample rate can also be reduced. The combination of filtering and sample rate reduction is called decimation.

The dual of decimation is called interpolation. The interpolation process of the circuit 287 of FIG. 30, includes the CFIR 184, a scaling multiplier 183 and the CIC filter 182 of the configured transmitter circuit 152. First the sample rate is increased usually by inserting zeros in between the input samples. The process of inserting samples will create frequency component images that are repeated every multiple of the original sample rate. The undesired images are reduced by filtering them off.

Figure 31:
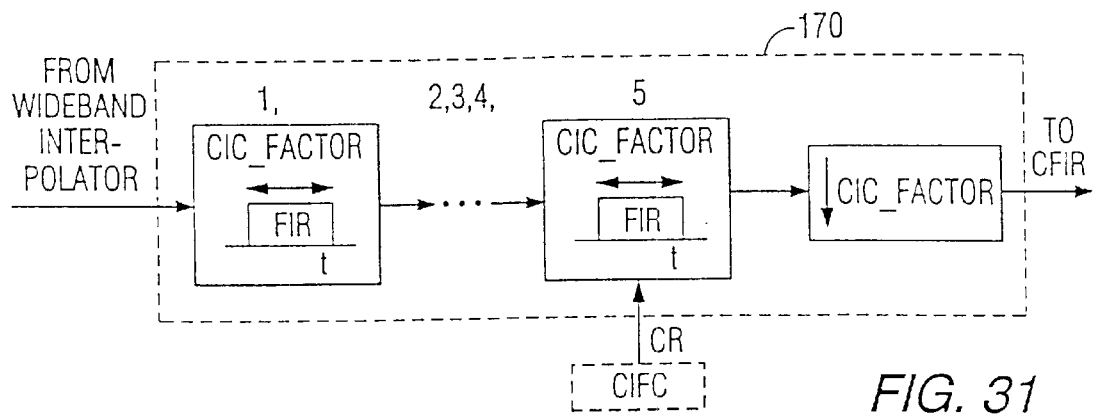
FIG. 31 is a block diagram of a CIC decimation circuit of the receiver demodulator configuration.
Figure 32:
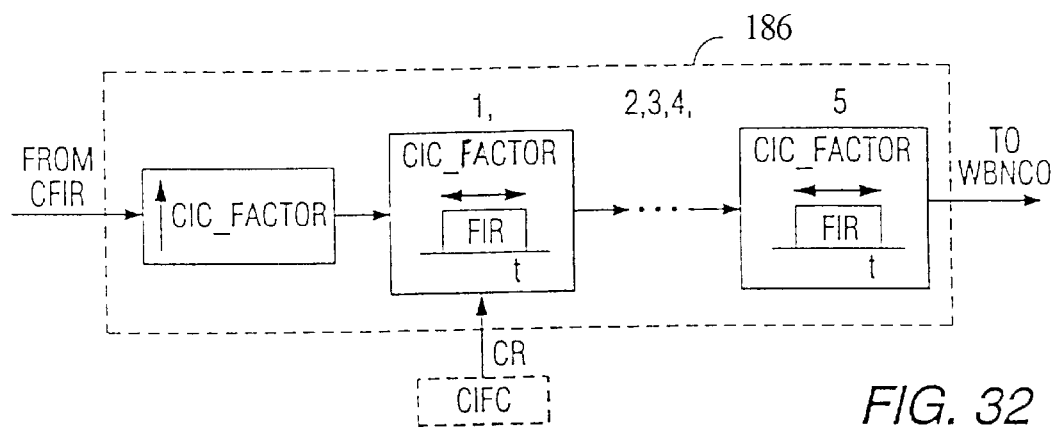
FIG. 32 is a block diagram of a CIC interpolator circuit of the transmitter modulator configuration.

The CIC filter 170 of FIG. 31 is a model for providing decimation for the receiver portion 150. The CIC filter 182 of FIG. 32 is a model for providing interpolation for the configured transmitter circuit. The CIC filter 170 decimates at a rate selectable through a memory mapped register. The aliasing/imaging attenuation is greater than 90 dB within the usable bandwidth of the filter. Additional attenuation is provided by the reprogrammable filter after this stage. A fifth order (CIC) high decimation filter is used to achieve the desired aliasing/image attenuation. The CIC_FACTOR.ACCEL_FCTR bit field changes the interpolation or decimation factor during acceleration mode. The purpose of this factor is to allow the integrators to run at a faster rate during acceleration mode The CIC decimation model and the CIC interpolator model can, for example, have five FIR filters with all ones as coefficients followed by a decimation. Both the number of coefficients and decimation the same and are set by the CIC_FACTOR register.

TABLE 5

| Register | Command | Description |
| --- | --- | --- |
| WNCO_CNTR_FREQ-S (WCFS) | CEBTER_FREQ | Low word of center frequency control register |
| WNCO_CNTR_FREQ_M (WCFM) | CENTER_FREQ | High word of center frequency register |
| WNCO_OFST_FREQ (WOF) | OFFSET_FREQ | This register is the offset frequency register. It is scaled by WB_OFFSET_FREQ_SHFT |
| WNCO_OFST_PH (WOP) | OFFSET-DELTA_PHA-SE | Offset phase register, allows configuration of delta phase rather than absolute. |
| NCO_CONFIG (NCOC) | WB_OFFSET_FREQ_SHFT | Wideband NCO frequency offset down shift applied to WB_OFFSET-FREQ_SCR before loading to OFFSET_FREQ registers. |
| | WB_OFFSET_FREQ_SRC | Select WNCO_OFST_FREQ or CIC real output |
| | WB-OFFSET_FREQ_HWW | Set the wideband offset frequency register into write mode. |
| | WBMXR_SYNC_MODE | Selects wideband mixer source between interface and write mode. |

In implementation the CIC filter 170 of FIG. 31 has an integrate decimation and a comb section. In the receive mode, the CIC filter 170 inputs bits from the wideband interpolator 168 and outputs bits are filtered and decimated and are applied to CFIF circuit 172. In the transmit mode, the CIC filter circuit 186 inputs bits from the CFIR circuit 184 and outputs interpolated bits to mixers 188. The CIC circuit receives the command CIC_FACTOR from the register CIC_FACTOR(CICF) which provides the decimation and interpolation factors to the CIC circuits.

Figure 30:
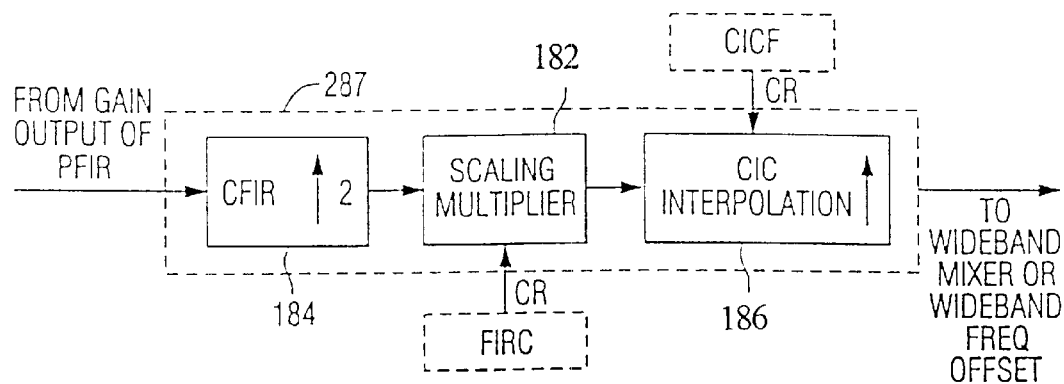
FIG. 30 is a block diagram of a wide band interpolation and compensating FIR filter circuit of the transmitter modulator configuration.

In the scaling multipliers 171 and 183 of FIGS. 29 and 30, the CIC Scalar scales the samples. The integrator in the CIC allows for large bit growth in the case of large decimation. This stage down shifts the signal back to the 18 bit range of the rest of the front end processing. Downshifts are controlled by the configuration processor. This function shall operate at the output rate of the CIC filter. In the receive mode, full range samples are received from the CIC circuit 170 and rounded results are sent to the CFIR 172. In the transmit mode, full range samples are received from the gain circuit 182 and rounded outputs are applied to the wideband mixer 188 or wideband NCO 192 via gates 191 and 192. Commands CIC_SHIFT_A and CIC_SHIFT_B are provided from the FIR_CONFIG (FIRC) register for providing the scale factor after CIC interpolation or decimation.

Figure 33:
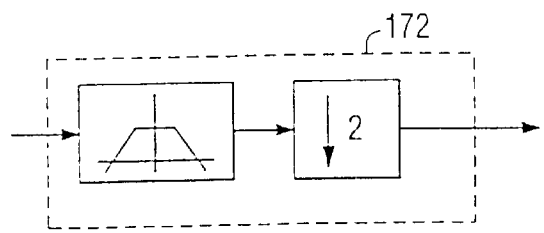
FIG. 33 is a block diagram of a compensation FIR filter (CFIR) circuit of the receiver demodulator configuration.
Figure 34:
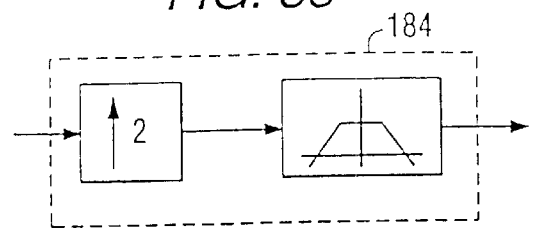
FIG. 34 is a block diagram of a compensation FIR filter (CFIR) circuit of the transmitter modulator configuration.

The purpose of the CFIR filters 172 and 184 of FIGS. 33 and 34 of the configured receive and transmit circuits 150 and 152, respectively, is to compensate the spectrum of the signal which compensates for the Sinc roll off of the CIC filter 170 in the receive mode and CIC filter 186 in the transmit mode. In the receive mode the CFIR filter 172 receives bit sample from the CIC circuit 170 and outputs rounded results to the PFIR 174. In the transmit mode, the CFIR filter 184 receives bit results from the gain circuit 182 and outputs bit samples to the CIC circuit 180.

Figure 35:
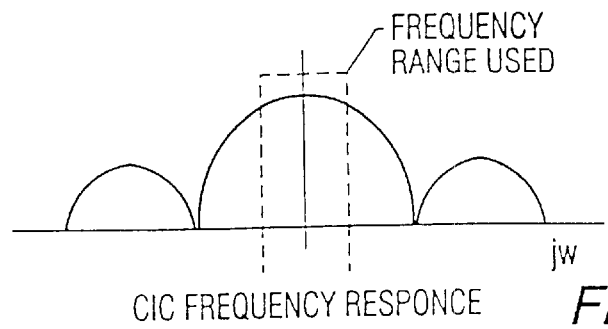
FIG. 35 is an illustration of the frequency response of the CIC circuit.
Figure 36:
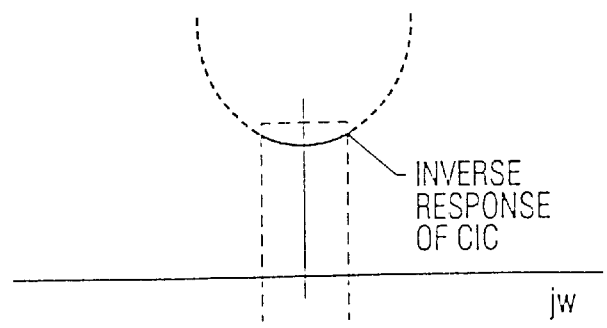
FIG. 36 is an illustration of the frequency response of the CFIR.

FIGS. 35 and 36 illustrate the purpose of the CFIR filters. The combination of the CFIR and CIC filter responses is almost flat across the frequency band.

Figure 38:
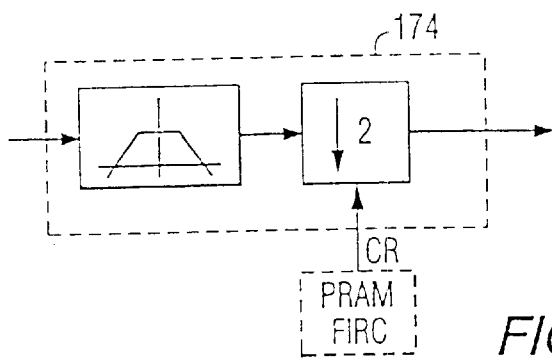
FIG. 38 is a block diagram of a programmable FIR (PFIR) filter circuit of the receiver demodulator configuration.

In the receive mode, as illustrated in FIG. 38, the compensating CFIR filter 172 shall be a fixed coefficient, decimate by two FIR filter that compensates for the Sinc passband characteristics of the CIC filter 170. It shall also limit the CIC filter 170 output bandwidth so that in band aliasing distortion is suppressed by at least 90 dB. In the Transmit mode, as illustrated in FIG. 39, the CFIR filter 184 shall be a fixed coefficient, interpolate by two FIR filter that compensates for the Sinc passband characteristics of the CIC filter 180.

Figure 39:
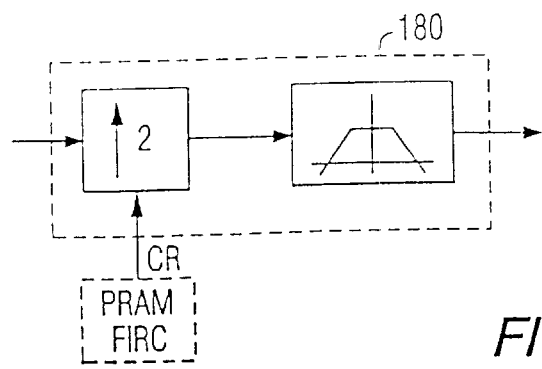
FIG. 39 is a block diagram of a programmable FIR (PFIR) filter circuit of the transmitter modulator configuration.
Figure 37:
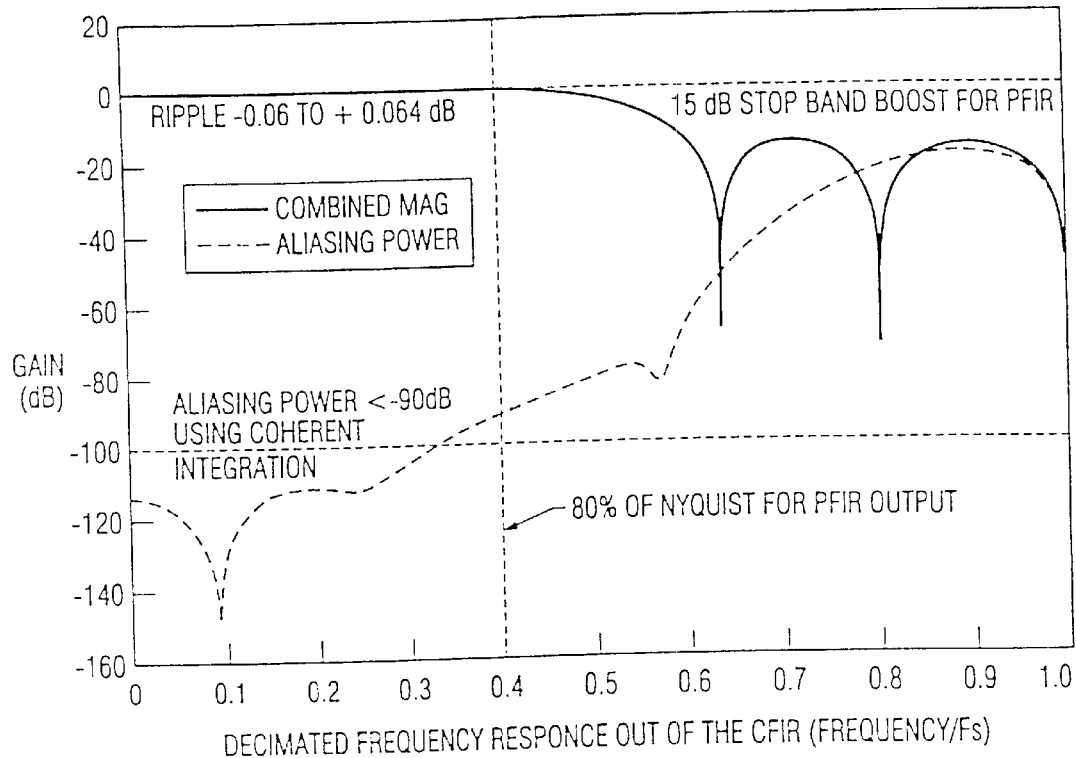
FIG. 37 is an example plot of the combined operation of the CIC and CFIR filters
Figure 40:
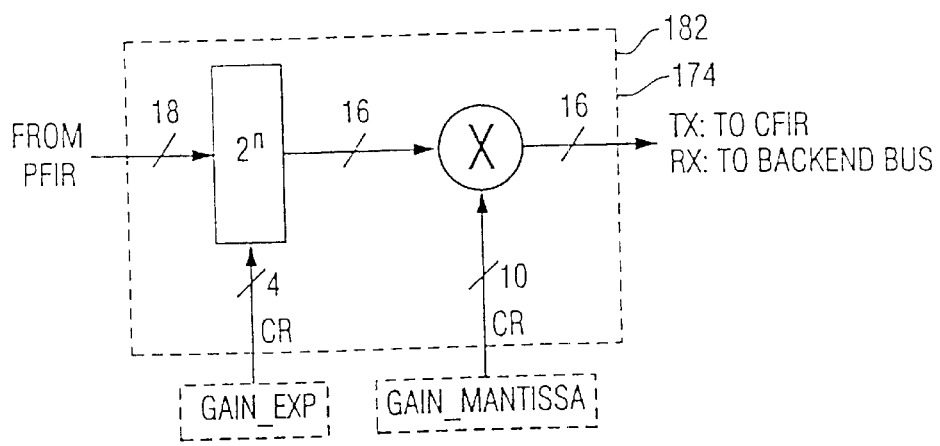
FIG. 40 is a block diagram of a gain control circuit of both the receiver demodulator and transmitter modulator configuration.

The PFIR filter 174 in the receive mode and PFIR filter 180 in the transmit mode of FIGS. 38 and 39, respectively, dictate the final output response of the system lowpass filtering. In the receive mode, the PFIR filter 174 receives bit samples from the CFIR filter 172 and outputs bit rounded results to the gain circuit 176. In the transmit mode, the PFIR filter receives inputs from the bus 139 and outputs bit samples to the gain circuit 182. The PFIR filter consists of two programmable filters which will share a common set of coefficients. The number of coefficients in the filter is seven plus a multiple of eight (8*length)+7 and the filter is symmetric around the center tap. The maximum number of coefficients that the PFIR filter can use is related to the number of internal clocks that are supplied to it. The number of internal clocks is set by the CIC_FACTOR and decimated clock.

Figure 41:
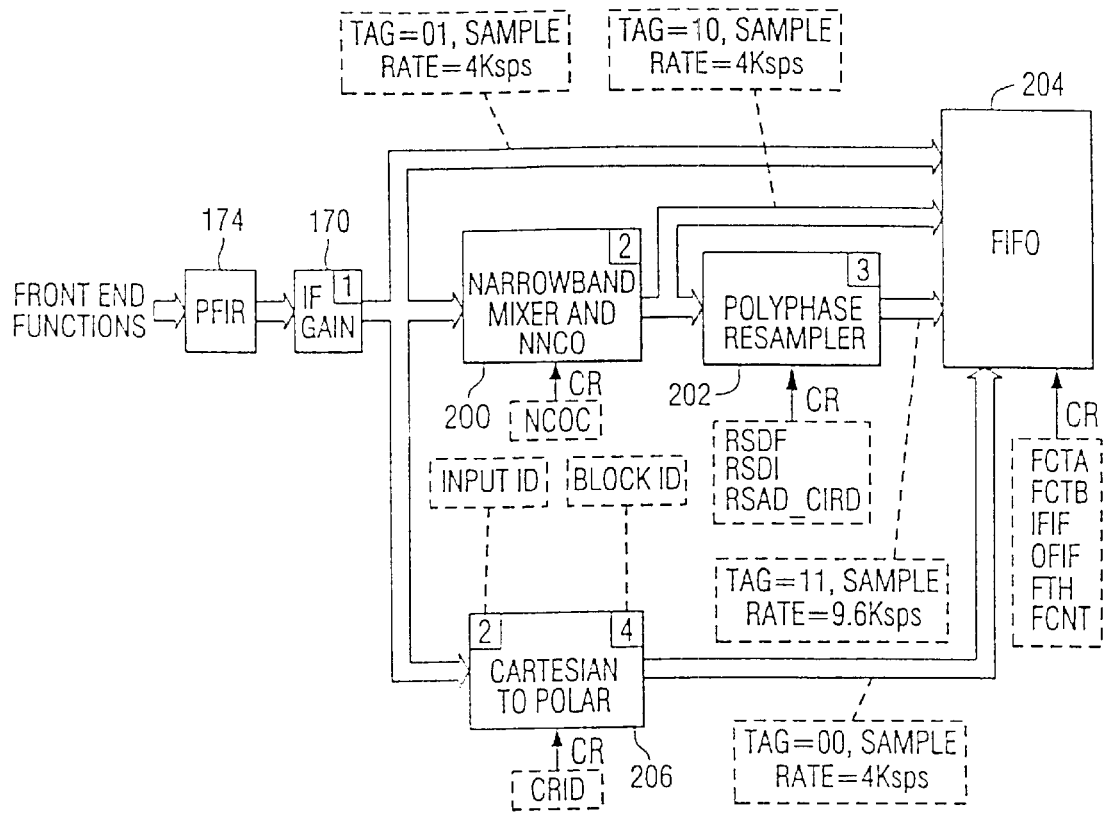
FIG. 41 is a block diagram of an example of a baseband signal processing circuit configured to include a combination of the re-sampler, the narrow band mixer and the Cartesian to polar converter.

The gain control 170 of FIG. 41 accepts bits from the PFIR filter 174 and applies an up shift (overflow protected), applies a (−1 to 1) gain (n- bit resolution), and rounds to the bits. In receive mode this value is placed onto the backend bus 139. In transmit mode it is sent to the CFIR filter 184 with two zeros added to the bottom to match the bit input of the CFIR filter. The output of the shifter will clip the data if it goes beyond the bit range. Commands GAIN_EXP and GAIN_MANTISSA are received from the register GAIN (GAIN).

In the receive mode, PFIR_FIFO_ERROR indicates loss of data in receive mode due to either the FIFO 204 register overflowing, or the back end has backed up until the PFIR filter overwrote its output prior to data being consumed. In transmit mode, PFIR_FIFO_ERROR indicates that data did not get to the PFIR when the data was needed.

The configuration commands for the PFIR filters are set forth in Table 6

TABLE 6

| Register | Command | Description |
| --- | --- | --- |
| PRIR_DATA (PRAM) | PFIR_COEFF | Tap weighs for the PFIR filter |
| FIR-CONFIG (FIRC) | PFIR_LENGTH | Length of the PFIR filter. |
|  | PFIR_QSHIFT | Sets decimal point of the output. |
|  | PFIR_FLTR_ID | The PFIR filter bus ID. |
|  | PFIR_SEND_CART | Send output of PFIR filter to cartesian to polar converter. |

16) Backend Baseband Functions, Narrowband NCO, Re-sampler Cartesian to Polar Converter and FIFO The backend baseband circuits and system described herein are the subjects of a separate patent applicaiton filed concurrently herewith.

If the output signals of the configured demodulator circuit 150, or the input signals to the configured modulator circuit 152, need further processing, an arrangement of DSP signal processing functions can be provided by the configurable circuits of the backend 135. The configurable DSP circuits of the backend can essentially be considered as a plurality of DSP tools in a "tool box", that can be taken out of the "tool box", interconnected or configured (via the bus 139) in any of a variety of signal processing arrangements for connection to the configured demodulator circuit 150 output, the configured modulator circuit 152 input or the FIFO 204. As previously mentioned, the instructions and commands for configuring the IF ASIC 24 are loaded from the memory 14 into the control registers 136 in response to a system configuration as requested by the user. If the signals out of the configured demodulator circuit 150, or into the configured modulator circuit 152, need further processing, the commands or instruction loaded into the control registers 136 take the DSP tools out of the "tool box" and configure their interconnections and set their parameters for the selected additional signal processing.

The control registers 136 are loaded to identify the source of signal, or DSP, to be connected to a subsequent DSP, or signal processing circuit. The output of any one source of signals, or DSP, can be connected by commands from the control registers to a plurality of subsequent DSPs, or signal processing circuits, so that the signals can be processed in parallel as well as serial.

For example, if the radio system user requests a receiver mode with a phase shift keying (PSK) signaling scheme, then is such case, the output of the demodulator 150 (function 1) can be connected in a series signal processing circuit including a series connected complex narrow band excision filter circuit (function 2), complex mixer (function 3) and Cartesian to polar converter (function 4) to output PSK signals. In such case, the control registers 136 are loaded as follows:

| Register | Value |
|---|---|
| Function 4 source register | 3 |
| Function 3 source register | 2 |
| Function 2 source register | 1 |

If for example, if a configuration of a combined single side band (SSB) and frequency shift keying (FSK) is the received output selected by the user, the DSP tools in the "tool box" can be configured so that the output of the demodulator (function 1) can be connected to the input of a first series signal processing circuit including a complex narrow band excision filter (function 2) and a complex mixer (function 3) to output SSB signals, and in parallel to a Cartesian to polar converter (function 4) to output FSK signals. In such case, the control registers 136 are loaded as follows:

| Register | Value |
|---|---|
| Function 2 source register | 1 |
| Function 3 source register | 2 |
| Function 2 source register | 1 |

The back end bus 139 is used to communicate data between processing functions of the backend portion 135 the front end portions 14, the bus manager 137, the control registers, and the interface 138. The functions provided by the backend portion 135 are arranged in a serial chain except for the cartesian to polar converter 206. The cartesian to polar converter 206 can be placed in parallel with the any other backend function. A handshaking protocol is used to prevent underflows or overflows within the chain. Backend function addresses are numbered sequentially according to their desired position within the processing chain with the source being function address 1. Unused functions are assigned the address zero. Backend functions are PFIR/gain 170, re-sampler 202, Cartesian to polar converter 206 and narrow band mixer 200.

In receive mode the FIFO 204 observes the output at up to four spots in the chain. These are specified by enabling bits in FIFO_CTL. The final function must be the FIFO 204. FIG. 41 is an example of a receive mode configuration of the backend, configured by the control system, with four complex data path streams. The data path tagging is disabled allowing for external hardware to detag the data. The upper right corner of each block shows the backend processing block ID number. This block ID number is the processing order of the backend bus 139. For example, the FIFO 204 can terminate processing streams (pulls) from both the IF gain 170, the narowband mixer 200, the re-sampler 202 and the cartesian to polar converter 206. Two ID_PULL bits must be set to synchronize the each stream. The ID_MASK bits are the FIFO 204 observer bits indicating processing blocks to get data from. Since there are four active paths, four ID_MASK bits must be set.

The configuration commands for the back end function model of FIG. 41 are set forth in Table 7.

TABLE 7

| Register | Function |
|---|---|
| FIR_CONFIG.PFIR_FILTR_ID=01d | PRIR |
| FIR_CONFIG.PFIR_SEND_CART=1d | PRIR |
| NCO_CONFIG.NB_MXR_ID=02d | Narrowband mixer and NCO |
| NCO_CONFIG.NBMXR_SEND_CART=0d | Narrowband mixer and NCO |
| CART_RES_ID.CART_INPUT ID=02d | Cartesian to polar converter |
| CART_RES_ID.CART_ID=04d | Cartesian to polar converter |
| CART_RES_ID.RES_ID=03d | Polyphase re-sampler |
| CRT_RES_ID.RES_SEND_CART=0d | Polyphase re-sampler |
| FIFO_CTLA.ID_MASK_1=1d; - tag 00 | FIFO |
| FIFO_CTLA.ID_MASK_2=1d; - tag 01 | FIFO |
| FIFO_CTLA.ID_MASK_3=1d; - tag 10 | FIFO |
| FIFO_CTLA.ID_MASK_4=1d - tag 11 | FIFO |
| FIFO_CTLA.ID_MASK_5=0d | FIFO |
| FIFO_CTLA.ID_MASK_6=0d | FIFO |
| FIFO_CTLA.ID_MASK_7=0d | FIFO |
| FIFO_CTLB.ID_PULL_1=0d | FIFO |
| FIFO_CTLB.ID_PULL_2=0d | FIFO |
| FIFO_CTLB.ID_PULL_3=1d | FIFO |
| FIFO_CTLB.ID_PULL_4=1d | FIFO |
| FIFO_CTLB.ID_PULL_5=0d | FIFO |
| FILO_CTLB.ID_PULL_6=0d | FIFO |
| FIFO_CTLB.ID_PULL_7=0d | FIFO |
| FIFO_CTLB.TAG_ENABLE=0d | FIFO |

Figure 42:
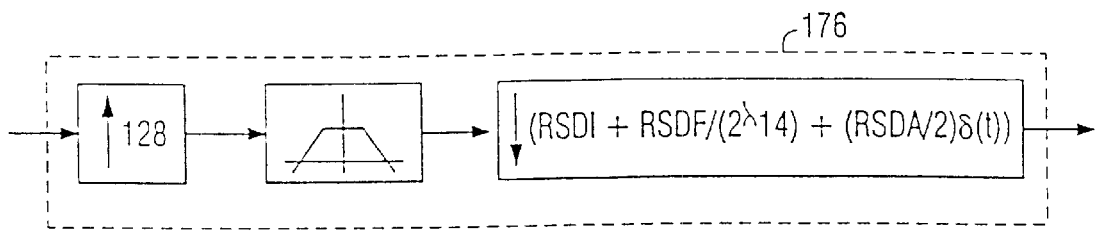
FIG. 42 is a block diagram of a polyphase re-sampler model of the baseband signal processing circuit.

The polyphase re-sampler 176 has an interpolating polyphase filter bank of FIG. 42 after the HDF filters for sample rate conversion and symbol retiming. The input signal is interpolated by inserting zeros between each input sample which increases the sample rate by 128. The signal is filtered with a tap low pass filter. Lastly, the signal is decimated by a programmable rate with the following formula for decimation rate:

$$\{RNCO\_DECIMATE\_I+(RNCO\_DECIMATE\_F/2^{14})+RNCO\_ADJUST*\delta(t)\}$$

where the $\delta(t)$ indicates a one time write to the RNCO_ADJUST register (it is analogous to the phase adjustment of the wideband NCO). The polyphase resampler consists of 128 banks for an effective up conversion of 128 of the input sample rate to the filter. Computation and output of the polyphase filter is under the control of the re-sampling NCO 200. The filter coefficients of the polyphase filters is fixed and common to both I and Q signal paths. The polyphase filter can, for example, have a transition band of 0.003125 to 0.0046875 normalized to the effective up converted sampling frequency. It can also have less than 0.15 dB ripple in the pass band and less than 40 dB attenuation of the summed aliased images in the stop band. The summed aliased images are suppressed.

Figure 43:
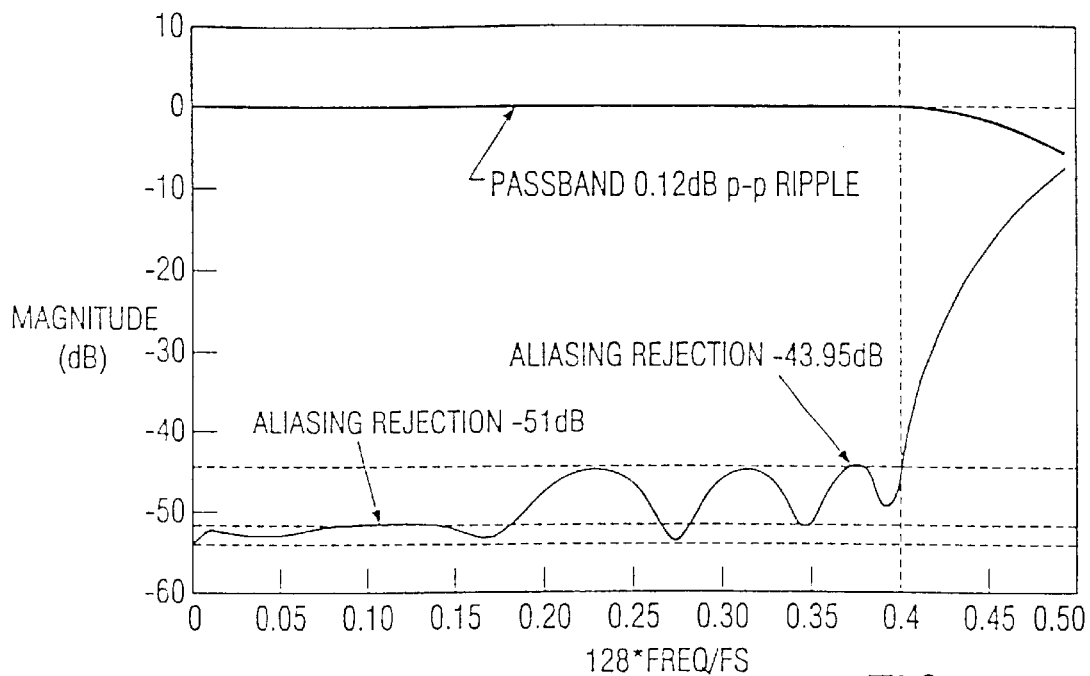
FIG. 43 is an example plot of the aliasing stop band of the polyphase re-sampler model.

The polyphase resampler will be used for the following two purposes: 1) to perform symbol retiming for making symbol decisions in modem mode, and 2) to convert sample rates for waveform processing software reuse. Because of the limited aliasing attenuation is assumed that no further filter processing will be performed after this process. FIG. 43 shows aliasing suppression of the polyphase re-sampler model of FIG. 42 (frequency normalized to effective up converted sampling frequency).

The backend portion includes a re-sampling RNCO 200 that controls the polyphase re-sampler 202. This re sampler RNCO provides sample rates decimated from the up converted sampling frequency. The sample rate is considered continuous and fractional and can have a limited frequency error relative to the system clock frequency over the decimation range specified. This allowable error is to account for the truncation errors introduced by a finite length accumulator. These decimation rates will be specified through two bit registers and shall be the same for both I and Q channel paths. One register shall contain the integer part of the decimation and shall be right justified to the binary point. The other register shall contain the fractional part and shall be left justified to the binary point. The re-sampler RNCO determines the commutator position of the polyphase filter. In addition to the automatic re-sampling of the samples there are two bit registers for the correction of the re-sample RNCO accumulator for the adjustment of symbol timing decisions. The adjustment are made after the computation of the next sample after the master registers has been loaded, at which time they are added to the phase accumulators once per write. Handshaking allows a DSP to update the RNCO_ADJUST once per output sample. The format of these adjustment registers are as the decimation registers except that these registers may contain negative numbers. Negative numbers will advance sample timing and positive numbers will retard sample timing.

The re-sampler can be used to up sample (interpolate) a signal by setting the decimation to less than a prescribed limit. When doing so one must be careful that functions down stream have sufficient clock cycles that they are not overwhelmed by the interpolator data stream. For large interpolation phase quantization may become an issue and can be avoided by using an integer decimation number.

Figure 45:
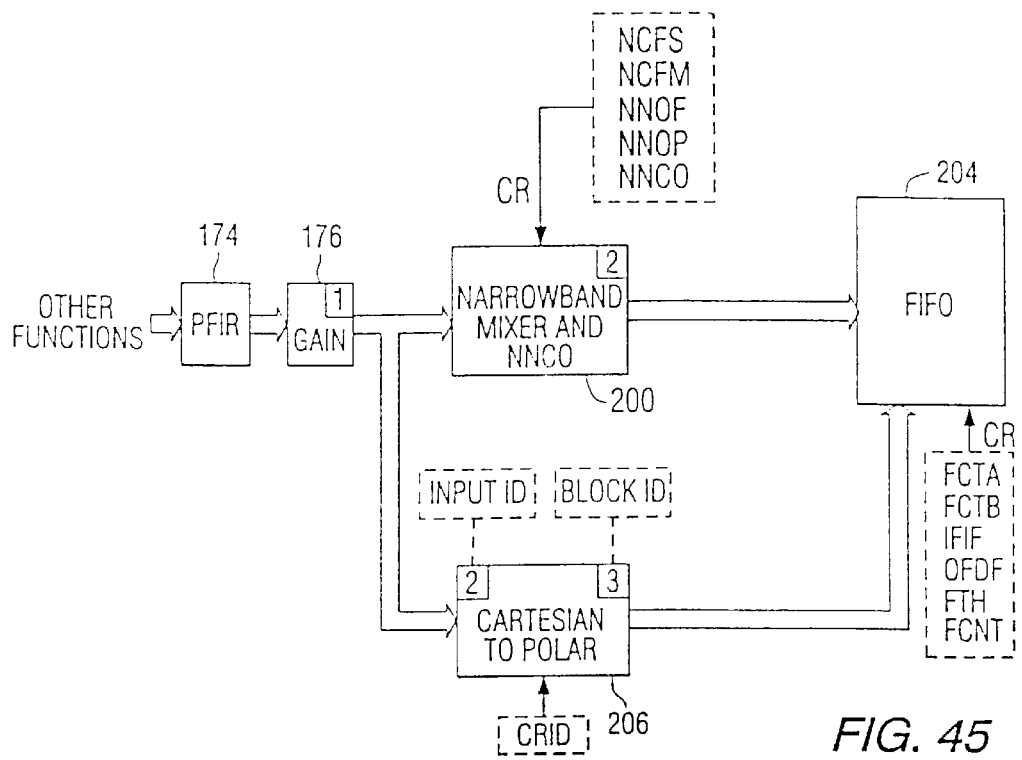
FIG. 45 is a block diagram of an example of a baseband processing circuit configured to include a combination of the narrow band mixer and the cartesian to polar converter.

Configuration commands for the back end re-sampler RNCO arrangement of FIG. 45 are set forth in Table 8.

TABLE 8

| Register | Command | Description |
| --- | --- | --- |
| RNCO_DECIMATE_F | FRACTION | Fractional part, NCO decimation number, slave register to RNCO_ADJUST. |
| RNCO_DECIMATE_I | INTEGER | Integer part, NCO decimation number, slave register to RNCO_ADJUST. |
| RNCO_ADJUST (RSAD) | VALID_FLAG | Set by configuration processor after changing RNCO_DECIMATE. |
|  | MISSED_FLAG | Missed flag. |
|  | MISSED_FLAG_CLEAR | Clear missed flag. |
|  | FRACTION_ADJ | Fractional NCO adjustment. |
| CART_RES_ID (CRID) | RES_ID | Function ID for re-sampler. |
|  | RES_SEND_CART | Enable sending re-sampler output in to cartesian to polar converter. |

Figure 44:
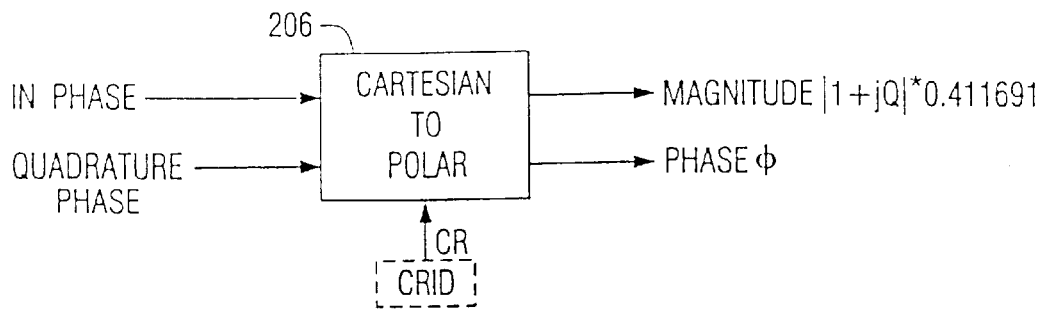
FIG. 44 illustrates the input and output signals of the block diagram of a cartesian to polar converter circuit.
Figure 46:
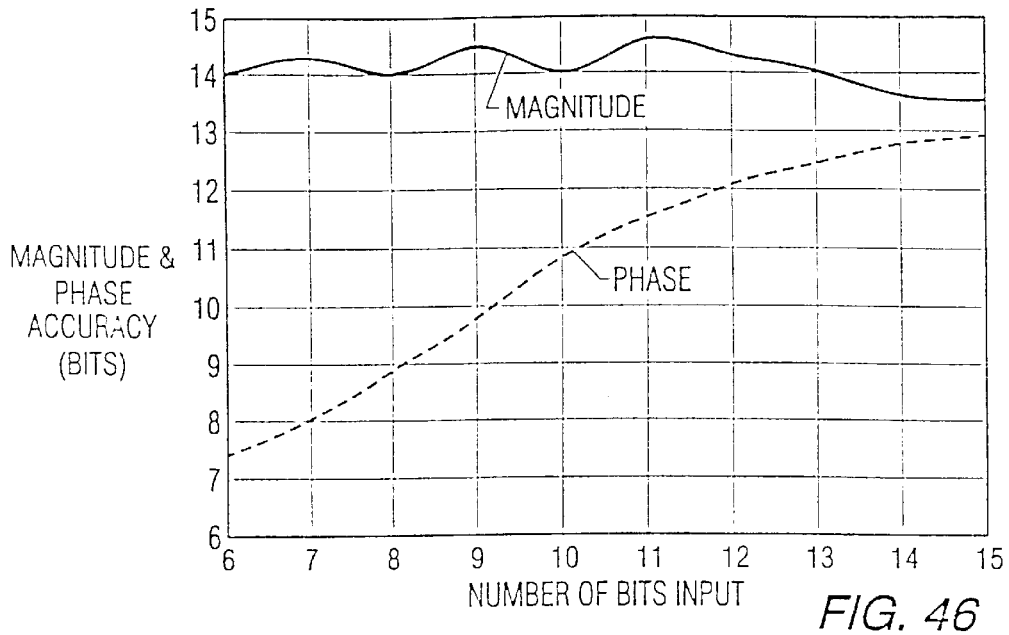
FIG. 46 is an example plot of the phase accuracy of the cartesian to polar example of FIG. 45.

The cartesian to polar converter 206 of FIG. 44 takes the I and Q sampled data and converts it from rectangular into polar coordinates. The magnitude output includes a gain. The phase output includes a range of $[-\pi,\pi)$ as a bit number. The accuracy is n-bits when input magnitude is full scale. The accuracy decreases with magnitude as shown in FIG. 46. The cartesian to polar converter 206 is the only back end function that can be put in parallel with any of the other back end functions. For example, if as illustrated in FIG. 45, the desired processing sequence is: PFIR, narrow band mixer and then the FIFO with the cartesian to polar converter in parallel with the narrowband mixer taking its data from the PFIR. The sequence will be:
FIR_CONFIG.PFIR_SEND_CART=1
NCO_CONFIG.NBMXR_SEND_CART=0
CART_RES_ID.CART_ID=3
FIR_CONFIG.NB_MXR_ID=2
NCO_CONFIG.NB_MXR_ID=2
CART_RES_ID.CART_INPUT_ID=2

The configuration commands for the back end function arrangement of FIG. 44 are set forth in Table 9.

TABLE 9

| Register | Command | Description |
| --- | --- | --- |
| CART_RES_ID (CRID) | CART_ID | Function ID for input to cartesian to polar converter |
|  | CART_INPUT_ID | This ID is always the same as the ID of the function that the cartesian to polar is in parallel with. |

Figure 47:
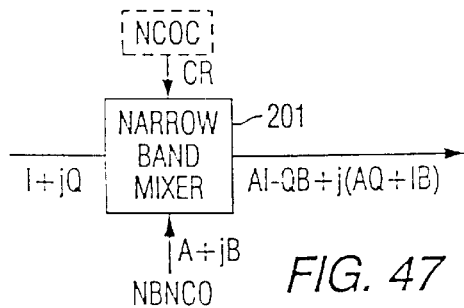
FIG. 47 is a block diagram of a narrow band complex mixer circuit of the baseband signal processing arrangement.

The complex narrow band mixer 201 of FIG. 47 operates on and produces complex data. When real data is used in transmit mode the imaginary part of the input stream is set to zero, and in receive mode a real signal (such as voice) will typically shifted down to DC by the front-end. The signal is then up shifted to place the output at the proper frequency. If the real signal is all that is desired, the imaginary part of the output can be discarded when reading the FIFO. In the receive mode, the mixer receives I and Q bit samples, and outputs complex bit samples. In the transmit mode, the mixer receives real or complex bit samples and outputs I and Q bit samples.

The configuration commands for the back end narrow band NCO of FIG. 47 is set forth in Table 10.

TABLE 10

| Register | Command | Description |
| --- | --- | --- |
| NCO_CONFIG (NCOC) | NB_OFFSET_FREQ_SHIFT | Down shift applied to NB_OFFSET_FREQ_ before loading to OFFSET_FREQ registers. |
|  | NB_MXR_ID | Narrow band mixer function ID. |
|  | NBMXR_SEND_CART | Send output of narrow band mixer to cartesian to polar converter. 1 = send output to cartesian to polar 0 = do not send |

Figure 48:
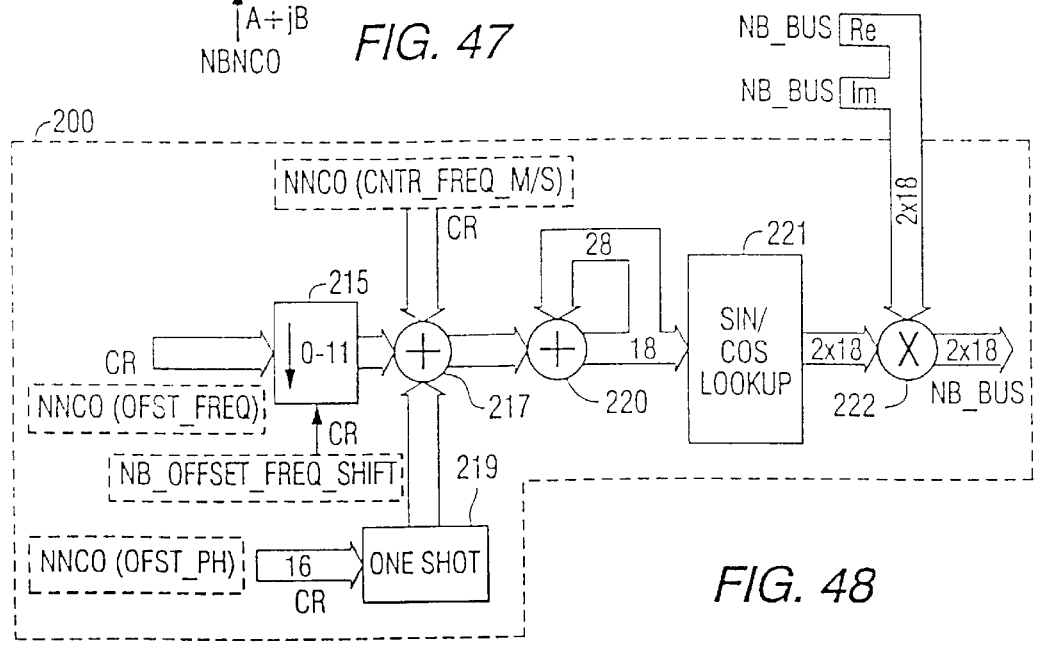
FIG. 48 is a block diagram of the combined narrow band NCO and narrow band complex mixer circuits of the baseband signal processing arrangement.

The narrow band NCO 200 of FIG. 48 provides an in-phase (I) cosine component and a quadrature-phase (Q) sine component to the narrowband mixer. The narrowband NCO includes a shifter 215 connected to a summer 217 (also connected to a one shot 219). The output form the summer 217 is applied to a summer 220 and then to a sin/cos look up table 221 for an output to a mixer 222. The frequency and phase of the quadrature sinusoids are controlled by a phase generator. The narrow band NCO 200 can operate at either the sample rate into or out of the re-sampler. Frequency and phase offset registers are included. Synchronization handshaking is provided to allow control loop software to update once per sample. Updates are valid after the first narrow band NCO 200 output, after the registers are loaded. The narrow band NCO 200 controls an offset frequency from one of two sources ie., data from the bus 78 and a frequency offset word via the configuration processor. For any one mode of operation, only one source is programmed into the registers. A $2^n$ division (n=0,1,2, . . . ,11) is applied to the frequency offset values prior to summation with the center frequency value. The phase offset input is a differential phase, that is, the phase offset input is added prior to the phase accumulator so the phase shift, will remain for all time. A one shot allows the phase offset to be added in once per write. This permits the software process to add a delta phase without concern of wrap-around. The register supports handshake transfers to maintain sync with software control loops.

The configuration commands for the back end narrow band NCO of FIG. 48 are set froth in Table 11.

TABLE 11

| Register | Command | Description |
| --- | --- | --- |
| NNCO_CNTR_FREQ_S (NCFS) | CENTER_FREQ | Low word of center frequency control register. |
| NNCO_CNTR_FREQ_M (NCFM) | CENTER_FREQ | High word of the center frequency control register. The low and high words of Center Frequency control register combine to form a single 28 bit number. The range is (−1/2, 1/2) cycles per sample. (−Fs/2, Fs/2). |
| NNCO_OFST_FREQ (NNOF) | NB-OFF_FREQ | Offset frequency register represents cycles per sample slaved to NNOC_OFST_PH |
| NNCO_OFST_PH (NNOP) | VALID_FLAG | Set by configuration processor to set this bit when this register is written to. |
|  | MISSED_FLAG | Missed flag. |
|  | MISSED-FLAG_CLR | Clear missed flag. |
|  | OFFSET_DELTA_PHA | Offset control register. Offset Phase has a range of (−π, +π) (radians) or (−1/2, ½) (cycles). This register is one-shot phase update. This means that the phase written here will be used one and incorporated into the phase accumulator. This allows the user to input the desired delta phase rather than absolute phase. OFFSET_DELTA_PHASE = (fd/fs) * $2^{12}$ |

17) FIFO De-tagging

The tagging and de-tagging arrangement described herein is the subject of a separate patent application filed concurrently herewith.

Figure 49:
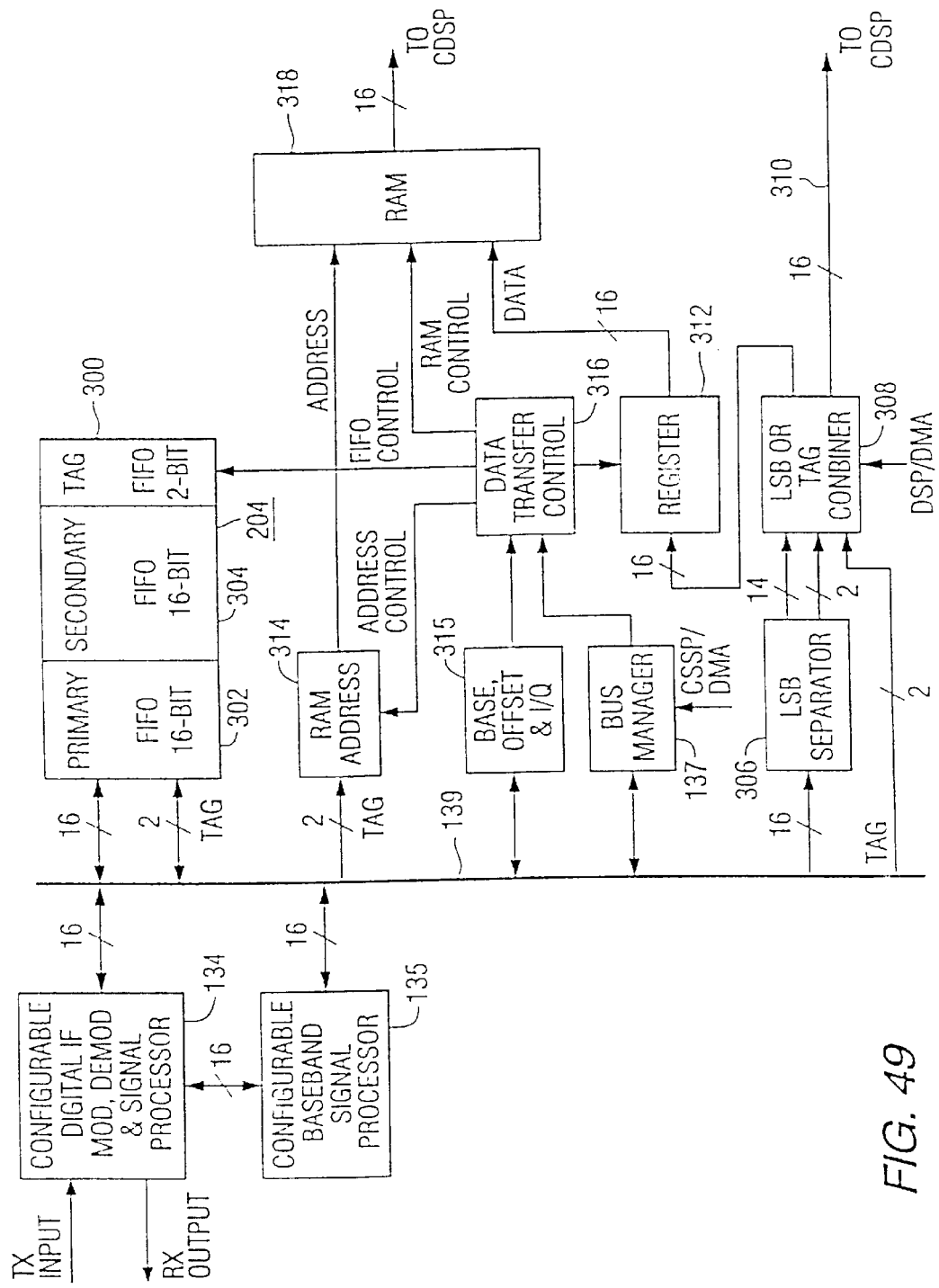
FIG. 49 is a block diagram of FIFO de-tagging arrangement.

A block diagram of the de-tagging operation is illustrated in FIG. 49. The FIFO 204 includes, for example 30×16×2 bit for the storage of complex data in the primary storage 302 and the secondary storage 304 in either cartesian or polar format. The FIFO 204 stores blocks of data on transmit or receive modes for processing by, or processed by, the IF ASIC 24. Signal samples may take the form of one stream or several streams. Samples may also be taken in various forms when processing certain selected waveforms. In order to use an output in more than one form there is a need to identify the source of the signal. It is preferred that the FIFO 204 be of a minimal form such that the FIFO can support several streams of data with a small effective depth, or one data stream with a large effective depth. Hence a single FIFO is used with 2 bit tag bits from storage 300 to identify unique signal data streams. An accompanying DMA function de-multiplexes the data streams into separate memory blocks for further use by a DSP. This allows the single FIFO 204 to be used in a single stream large depth mode or a multi-stream small depth mode.

The FIFO 204 will be accessed through two address locations. The FIFO 204 may also be accessed using the external control lines (FR_N,DIF_IQ and FOE_N). The first address contains the first word of a data pair and the other address contains the second word. Cartesian data is stored real first, imaginary second. Polar data is stored magnitude first and phase second. The order may be reversed in receive mode by enabling a swap bit. Either the second word only or both may be read out. The purpose of the FIFO 204 is to reduce the sample by sample loading on the configuration processor, allowing it to remove samples a block at a time. Samples are source tagged at the output by the FIFO 204. This allows plural simultaneous streams of samples into the FIFO 204. The tagging feature is globally defeatable and when it is defeated, full bit samples in the FIFO 204 will be supported. When the tagging feature is enabled, the value of the tag bits will be programmed by the FIFO 204 based on the source. The FIFO 204 supports four sources (PFIR, resampler, cartesian to polar converter and narrowband NCO) and tag the least significant bits of the data as 00,01,10,11 for SRC0, SRC1, SRC2, and SRC3 correspondingly.

The FIFO 204 provides status interrupts indicating FIFO Full (FF) and Empty FIFO (EF) conditions and provide corresponding external signals. Also, the FIFO 204 provides a programmable depth threshold interrupt and corresponding external signal (FT_N) indicating the FIFO 204 contains the desired quantity of samples. In receive mode, the threshold shall indicate the FIFO depth is greater than or equal to the programmed value. In transmit mode, the threshold shall indicate the FIFO depth is less than the programmed value. A status for the number of valid samples contained within the FIFO 204 is made available to the user for configuration processor loading analysis purposes. Each complex multi bit word is counted as one sample or signal. The FIFO 204 prevents writing upon reaching the full condition. The FIFO 204 prevents reading upon reaching the empty condition. The PFIR_ERROR will indicate a fault condition in receive if the FIFO is full and the next receive sample is attempted to be written to the FIFO. Likewise in transmit, the PFIR_ERROR indicates a fault condition if the FIFO and the data pipeline is empty. The FIFO does not support tagging in transmit.

FIFO bypass consists of a control register and interrupt (IFBYPASS, QFBYPASS ,ISR.FIFO_BYPASS, and IMR.FIFO_BYPASS) that can read data from the backend bus 139 or write data to it as if it were the FIFO. This mode generates interrupts at the backend bus 139 and does not provide handshaking. Subsequently, all interrupts must be serviced immediately for this mode to work properly. To bypass the FIFO, set FIFO_CTLB.SKIP_FIFO and use the IFBYPASS and QFBYPASS registers instead of the FIFO address. In receive mode these registers (IFBYPASS and QFBYPASS) latch data just prior to the FIFO and generate an interrupt after the Q data has been written. Each sample must be read before the next bus sample is written or the data will be overwritten. In transmit mode these registers are read by the bus interface unit (BIU) and generate an interrupt after the Q data has been read. New data must be written before the next sample is needed by the backend bus 139.

FIFO_THRESH is not double buffered so before changing the threshold all FIFO interrupts must be masked in order to prevent spurious generation of interrupts. FIFO_COUNT.COUNT is gray coded for smooth changes in the count. The tag bits are assigned in ascending order by the FIFO_CTLA.ID_MASK_# bit fields. For example:

ID_MASK_1=1==>Tag Value=00
ID_MASK_2=0==>Tag Value=00
ID_MASK_3=1==>Tag Value=01
ID_MASK_4=1==>Tag Value=10

Input of FIFO register 302 is 16 bit real or magnitude samples in transmit and receive, the input to FIFO register 304 is 16 bit imaginary or angular bit samples in transmit and receive, the output of FIFO register 302 is 16 bit real or imaginary magnitude samples in transmit and receive, and the output of FIFO register 304 is 16 bit imaginary or angular samples in transmit and receive.

The transfer of signals and commands over the bus 139 is controlled by the bus manager 137. For the de-tagging operation the 16 bit samples of data are applied to a least significant (LSB) bit separator circuit 306 and are separated into 14 bit most significant (MSB) samples and 2 bit LSB samples, which separated bit samples are applied to a LSB or tag combiner circuit 308. If a DMA command is received by the LSB of tag combiner circuit 308, the two separated 14 bit and 2 bit samples are combined at the output and transmitted to the CDSP 32 and the tag bits are provided on separate lines. If a DSP command is received, the separated 14 bit samples are combined with the 2 tag bit samples from the bus 139 and the new 16 bit combination are outputted to the register 312. The tag bit offset value, the base value and the I/Q status are inputted into the combiner circuit 315.

The 2 bit tag samples are also applied to a RAM address circuit 314. The bus manager 137 activates a data transfer control circuit 316 and the register 312. The data transfer control circuit 316 includes a counter that provides a count that combines with the tag bits to provide a storage address to the RAM 318. The activated register 312 transfers the new 16 bit combination sample (the MSB 14 bit separated sample and LSB 2 bit tag samples) for storage in the RAM 318 along with the tag bits, base and I/Q information from the combiner 315. Thereafter the stored information can be outputted to the CDSP 32 as 16 bit samples. Since the 2 bit tag samples are the LSB samples, the data sample is not degraded in a significant manner.

Figure 61A:
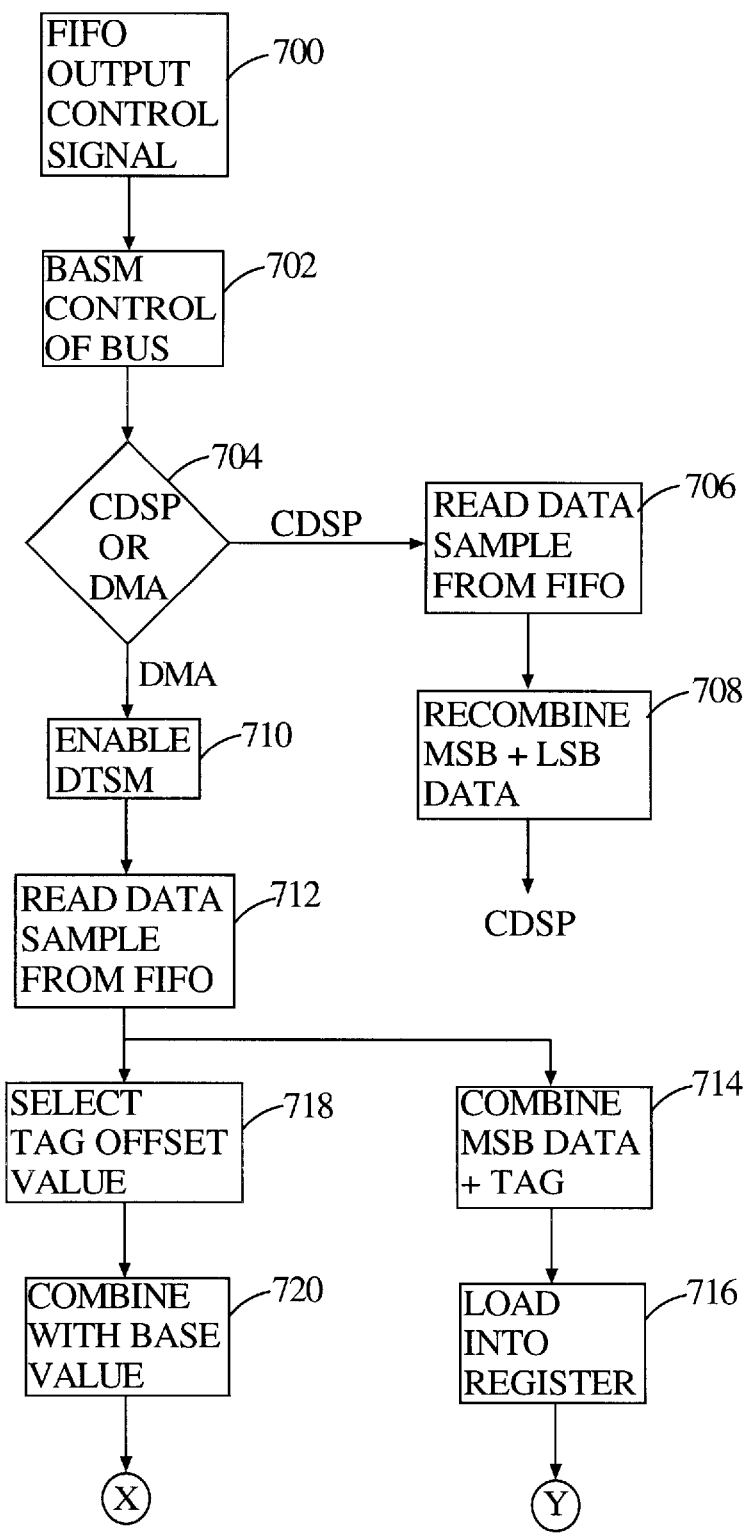
FIGS. 61A and 61B include a flow diagram for explaining the operation of FIG. 49.
Figure 61B:
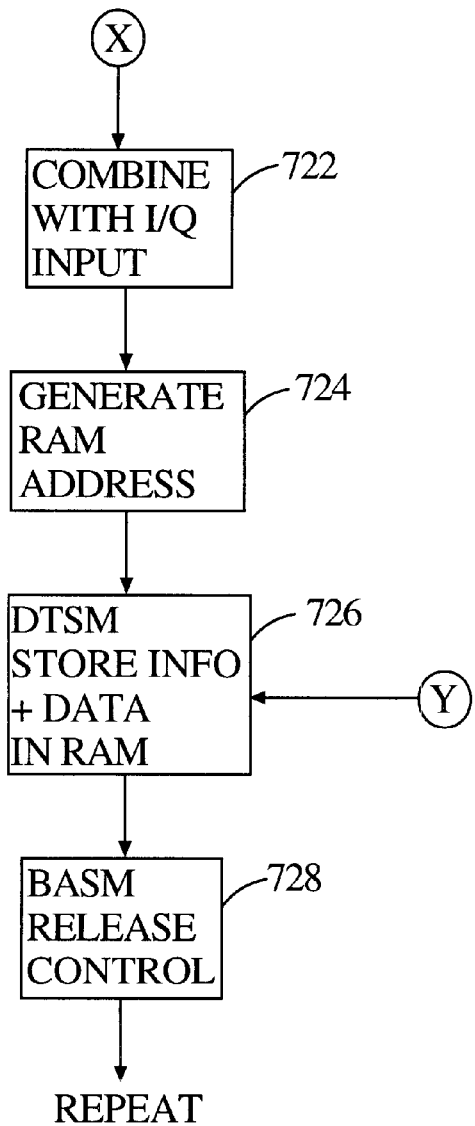

FIGS. 61A and 61B is a flow diagram describing the operation of the FIFO 204 in the tagging and de-tagging concept. In step 700, the FIFO 204 applies a control signal to the bus manager (BASM) 137 which takes control of the bus 139 (step 702). If the system is to operate in the de-tag mode (CDSP), step 704 enables the step 706 to read the data sample is read from the FIFO 204 and recombine the most significant bits (MSB) of data with the two least significant bits (LSB) by step 708 and outputted directly by the combiner 308 to the CDSP 32 via the CFPGA 30.

If the tagged DMA concept is to be employed, the step 704 enables the data transfer control 316 by step 710 to read the data sample from the FIFO 204. In a first branch of the process, the tag bits are combined as LSB bits with the MSB bits of data by the combiner 308 by step 714 and the combination is loaded into register 312 by step 716. In the second branch, steps 718, 720 and 722, the tag offset value (the tag value selects from among the stored OFFSET values) is combined with data base value and I/Q input and applied to the RAM 318 along with the RAM address by step 724. In step 726 the tag, base and I/Q inputs along with the data from the register 312 of step 716 are stored in the RAM 318. In step 728 BASM releases control and the process is repeated.

The arrangement is such that the data in the RAM 318 is now organized by source address assembly blocks. For example memory address assembly blocks 100 to 199 can be dedicated to PRIR output, 200 to 299 can be dedicated to cartesian to polar converter output, 300 to 399 can be dedicated to re-sampler output, etc. Within the source blocks the data samples will be now loaded in time of receipt sequence. Hence, the data can now be read by the CDSP 32 in a more efficient manner. The address in the RAM 318 comprises of some number (BASE), the tag bit, a bit indicating quadrature (I/Q), and some quantity based on the number of each tag received up to the then current time (OFFSET). A size quantity may be used to determine the length of a repeating sequence created by OFFSET. Both size and base may be set by the CDSP to accommodate varying processing requirements. By reordering the quantities provided in the address assembly blocks, even to the point of interleaving their bit-level representation, samples of data may be provide to the CDSP in an arrangement that is optimum for processing.

The configuration commands for the back end FIFO 204 are set forth in Table 12.

TABLE 12

| Register | Command | Description |
| --- | --- | --- |
| FIFO_CTLA (FCTA) | ID_MASK_1 | Receive mode - bit mask to select which signals on the back end bus 139 are to be inputted to the FIFO. A maximum of four bits may be high<br>1 = get data from that block ID.<br>0 = Do not get data.<br>Transmit mode- set all ID mask bits to zero.<br>Both modes- accept data from block ID 1 |
| | ID_MASK_2 | Accepts data from the output of block ID 2 |
| | ID_MASK_3 | Accepts data from the output of block ID3 |
| | ID MASK_#n | Accepts data from the output of block IDn |
| | ID_SWAP_1 | Receive mode - Bit mask to swap I and Q data, block ID 1 |
| | ID_SWAP_1 | Bit mask swap I and Q data (or magnitude and phase) for block ID1. Only used in receive. |
| | ID_SWAP_2 | Swap I and Q data for block ID2. |
| | ID-SWAP_3 | Swap I and Q data for block ID3 |
| | ID_SWAP_#n | Swap I and Q data for block IDn |
| FIFO_CTLB (FCTB) | ID_PULL_1 | Bit mask to which data streams the FIFO should be requesting data in the back end bus (versus observing). Only used in receive. When the cartesian to polar is used in parallel two bits are set. When cartesian to polar is not used in parallel, one bit is set.<br>Pull data for function ID address 1 |
| | ID_PULL_2 | Pull data for function ID address 2 |
| | ID_PULL_3 | Pull data for function ID address 3 |
| | ID-PULL-# | Pull data for function ID address # |
| | TAG_ENDABLE | Enable tags to replace bits in the 2 lsbs of the 16 bit FIFO output word. Used in receive only. |
| | SKIP-FIFO | Normal = 0. Use control registers rather than FIFO for DSP data. I/O (=1) This is intended as an emergency in case the FIFO does not work. |
| | TEST2 | Normal (=0) Disable FIFO input (=1) Used during receive built in selftest to allow use of checksum for checking results without requiring the FIFO to be read to remove test data. |
| | DSP_EN | Enables DSP read/write to FIFO.<br>1 = DSP enabled<br>0 = DMA enable (hardware read and detag mode) |
| PR_FIFO (IFIF) | DATA | Data processed in receive mode and to be processed in transmit mode.<br>Data extracted from/loaded into the FIFO from this address does not increment the FIFO data pointer to the next complex word location. |
| SEC_FIFO (QFIF) | DATA | Data processed in receive modes and data to be process in the transmit mode.<br>Data extracted from/loaded into the FIFO from this address does increment FIFO data pointer to next complex word location. word. |
| FIFO_THRESH (FTH) | THRESHOLD | Number of valid samples to be present in FIFO before and interrupt is generated. |
| FIFO_COUNT (FCNT) | COUNT | Number of valid samples present in FIFO. |

18) Divided Clock Generator

The following are clocking issues the clock may limit the number of PFIR taps that can be used, the interrupt rate may be fast when the re-sampler is used, FCLK is linked to the back end functions it may make the re-sampler request two pieces of data very rapidly possibly before the external DSP processor can service the interrupt and in order to avoid this situation use the FIFO 204 is used as a buffer by making it have a depth greater than 2 samples, and acceleration process operates with FCLK, so if the intent is to optimize the acceleration process the number of FCLK's need to be calculated.

The computational load of the IF ASIC 24 is much lower when the decimation (interpolation) is high. The divided clock circuit 210 of FIG. 15 allows the IF ASIC 24 to operate at lower speeds (and hence lower power) when appropriate. The divided clock circuit 210 is the internal clock divided by CLK_DIV. CLK_DIV is set by the control register 136 CLOCK_DIVIDE.

Any specific configuration needs to be checked to be sure it does not ask any function to process more data than it is capable of. For example, suppose the receive sample clock rate is 1 MSPS, no interpolation is used, and the signal is decimated by 64 (CIC_FACTOR.FCTR) resulting in a PFIR 174 output rate of 60 Ksps. The PFIR 174 would be working at its maximum capacity with 64 clocks per output. If the re-sampler comes next, slightly changing the sample rate re-sampling by 1+/−epsilon and the re-sampler is interpolating the signal slightly, the output coming slightly faster than its input. The input has 64 clocks per sample so the output would have slightly fewer. If the next function were the FIFO 204 then everything would work fine. If however, the next function is the cartesian to polar conversion then there will be a throughput problem. In this case that could be solved by interpolating up front by two, and increasing the CIC_FACTOR.FCTR to 32. This would create more clocks per sample allowing the cartesian to polar converter 206 sufficient time to complete his work.

The configuration commands for the clock are set forth in Table 13.

TABLE 13

| Register | Command | Description |
|---|---|---|
| CLOCK_GEN (CGEN) | CLK-GEN | Clock generation constant. |
|  | TCK#s | Internal clock visible on external pin #. |
|  | FCLK | View internal clock nxphi on external pin. |
| MODE | CLK_DIV | Division factor of clock divider. |

19) Turnaround Acceleration

The flush and queue arrangement described herein is the subject of a separate patent application filed concurrently herewith.

In a duplex type system wherein the system reuses some of the circuits in different configurations, such as when switching between transmit and receive modes and particularly from receive to transmit, there is a need to able reduce the delay in configuring between modes so as to reduce down time (maximize air time) particularly in networking systems and ARQ systems. The largest source of delay are digital filters that have a finite impulse response time, such as FIR filters. When switching out of the configured receive mode, or from a configured receive signal scheme to another receive scheme, a flush process is used. When switching into a configured transmit mode, a queue process is used. The turn around acceleration process, when switching between the receive and transmit modes and visa versa, or between receive modes, increases the data flow rate (in the order of four times) through the circuits that have the largest delay. The data flow rate is increased by applying a higher clock and by inputting zeros to allow the data therein to be processed at an accelerated rate and thereby clear the circuits for quicker reconfiguration with out the lost of data. When changing from the receive mode to the transmit mode, the data in the receiver is outputted at an accelerated rate (flush), the IF ASIC 24 is reconfigured and the data to be transmitted is inputted at an accelerated rate (queue). When switching from one receiver mode to another, the data in the IF ASIC 24 is flushed and then reconfigured. When switching from a transmit mode to a receive mode, the IF ASIC 24 is reconfigured and the data is queued into the IF ASIC.

Figure 16:
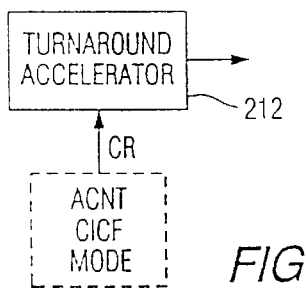
FIG. 16 is a block diagram of the turn around accelerator circuit of the IF subsystem including abbreviated digital control commands for programming the turn around accelerator circuit.
Figure 18:
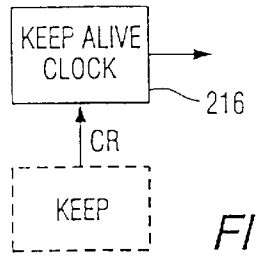
FIG. 18 is a block diagram of the keep alive clock circuit of the IF subsystem including abbreviated digital control commands for programming the keep alive clock circuit.
Figure 17:
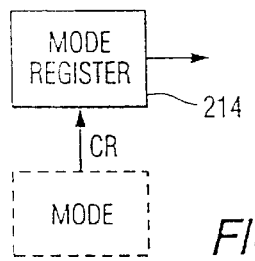
FIG. 17 is a block diagram of the mode registers of the IF subsystem including abbreviated digital control commands for programming the various circuits in the semiconductor chip.
Figure 19:
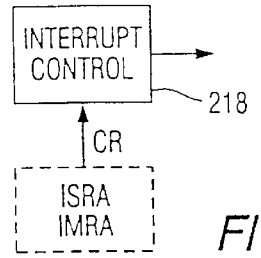
FIG. 19 is a block diagram of the interrupt control circuit of the IF subsystem including abbreviated digital control commands for programming the interrupt control circuit.
Figure 50:
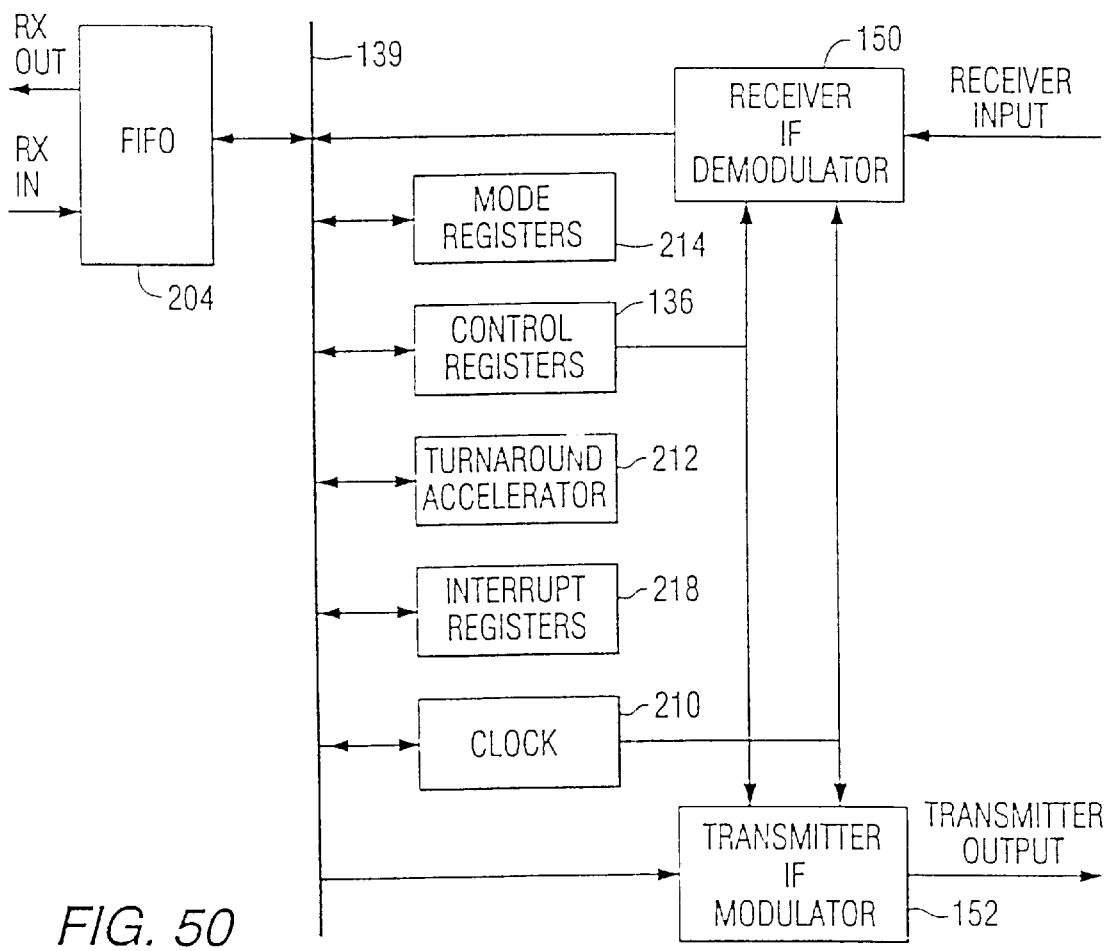
FIG. 50 is a block diagram of the turnaround accelerator and flush and queue arrangement.
Figure 51:
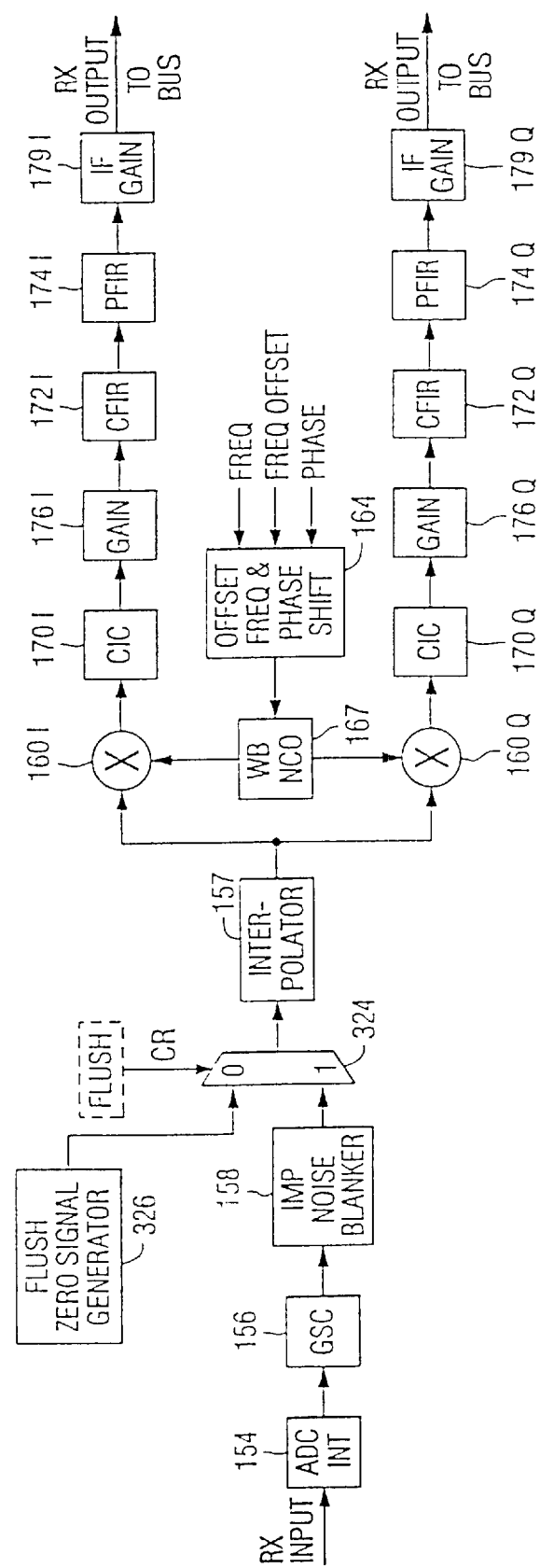
FIG. 51 is a block diagram of the receiver demodulator configuration for use in the flush mode.

The turn around acceleration (queue and flush) 212 of FIGS. 16, 50 and 51 is used to serve two purposes. The first being to buy back some of the time it takes to reconfigure the IF ASIC 24. It takes time to reprogram the IF ASIC 24 registers and initialize the IF ASIC for a given mode. There is a propagation delay inherent in the filtering process which can be used to get back some of the configuration time. The acceleration procedure makes the filters of the IFASIC 24 momentarily run at a higher sample rate allowing input samples to be 'queued' in the tap delay lines of the PFIR and CFIR. Second, if the time when the last amount of useful information is in the receive data path of the IF ASIC 24, then the IF ASIC can process the data at an accelerated rate. The accelerated data output receive mode is called the flush mode. The accelerated data load transmit mode is called the queue mode.

As illustrated in FIG. 50, the FIFO 204 is connected to the bus 139 to transfer receive data out from the configured receive IF demodulator circuit 150 (and the backend baseband processing circuits if so configured [not shown]), and to transfer transmit data into the configured transmit IF modulator circuit 152 (and the backend baseband processing circuits if so configured [not shown]). When switching between the receive and transmit modes, or between receive signaling schemes, the turnaround accelerator 212 in conjunction with the interrupt registers 218, increase the clock rate applied by the clock to the receive IF demodulator to allow flush process to take place before the control registers 136 reconfigure the receive IF demodulator circuit 150 (and baseband processing circuits if configured). In addition, the combination of the turnaround accelerator 212 and interrupt registers 218 allow the queue process to take place before the control registers 136 reconfigure the transmit IF modulator circuit 152 (and baseband processing circuits if so configured).

FIG. 51 includes a block diagram of a configured receive IF demodulator circuit 150 with a flush gate 324 inserted between the impulse noise blanker 158 and the interpolator 157. Under normal operations, the digital signals from the impulse noise blanker 158 flow to the interpolator circuit 157. However when the turnaround accelerator 212 is in the flush mode of operation, the flush command is applied to the flush gate 324 enabling the gate to pass 0 bit signals from the flush zero signal generator 326 to fill the following circuits with 0 bits during the applied accelerated clock rate, For flush the acceleration count register to the appropriate count value. Assuming that half programmable filter has valid samples the count is $(11+L/2)*(L+1)/R$; where L is PFIR filter length, and R is the resampler ratio. The CIC_

ACCEL_FACTOR is also set such that there are sufficient internal clocks. Both of these parameters are written as part of the configuration for this acceleration mode and do not need to be changed. A suggestion is that they would be part of the data written during mode lock. The acceleration bit is set to begin the acceleration process. An interrupt is generated by the interrupt register 218 to indicate completion of acceleration. After the interrupt is generated the IF ASIC 24 will return to normal operation.

Receive mode acceleration procedure (FLUSH):

Update the ACCEL_COUNT register.

Wait for interrupt (ISR.ACCEL) to indicate that acceleration process is finished, valid transmit samples could be requested from the FIFO 104 so the ISR.FIFO_EMPTY may interrupt before the ISR.ACCEL bit.

Reset the MODE.ACCELLERATION bit.

Re-enable the IMR.PFIR_ERROR bit.

The configuration commands for the turn around accelerator 212 are set forth in Table 14.

TABLE 14

| Register | Command | Description |
| --- | --- | --- |
| ACCEL_COUNT (ACNT) | ACCEL_COUNT | The number of fast clocks during the acceleration period. The acceleration count is (Modulo 4) − 1 |
| CIC_FACTOR (CICF) | ACCEL_FCTR | Decimation and interpolation factor for the CIC in acceleration mode.<br>00 = factor of 8 (minimum decimation/maximum interpolation acceleration)<br>01 = factor of 8<br>10 = factor of 16<br>11 = factor of 32 |
| MODE | ACCELERATION | Controls flushing the receive signal path.<br>0 = normal receive<br>1 = start acceleration mode |

Set the CIC_ACCEL_FACTOR to the appropriate acceleration value

Set MODE.ACCELERATION bit

Wait for interrupt (ISR.ACCEL) to indicate that acceleration process is finished, valid receive samples will be put into the FIFO 204 so the ISR.FIFO_THRSH interrupt may interrupt before the ISR.ACCEL bit.

Reset the MODE.ACCELLERATION bit. (The IF ASIC 24 will automatically return to normal operation upon completion)

To start transmit mode, or to change the CIC_SHFT value, or CIC_FCTR in transmit mode, the IF ASIC 24 must execute the acceleration mode in order to properly clear the circuits. CIC_ACCEL_FACTOR and ACCEL_COUNT need to be set prior to setting the acceleration bit. This can be used simply to clear the chip using a small ACCEL_COUNT. It can also be used to rapidly push data up to the CIC interpolator. Normally full length filter delays are used for queuing. The acceleration count is 2*(11+L/2)*(L+1)/R.

The CIC filter is has a CIC FIFO that feeds an integrator. If the CIC FIFO is not cleared prior to starting acceleration, the integrator will overflow which results in wideband noise to be generated. The fix is to insure that the data path into the CIC is zero prior to starting acceleration. One way of doing clearing the CIC FIFO is to run acceleration twice. The first time is used to clear the CIC FIFO and the second time is the real acceleration process. If the PFIR gain mantissa is set to zero this will insure that the input to the CFIR will be clear.

Transmit mode preparation acceleration procedure (QUEUE):

Mask the IMR.PFIR_ERROR bit to prevent spurious interrupts.

Configure the chip for transmit mode.

Fill the FIFO buffer with valid samples so the FIFO 204 will not be empty prior to queuing the IF ASIC 24.

Set MODE.ACCELERATION bit

20) Power Up

In the power up procedure, the IF ASIC 24 hardware reset sets the MODE.RESET_CLK and the MODE.RESET_CORE registers. Both the FCLK and CLK have clocks on them during power-up and reset. The CGEN register should be written to after power up.

The IF ASIC 24 is powered up in the following order:

Clear LOCK.MODE_LOCK and LOCK.CONFIG_LOCK.

Set MODE.RESET_CLK and set MODE.RESET_CORE (or a hardware reset)

Wait at least 2 sample clocks Remove the MODE.RESET_CLK bit.

Load a configuration file

Clear MODE.RFSET_CORE.

With regard to the mode register 214 operation, there is an internal clock generated by the IF ASIC 24 that runs at 4x the rate of the sample clock. This 4x clock is called the nxphi clock.

RESET_CLK synchronizes the clock generator. Specifically, it forces the clock generator into normal mode (as opposed to acceleration mode), and holds the clock multiplier counter and clock divider counters at their load points. When the reset is released the clock generator starts at a known state. It is important to release RESET_CLK after setting the clock control register (CLOCK_GEN). The RESET_CLK signal synchronizes internal sync signals (ssync and isync) that delineate sample boundaries. Internally, there are several (typically 4 but up to 16) clocks per sample so a sync pulse is required to demark them.

Once the RESET_CLK has been released the RESET_CORE internal signal will start being effective (now that the chip 10 has a reliable clock). The RESET_CORE signal should be held for at least 100 sample clocks allow all blocks to clear. Specifically, this reset clears the phase accumulator, forces narrowband data in the mixer to zero and starts a narrowband mix cycle, resets the address generator for the impulse blanker delay memory, and resets feedback paths inside the impulse blank engine. In the CIC, it clears the integrators, forces zeros in the comb stage, and initializes the decimation (interpolation) counter. In the CFIR, it initializes the data delay line and coefficient counters. The same for the PFIR. In the backend bus 139, it initializes all bus interface unit state machines and the bus time slot counter. In the re-sampler 202. the control gets reset as well as the memory address generator. In the cordic reset, it initialize control logic and clears the recirculating data path. In the FIFO 204, it reset sets the FIFO addresses to zero, and clears the control logic. In summary, reset initializes all control logic and clears recirculating data paths.

The configuration commands for the mode registers 214 are set forth in Table 15.

TABLE 15

| Register | Command | Description |
| --- | --- | --- |
| MODE | MODE | Selects receive or transmit. |
|  | RESET_CORE | Resets signal processing logic. |
|  | RESET_CLK | Resets clock generator. |

21) Keep Alive Clock

The IF ASIC 24 includes the keep alive clock 216 to maintain internal memory states during power down modes. Also, upon detection of loss of sample clock the keep alive clock shall take over maintenance of internal memory states.

The configuration commands for the keep alive clock 216 are set forth in Table 16.

TABLE 16

| Register | Command | Description |
| --- | --- | --- |
| KEEP_ALIVE (KEEP) | POWER DOWN | Power down mode. |
|  | KA_STATUS | Keep alive status. |

22) Interrupt Control

Figure 52:
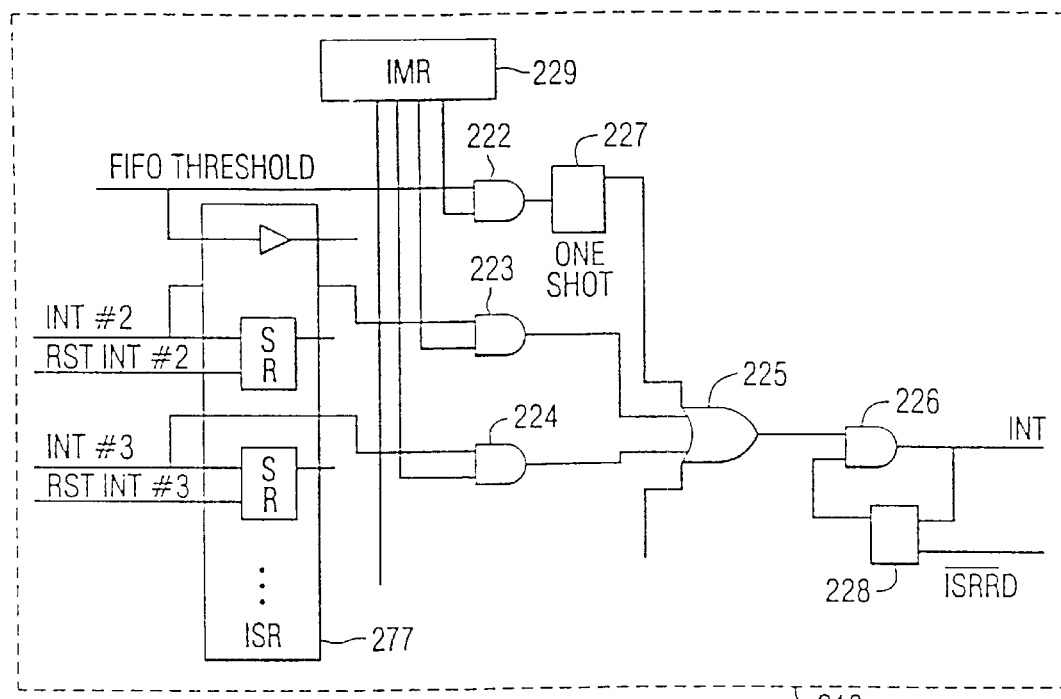
FIG. 52 is a block diagram of an interrupt service functional block diagram.

The interrupt circuit control circuit 218 of FIG. 52 includes a status register 277, an IMR circuit 229, the gates 222–226, the one shot 227 and the control circuit 228. Each time the interrupt status register (ISR) 277 is read, it will arm the interrupt circuit to issue one and only one interrupt pulse when an interrupt source becomes active. Non-persistent interrupts will be held by the ISR 277 so that the software can be aware that they occurred even though the condition has been removed. All are non-persistent interrupts except FIFO Threshold. The FIFO Threshold interrupt, however, is persistent and reading this bit in the ISR 277 is to read the actual state of this flag. Only one interrupt is issued even though several sources may have become active between the time the interrupt was issued and the time the ISR 277 is read. The interrupt service function is then responsible for servicing all the sources indicated in the ISR 277 because no further interrupts will be issued for the old interrupts. To reactivate the interrupts the ISR 277 must be reset by writing ones into the ISR 277 at the active locations. Only the recognized interrupts should be reset. The FIFO Threshold interrupt will be issued only when the condition becomes active, it will not be reissued as the FIFO 204 continues to increment beyond the threshold, nor will it be reissued when the FIFO 204 is read but the condition is still active after read. It is responsibility of the software to read the FIFO 204 at least until the condition becomes inactive. There is a likely situation where the software has already cleared the FIFO Threshold condition before responding to the interrupt issued by it. In this case the interrupt service function may read an ISR 277 with no active bits. The IF ASIC 24 hardware is such that all interrupt sources are either reflected in the in the current read of the ISR or issue an interrupt after that read.

The configuration commands for the interrupt circuit control circuit 218 are set forth in Table 17.

TABLE 17

| Register | Command | Description |
| --- | --- | --- |
| ISR (ISRA) | NNCO | Interrupt uses NUSED signal to indicate when to update NNCO at its sample rate. |
|  | RESAMPLER | Interrupt uses RUSED signal to indicate when to update re-sampler at its output sample rate. |
|  | PFIR_FIFO_ERROR | PFIR overflow or underflow. |
|  | ACCEL | Acceleration status. |
|  | FIFO_FULL (FF) | FIFO full status. |
|  | FIFO_EMPTY (FE) | FIFO empty status. |
|  | FIFO_THRESH (FT) | FIFO programmed threshold reached. |
|  | FIFO_BYPASS (FB) | Interrupt is used with MODE.SKIP_FIFO, new data written or read from internal bus. |
|  | FIFO_THRESH_LEVE | FIFO threshold level indicates number of beyond FIFO threshold. |
| IMR (IMRA) | NNCO | NNCO NUSED interrupt mask. |
|  | RESAMPLER | RESAMPLER RUSED interrupt mask. |
|  | PFIR_FIFO_ERROR | PFIR overflow or underflow. |
|  | ACCEL | Flush status. |
|  | FIFO_FULL (FF) | FIFO full status. |
|  | FIFO_EMPTY (FE) | FIFO empty status. |
|  | FIFO_THRESH (FT) | FIFO programmed threshold reached. |
|  | FIFO_BYPASS (FB) | Interrupt used with MODE.SKIP_FIFO, new data read or written from internal bus. |
|  | TEST | Controls saw tooth generator for test signal. |

23) IF ASIC Configuration Process

Figure 53:
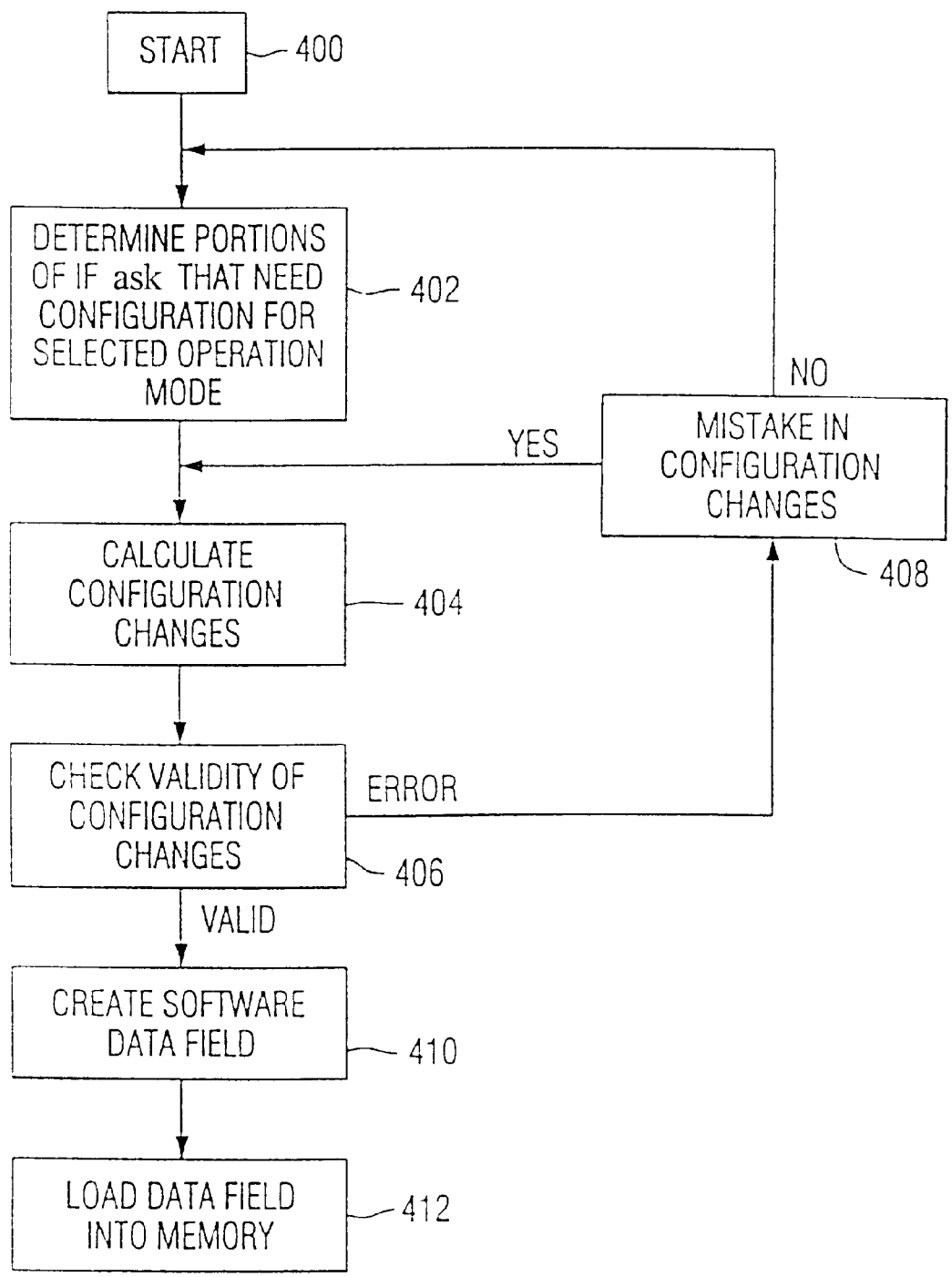
FIG. 53 is a process for calculating the configuration changes to be make in the IF ASIC, checking the changes, and loading the changes into memory.

As illustrated in FIG. 53, the configuration process for the IF ASIC configuration commands commences with a start step 400 and a determination is made step 402 of the portions of the IF ASIC 24 that need what configuration for the selected mode of operation. Thereafter in step 404 the configurations changes are calculated. Step 406 tests the validity of the configuration changes for the selected mode of operation and if an error is found, the type of mistake is determined by step 408. If the error is in the configuration changes, the changes are recalculated by step 404. If the error is in step 402, the calculations of step 402 is repeated. The process is repeated until a valid designation is made by step 406 wherein a software data field is created in step 410 and loaded into memory 14 by step 412.

Figure 54A:
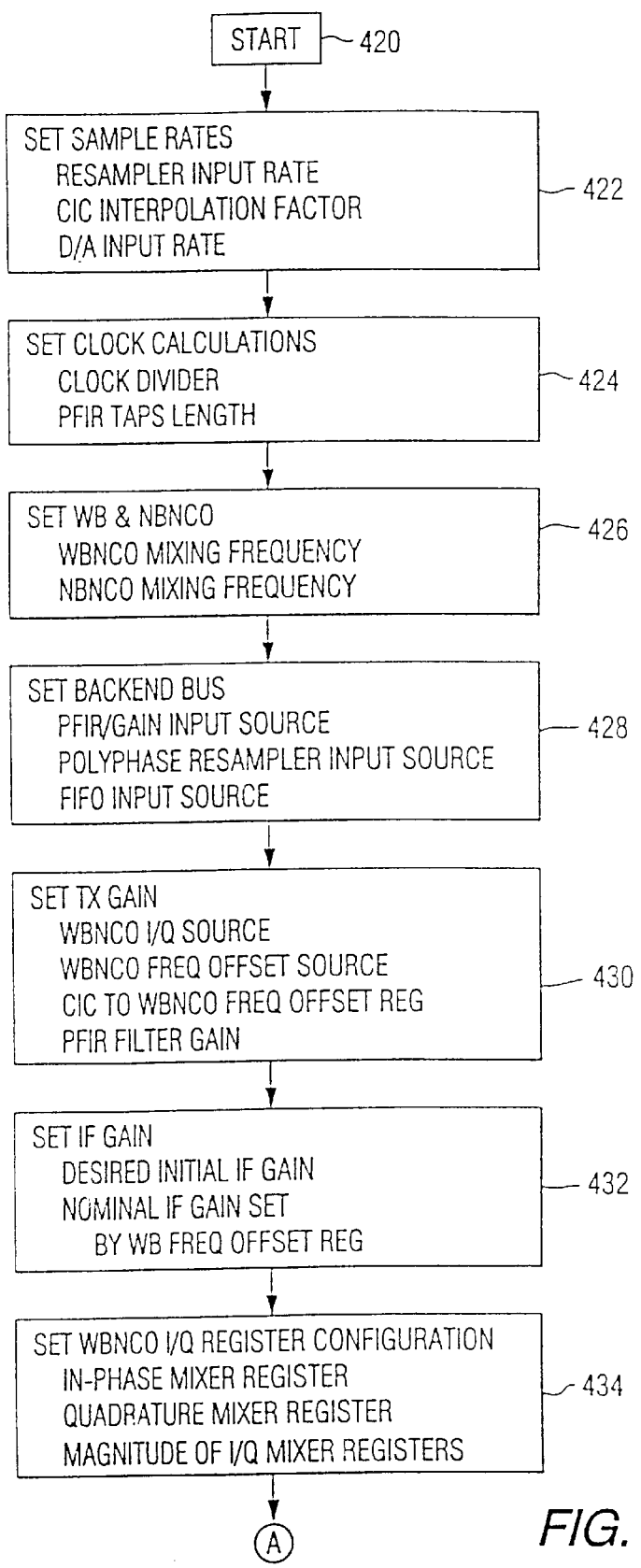
FIGS. 54A and 54B include an expanded process for the selecting configuration changes steps of FIG. 53.
Figure 54B:
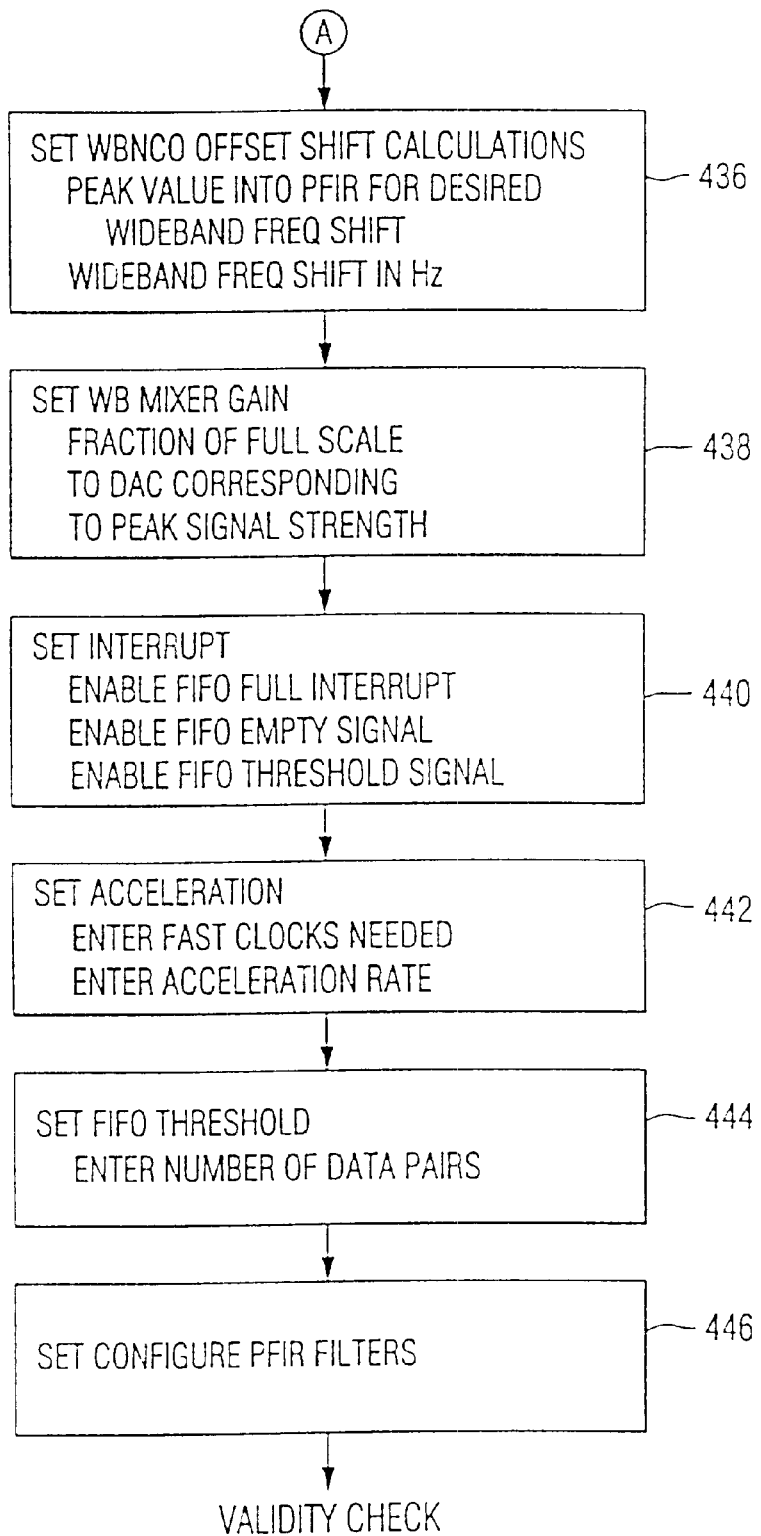

In the process of FIGS. 54A and 54B the calculate configuration changes step 402 of FIG. 53 is expanded to include a transmit configuration for a 20K Wideband FSK transmitter. For the purpose of simplifying the explanation of the calculate configuration change step 404, FIGS. 54A and 54B do not include any validity check steps, however, validity checks can be made at end of any step, or any sub-step within the steps. The process commences at the start step 420, with the set sample rates step 422 (including resampler input rate, CIC interpolation rate and digital to analog input rate), followed by a set clock calculations step 424 (clock divider and PRIR tap length), a set wideband and narrowband NCO step 426 (WBNCO mixing frequency and NBNCO mixing frequency), set backend bus step 428 (PFIR gain input source, polyphase resampler input source and FIFO input source), set transmitter gain step 430 (WBNCO I/Q source, WBNCO frequency offset source, CIC to WBNCO frequency offset register, and PFIR filter gain), a set IF gain step 432 (desired initial IF gain, nominal IF gain set by wideband frequency offset register), a set wideband NCO I/Q register configuration step 434 (in-phase mixer register, quadrature mixer register mixer register, and magnitude of I/Q mixer registers), a set wideband NCO offset shift calculations step 436 (peak value into PFIR for desired wideband frequency shift, and wideband frequency shift in Hz), a set wideband mixer gain step 438 (fraction of full scale gain to DAC corresponding to peak signal strength), a set interrupt step 440 (enable FIFO full interrupt, enable FIFO empty signal, and enable FIFO threshold signal), a set acceleration step 442 (enter fast clocks needed, and enter acceleration rate), set FIFO threshold step 444 (enter the number of data pairs), and set configuration PFIR filters step 446. Table 1 includes, in the configuration value columns (decimal and HEX), a listing of the results of the process of FIGS. 54A and 54B for the 20K wideband FSK transmitter configuration.

24) FM Receiver

Figure 55A:
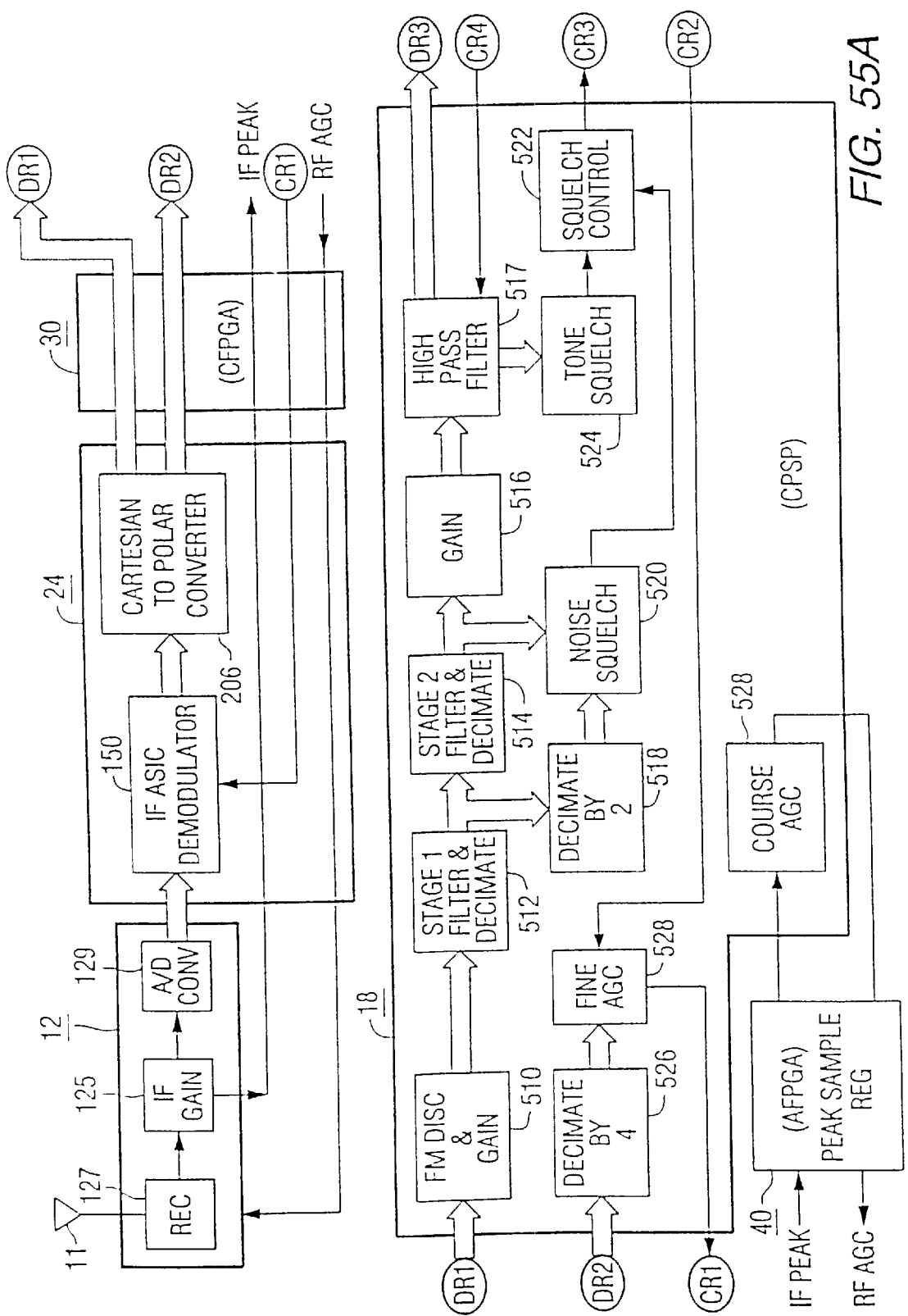
FIGS. 55A and 55B include a block diagram of the field programmable radio frequency communications system configured as a FM voice transmitter.
Figure 55B:
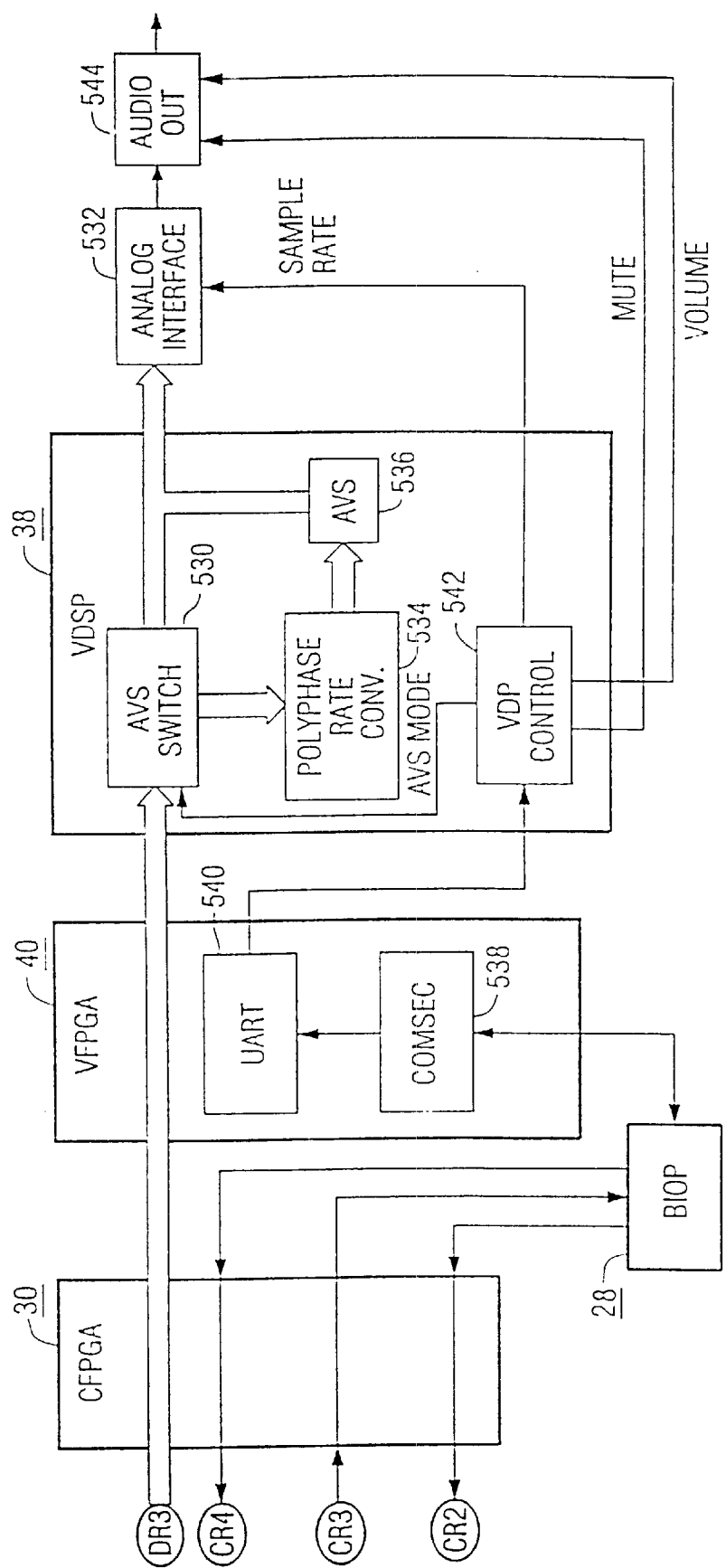

In the FM receiver mode of operation of the radio frequency communications system 10 of FIGS. 55A and 55B the signals received by the antenna 11 are processed by the receiver portion of the radio frequency subsystem 12, including the receiver 127 (including a down converter to IF frequencies), an IF gain circuit 125, and applied as multi bit signals to the configured receiver demodulator circuit 150 of the IF ASIC 24 by an A/D converter circuit 129. The configured demodulator circuit 150, and the baseband digital signal processing circuits, including the cartesian to polar converter 106 are configured to operate in the FM mode. The IF frequency is synthesized by the wide band NCO 164. The wide band NCO 164 generates a cosine and sine wave with the center frequency set during initialization, and the result of the multiplication in the mixers 160I and 160Q yield the complex base band FM signal. In the up and down sampler and filter circuits 169, the signals are initially down sampled and filtered and pre-distortion and gain adjustment is needed to normalize the passband region and the PRIR is responsible for bandwidth wherein the tap values are set at initialization wherein the bandwidth is approximately 2*(fd+fm) where fd is the FM frequency deviation and fm is the highest modulated frequency. The configuration commands are PROG_FLT_DATA and PROG_FLT_CTL. IF gain scale control 170 is used to ensure sufficient amplitude is inputted into the cartesian to polar converter 206. The cartesian to polar converter 206 extracts the phase of the FM signal and outputs the digital signal via the FIFO 204 and interface 138. The FIFO 204 receives base band magnitude data in the primary FIFO and angle information in the secondary FIFO. If the number of samples in the FIFO is greater than or equal to the FIFO_THRESH value then the FIFO Threshold (FT_N) interrupt will be generated.

The data samples are outputted from the IF ASIC on lines DR1 and DR2 and are routed by the CFPGA 30 to the CDSP 18 which was pre-programmed for the FM receiver mode of operation. The data inputs are divided into two paths. The first path provides for signal demodulation and includes the FM discriminator and gain circuit 510, stage filter and decimate circuit 512 and 514, the gain circuit 516 and the high pass circuit 518 of an output at line DR3. The output of the stage filter and decimate circuit 512 is also applied to a decimate by 2 circuit 518. The tone squelch circuit 524 receives data signals from the low pass filter 517. The noise squelch circuit 522 receives data signals from the stage 2 filter and decimate circuit 520 and the output from the decimate by 2 circuit 518. The squelch control circuit 522 receives output signals from the noise squelch circuit 520 and the tone squelch circuit 524 to provide an output on line CR3. The other path provides a control loop for the IF gain control circuit 179 in the configured demodulator circuit 150 and includes a decimate by 4 circuit 526 providing an output to the fine AGC circuit 528. The other input to the fine AGC circuit 528 is from line CR2 from the BIOP 28 via the CFPGA 30. The output of the fine AGC circuit 528 is applied to the configured demodulator circuit 150 via the CFPGA the line CR1. IF peak signals from the IF gain 125 are applied to the course AGC circuit via the IF ASIC 24 and the CFPGA 30 to the AFPGA 40 to provide an RF AGC output to the receiver circuit 127. A control signal is applied to the high pass filter 517 from the BIOP 28 via the CFPGA 30.

Referring now to FIG. 55B, the signals on line DR3 are translated via CFPGA 30 and VFPGA 40 to the AVS switch in the VDSP 530. The output from the switch flows either directly to the analog interface circuit 532 or via the polyphase rate converter 534 and the AVS circuit 536. The BIOP 28 communicates with the comsec 538 and via the UART 540 to the VDP control circuit 542 which provides the sample rate signals to the analog interface 532 and the mute and volume signals to the audio out circuit.

25) FM Transmitter

Figure 56A:
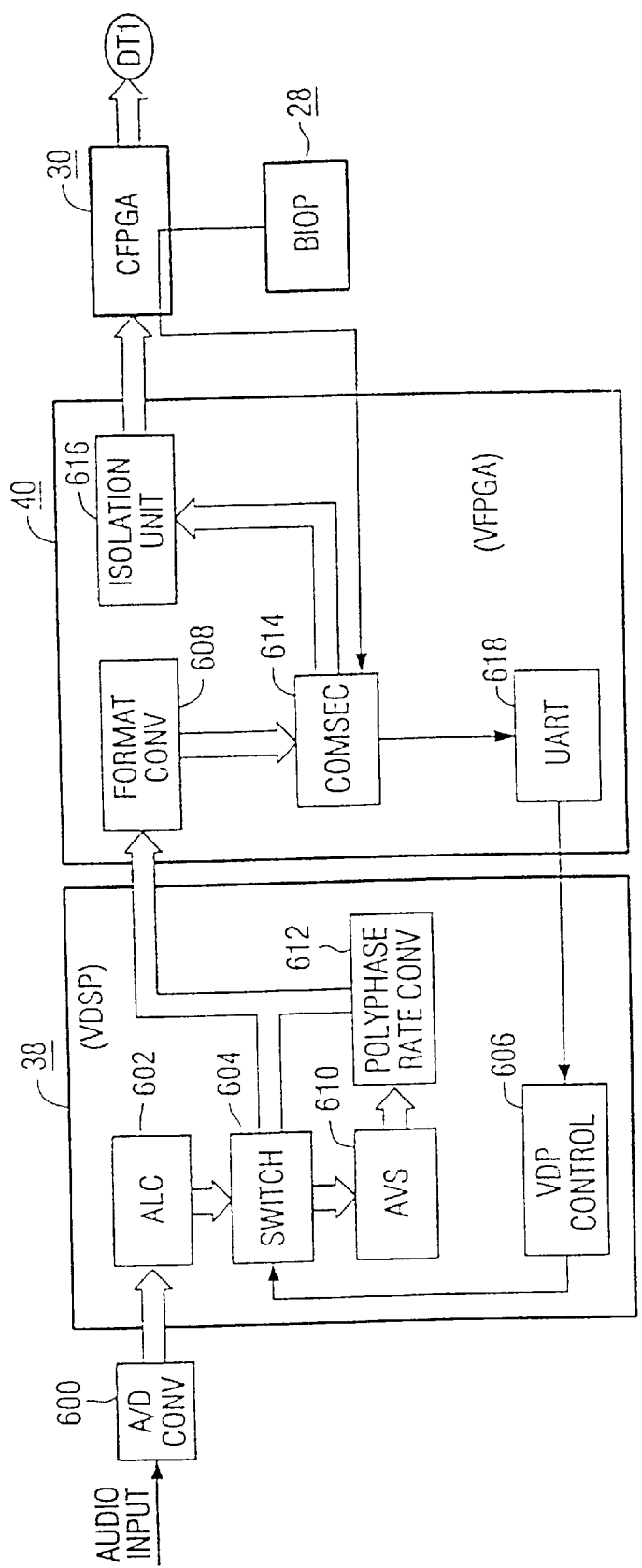
FIGS. 56A and 56B include a block diagram of the field programmable radio frequency communications system configured as a FM voice receiver.
Figure 56B:
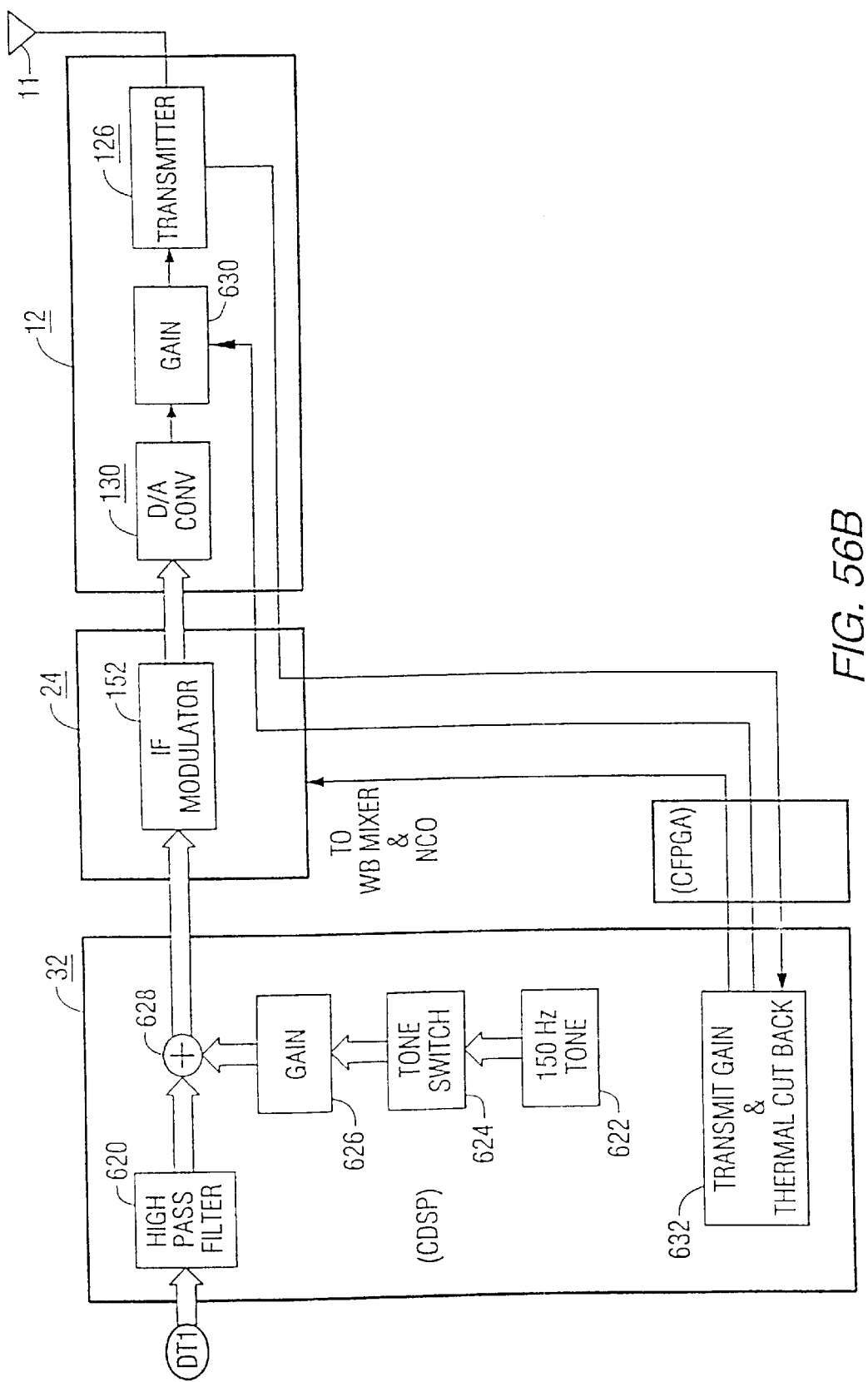

In the FM transmitter mode of operation of the radio frequency communications system 10 illustrated in FIGS. 56A and 56B, analog input signals are applied by an A/D converter as multi bit signals to an ALC circuit 602 in the VDSP 38, which in turn applies the signals to the switch 604. Under the VDP control 606 (which controls the switch 604) the signals are applied directly to a format converter 608 in the VFPGA 40, or through the AVS circuit 610 and polyphase rate converter 612. The output of the format converter 608 is applied to the COMSEC 614 to the isolation unit 616. The COMSEC 614 is under the control of the BIOP 28. Control information is also applied via the UART 618 to the VDP control 606.

The output on line DT1 from the CFPGA 30 is applied to a high pass filter 620 in the CDSP 32. The output from the high pass filter 620 is summed by the summer 628 with a 150 Hz tone signal from tone generator 622 via a tone switch 624 and a gain circuit 626. The output from the summer 628 is applied to the configurable IF modulator circuit 152 configured in the FM transmit mode as illustrated in FIG. 13. The PFIR is responsible for the band width of the base band signal, and provide the up and down sampling filtering functions and pre-distortion and gain adjustments are made to normalize the passband. The wide band NCO generates a cosine wave with a center frequency and phase set during initial configuration. The offset frequency is the up sampled formatted transmit voice signal resulting in the desired FM signal.

The FIFO 204 accepts the base band digital signals into the primary FIFO. If the number of samples in the FIFO is less than or equal to the FIFO_THRESH value, then the FIFO Threshold (FT_N) interrupt is generated. The frequency deviation is set by measuring the gain prior to the wideband NCO. The following is the general formula for setting the frequency deviation is:

$$fd = (Ginput*Gif*Gpfir*Gefir*Geie*Goffset\_shift)*fs$$

where Ginput is the signal gain of the input waveform, Gif is the If scale factor, Gpfir is the gain of the PFIR, Gefir is the gain of the CFIR, Geie is the gain of the CIC and Goffset_shift is the shift between the real part of the CIC and the wideband NCO.

The center frequency is set by writing to the WNCO_CNTR_FREQ_M/S. The following is the formula for the wideband NCO center frequency and offset frequency: fcarrier=fsample_rate*0.5*(nearest_intergerWNCO_CNTR_FREQ_M/S/2 to 27 power)

The output of the configured modulator circuit 152 is applied to the radio frequency sub-system 12 digital to analog converter 130 and via the gain control 630 to the transmitter 126 where it is up converted to the RF output frequency. Transmitter feedback is applied to transmit gain and thermal cut back circuit 632 which has an output to the wideband mixer and NCO and an output to the gain circuit 630.

26) Single Sideband AME and A3E Receiver

Figure 57C:
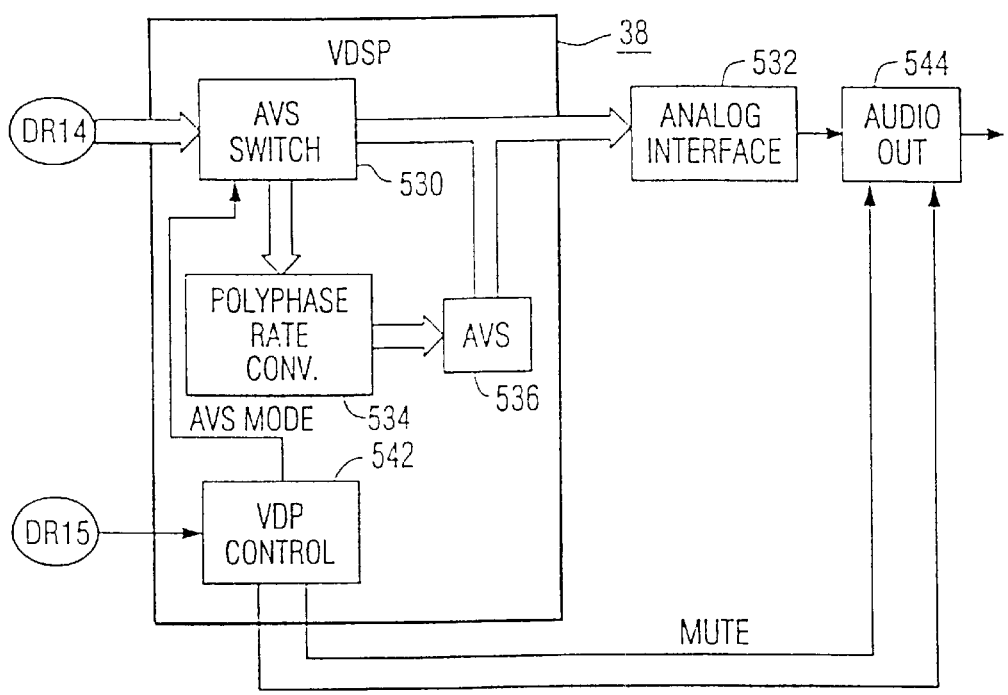
FIGS. 57A, 57B and 57C include a block diagram of the field programmable radio frequency communications system configured in a receiver mode for single sideband, AME and A3E signaling schemes.
Figure 57A:
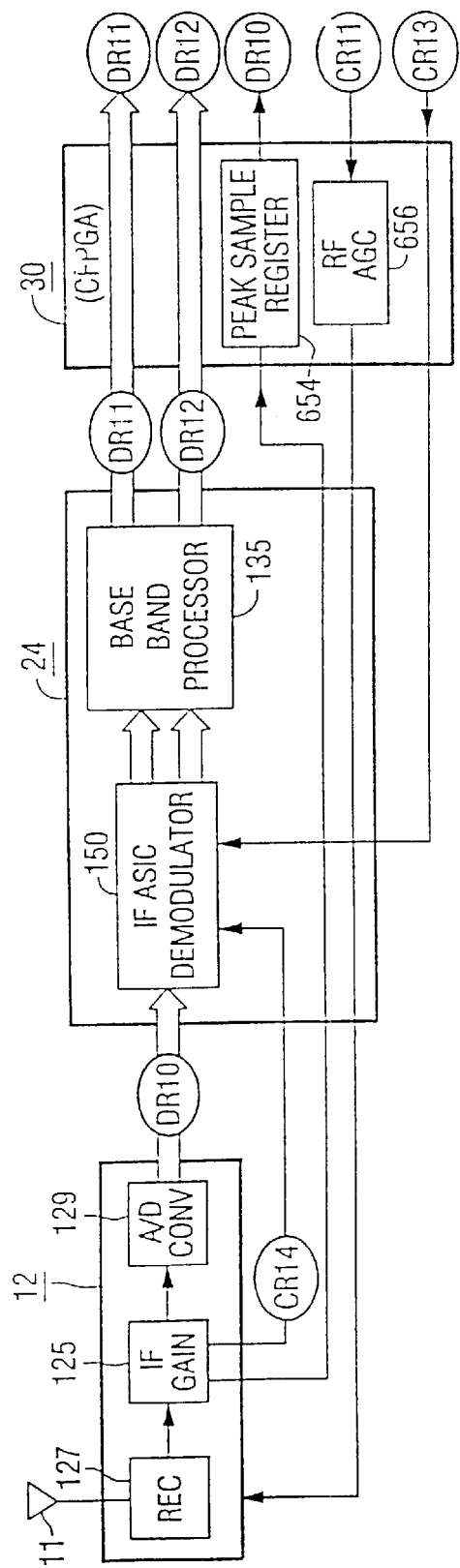
Figure 57B:
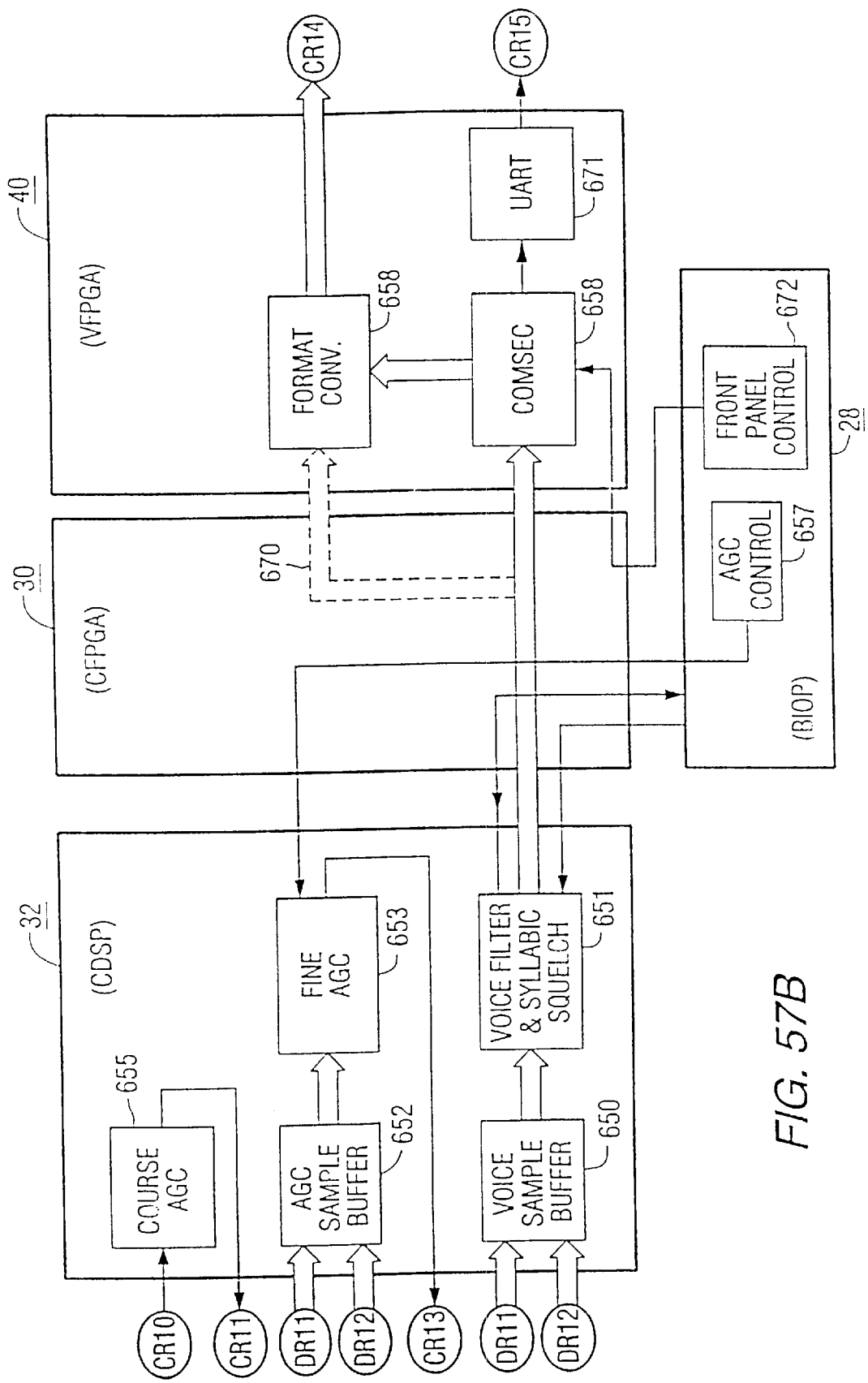

The signal flow for SSB, AME and A3E (including H3E, large carrier upper sideband, single channel, analog telephony and J3E, suppressed carrier single sideband, single channel, analog telephony) is illustrated in FIGS. 57A, 57B and 57C (AME and A3E will be received as SSB signal because this results in less distortion of the signal than envelope detection, and AME and A3E is the upper sideband signal).

In the single sideband (SSB), AME and A3E receiver mode of operation of the radio frequency communications system 10 of FIGS. 57A, 57B and 57C the signals received by the antenna 11 are processed by the receiver portion of the radio frequency sub-system 12, including the receiver 127 (having a down converter to IF frequencies), an IF gain circuit 125 and applied via line DR10 as multi bit digital signals or samples to the configured receiver demodulator circuit 150 of the IF ASIC 24 via an A/D converter circuit 129. The IF ASIC centers the baseband frequency at the IF frequency to isolate the sideband of interest. The multi bit digital signals are filtered and decimated and the narrowband NCO is used to return the sideband to it's original position (USB/LSB). The CDSP 32 performs several processes with the I and Q multi bit digital signals, including syllabic squelch and automatic gain control. Multi bit voice samples are sent to the VDSP 38. There are two receive signal streams maintained between the IF ASIC 24 and the CDSP at any one time. The paths are based on the type of data (real or magnitude), voice as complex data and AGC as magnitude data.

Figure 59:
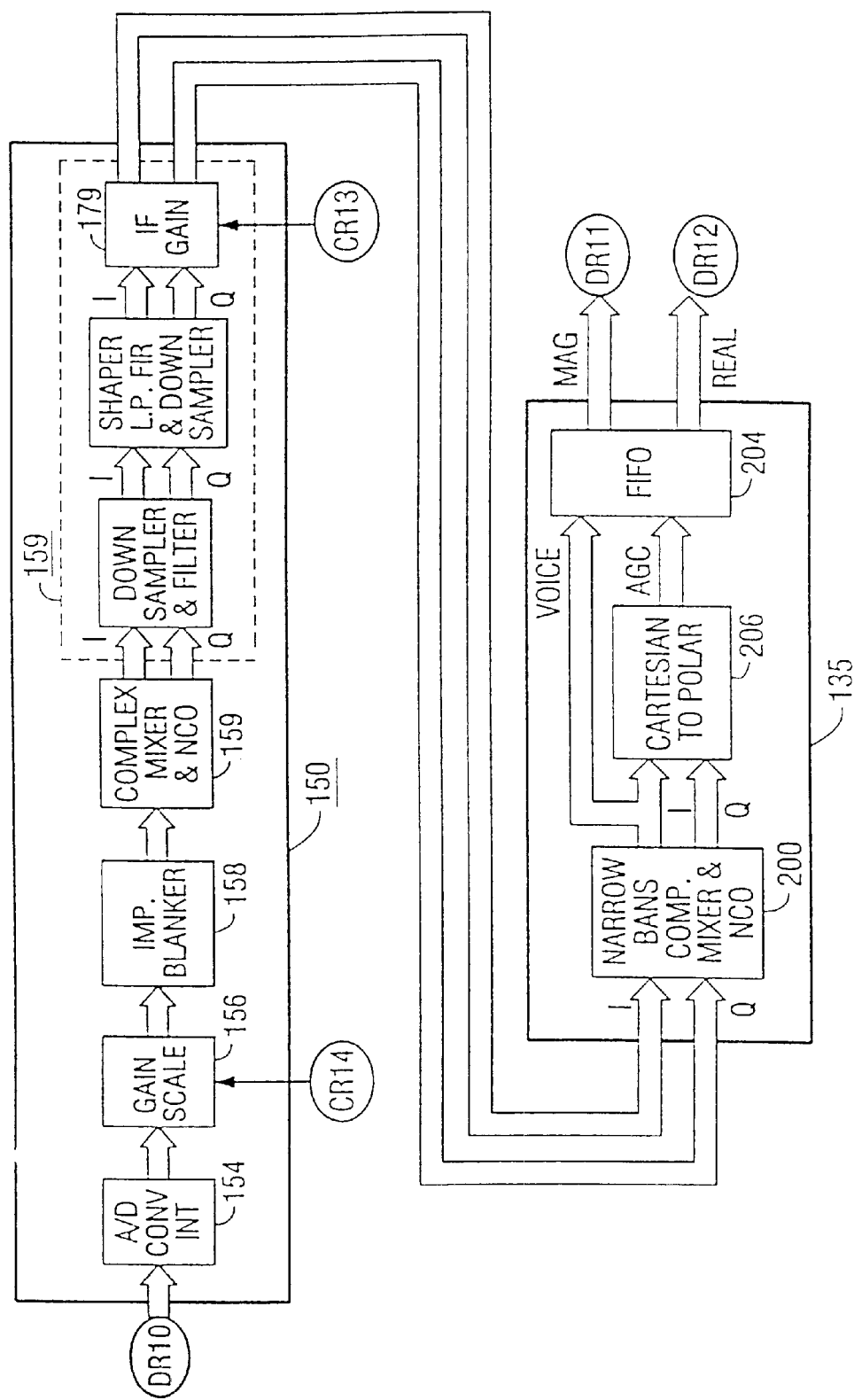
FIG. 59 includes a block diagram of the IF subsystem configured to function with the receiver block diagrams of FIGS. 57A, 57B and 57C.

The receivers of FIGS. 57A, 57B and 59 are configured as follows:

Load VSDP software configuration
Load CFPGA configuration into the CFPGA
Load AFPGA configuration into ADSP
Load CDSP software configuration into CDSP
Load IF ASIC configuration into CDSP
Initiate load for VDSP software configuration
Load ADSP software configuration The configuration of the IF ASIC 24 is illustrated in greater detail in the block diagram of FIG. 59. The configured demodulator circuit 159 and the base band signal processor 135 are configured to operate in any of the SSB, AME and A3E modes. The IF frequency is synthesized by the wide band NCO 164. There are two simultaneous paths are maintained through the IF ASIC 24 based on the output data types (AGC and voice). The multi bit digital signals are applied to the wideband mixer and NCO 159 via the A/D converter interface 154, gain scale 156 and impulse noise blanker 158. The gain scale 156 receives an input signal from the IF gain circuit 125 via line CR14. For SSB, the wideband frequency is equal to the desired IF frequency plus the sideband offset frequency and the result is centered on the desired SSB signal. For A3E, the wideband frequency is equal to the desired IF frequency and the result is centered on the carrier. Because a CIC filter is used, a pre-distortion and gain adjustment are used to normalize the passband. The PFIR filter is responsible for the bandwidth of the baseband signals. The output of the IF gain 179 is applied to the narrowband NCO 200, which converts the signal centered at 0 Hz and moves the signal back to the desired sideband frequency. In A3E, the narrowband NCO frequency is set to zero. The output from the narrowband mixer and NCO 200 is applied to the cartesian to polar converter 206, to convert the I and Q samples into magnitude and phase. The magnitude signals are placed into the FIFO 204 for use by the CDSP 32.in the automatic gain control processing and for A3E demodulation and outputted on lines DR11 and DR12 to the CFPGA 30.

The data samples are outputted from the IF ASIC on lines DR 11 and DR12 and are routed by the CFPGA 30 to the CDSP 32 which was pre-programmed for the SSB, AME and A3E receiver modes of operation. In SSB, the CDSP accepts the input signals as different data streams and separates the data for voice and AGC processing, and the voice samples are examined for syllabic squelch. In A3E, the CDSP 32 uses the magnitude output of the cartesian to polar converter 206 for voice and AGC processing. A3E is processed further to remove the DC component left by the envelope detection. Squelch should be processed after the removal of this component.

The data outputs on lines DR11 and DR12 are applied to a voice sample buffer 650 to a voice filter and syllabic squelch circuit 651 which demodulates the 5Hz syllabic rate (which is modulated on the voice samples). The data outputs are also applied to a AGC sample buffer circuit 652 to a fine AGC circuit 653 which applies an AGC signal to the IF Gain 179 via line CR13. Another input to the fine AGC circuit 653 comes from an AGC circuit 657 in the BIOP 28. The output of the IF gain 125 is applied to a peak sample register 654 and via line CR10 to a course AGC circuit 655 and back via line CR11 via a RFAGC circuit 656 to the receiver 127.

The output signal from the voice filter and syllabic circuit 651 is applied via the CFPGA 30 to a comsec 658, or by passed to the format converter 659 via the dashed line 670. The output from the comsec 658 is also applied to the format converter 659 and is also coupled to the UART 671. Another input to the comsec 658 is applied by the BIOP front panel control 672.

Referring now to FIG. 57C, the signals on line DR14 are translated via VFPGA 40 to the AVS 530 switch in the VDSP 38. The output from the switch flows either directly to the analog interface circuit 532 or via the polyphase rate converter 534 and the AVS circuit 536. The BIOP 28 communicates with the comsec 538 and via the UART 540 line CR15 to the VDP control circuit 542 which provides the mute and volume signals to the audio out circuit 544.

27) Single Sideband AME and A3E Transmitter

For transmitting amplitude modulated analog voice waveforms, the analog signals are converted to multi bit digital signals or samples by an A/D converter 600 and applied to the VDSP 38, which high pass filters the signals to remove any random DC offset. At this point the processing differs a bit for the three AM waveforms, although the block diagrams do not change.

For J3E, if the mode is SSB, the samples are centered by the IF ASIC 24 at the sideband of interest (UBS/LSB), low pass filtered to remove DC and the extraneous sidebands, up sampled and converted into a SSB waveform with a virtual carrier centered at the IF frequency as commanded by the I/O processor.

For A3E, if this mode is AM as a specified DC offset is added to create the large carrier signal. The signal is low pass filtered (at the IF filter bandwidth), up sampled and converted into an AM waveform with a carrier centered at the IF frequency commanded by the I/O processor.

For H3E, if this mode is AME as a specified DC offset is added to the signal to create the large carrier signal. The signal is centered so that the carrier and the highest frequency component are equally spaced from DC. It is then low pass filtered (at the IF filter bandwidth) to remove the lower sideband, up sampled and converted into an AME waveform with a carrier centered at IF frequency commanded by the I/O processor.

Figure 58A:
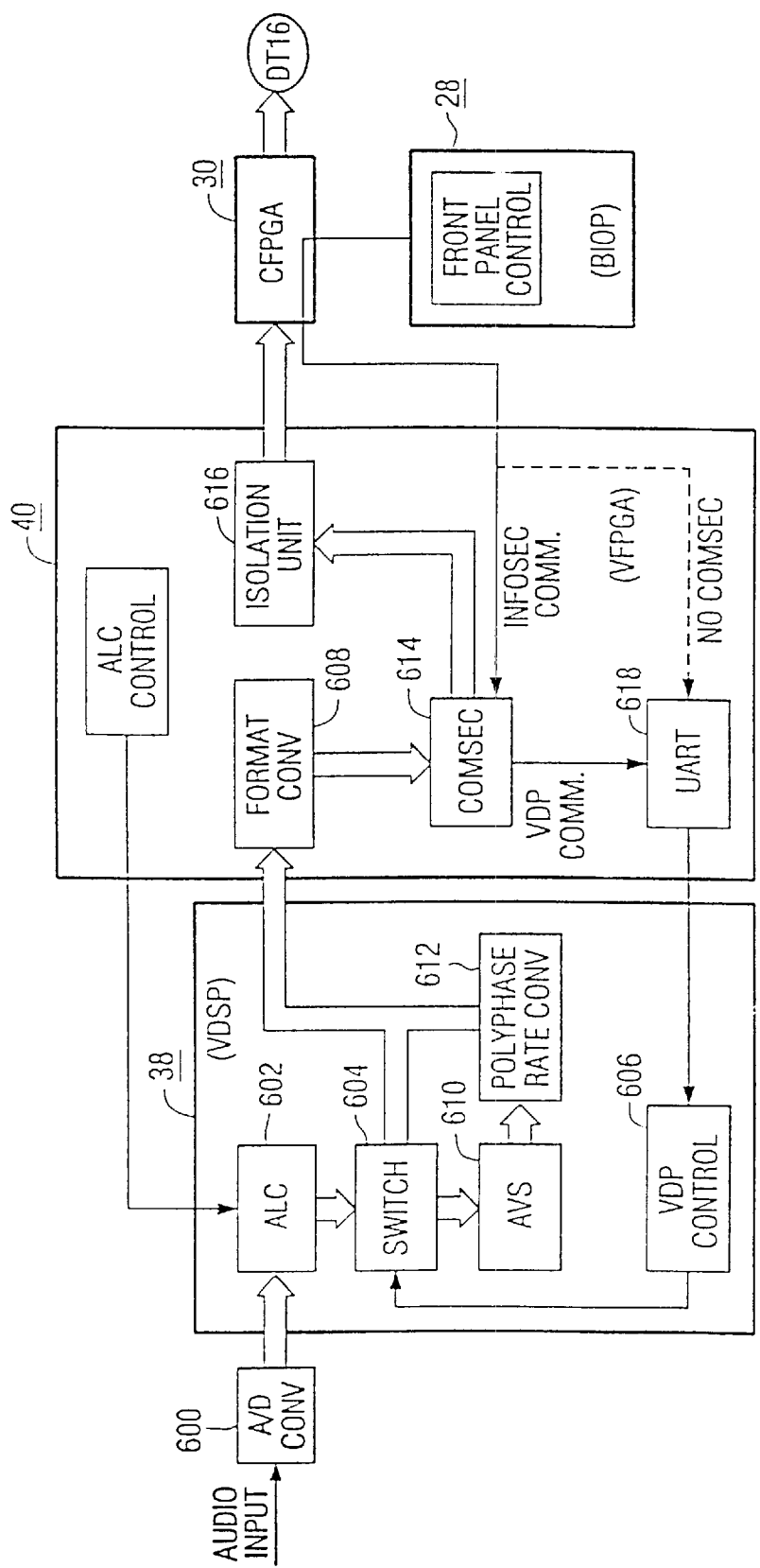
FIGS. 58A and 58B include a block diagram of the field programmable radio frequency communications system configured in a transmitter mode for single sideband, AME and A3E signaling schemes.
Figure 58B:
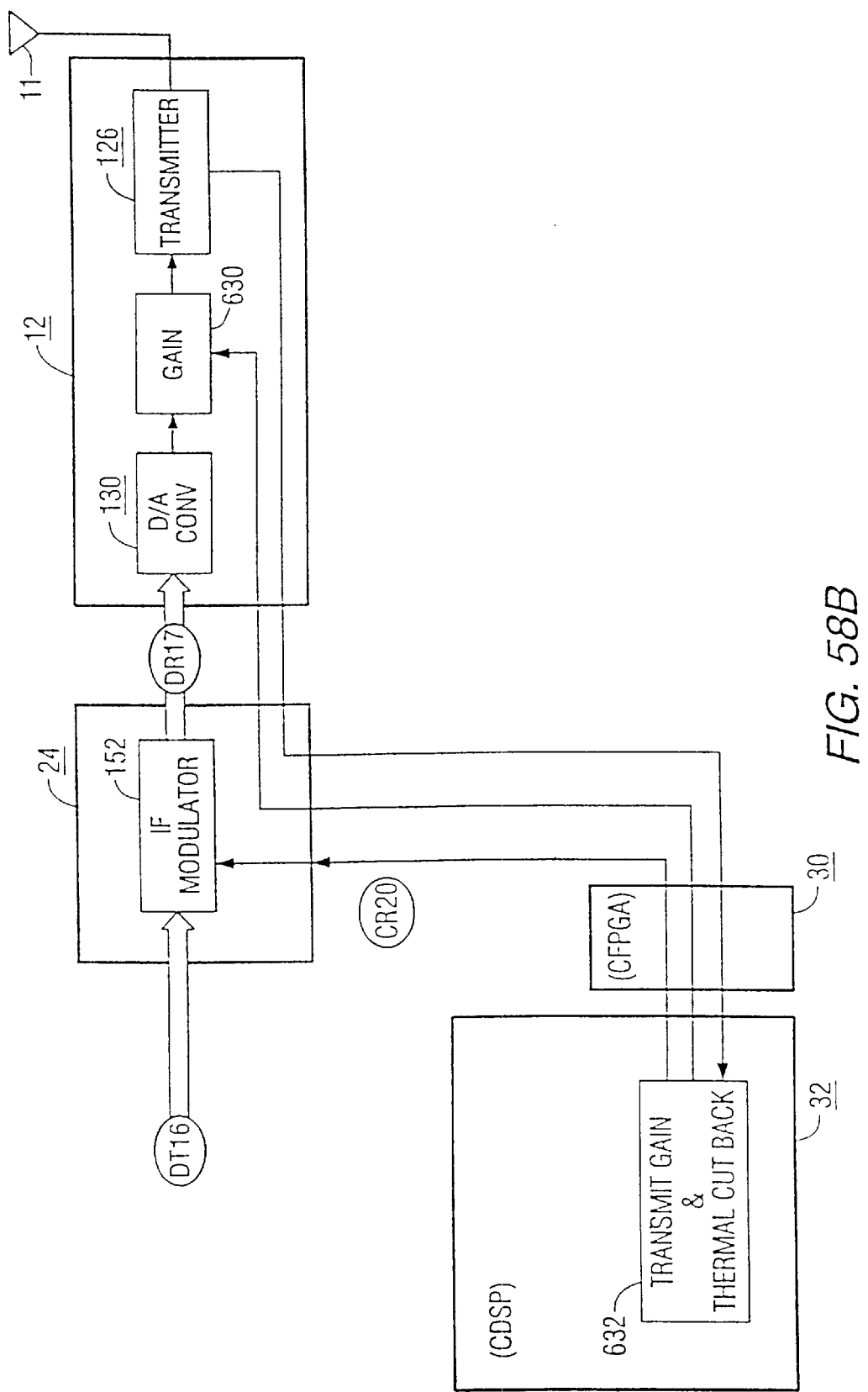

In FIGS. 58A and 58B. analog input signals are applied via the A/D converter to an ALC circuit in the VDSP 38 as multi bit digital signals, which in turn applies the signals to the switch 604. Under the VDP control 606, which controls the switch 604, the signals are applied directly to a format converter in the VFPGA 40 or through the AVS (audio voice security) circuit 610 and the polyphase rate converter 612. The output of the format converter 608 is applied via the COMSEC 614 to the isolation unit 616. The COMSEC 614 is under the control of the BIOP 28. Control information is also applied via the UART 618 to the VDP control 606.

Figure 60:
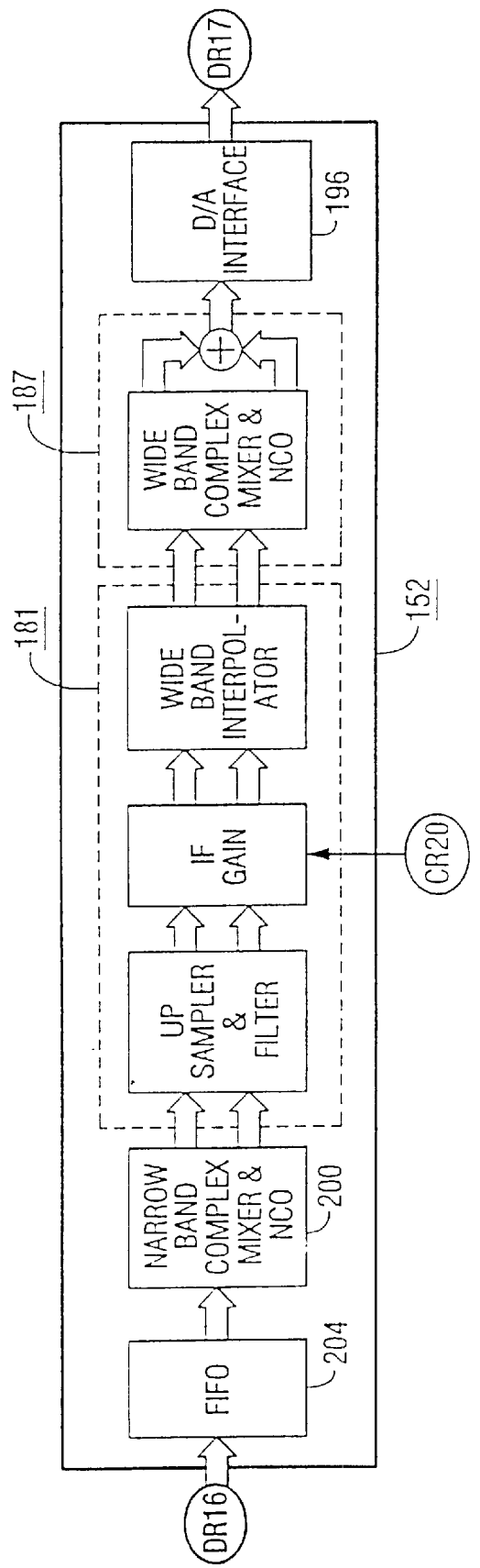
FIG. 60 includes a block diagram of the IF subsystem configured to function with the transmitter block diagrams of FIGS. 58A and 58B.

The output on line DT16 from the CFPGA 30 is applied to IF ASIC 24 configured as illustrated in FIG. 60. The signal input to the IF ASIC 24 are formatted baseband multi bit digital samples, the IF peak power gain control data, the backend function configurations and the PFIR coefficients. The IF peak control value scales the AM signal for the desired output. The output is the AM modulated voice waveform. The multi bit digital signals are applied via the FIFO 204 to the narrowband mixer and NCO 200 which moves the center of the sideband of interest to be centered at 0Hz so that the interpolate and filter processing which follows can filter the unwanted DC offset and extra sideband using low pass filters. The IF gain is used for transmit gain control and is dynamically updated by its control registers. The PFIR is responsible for the band width of the baseband signal. For SSB the wideband frequency is equal to the desired IF frequency of the desired sideband. The result is multiplied by the signal from the up sample and filter circuits to produce the desired SSB signal. For AME, the wideband frequency is equal to the desired IF frequency plus 1500 Hz. The result is multiplied by the signal from the up sampler and filter circuit to produce the desired AME signal. For A3E, the wideband frequency is equal to the desired If frequency. The result is multiplied by the signal from the up sample and filter circuits to produce the desired A3E signal.

The FIFO 204 accepts the baseband multi bit digital signals and applies output signals via line DR17 to the D/A converter 130 of the transmitter subsystem 12. The gain circuit 630 and transmitter stage 126 are controlled by signals from the transmit gain and thermal cut back circuit 632. The same circuit controls the gain of the IF ASIC 24.

Figure 62:
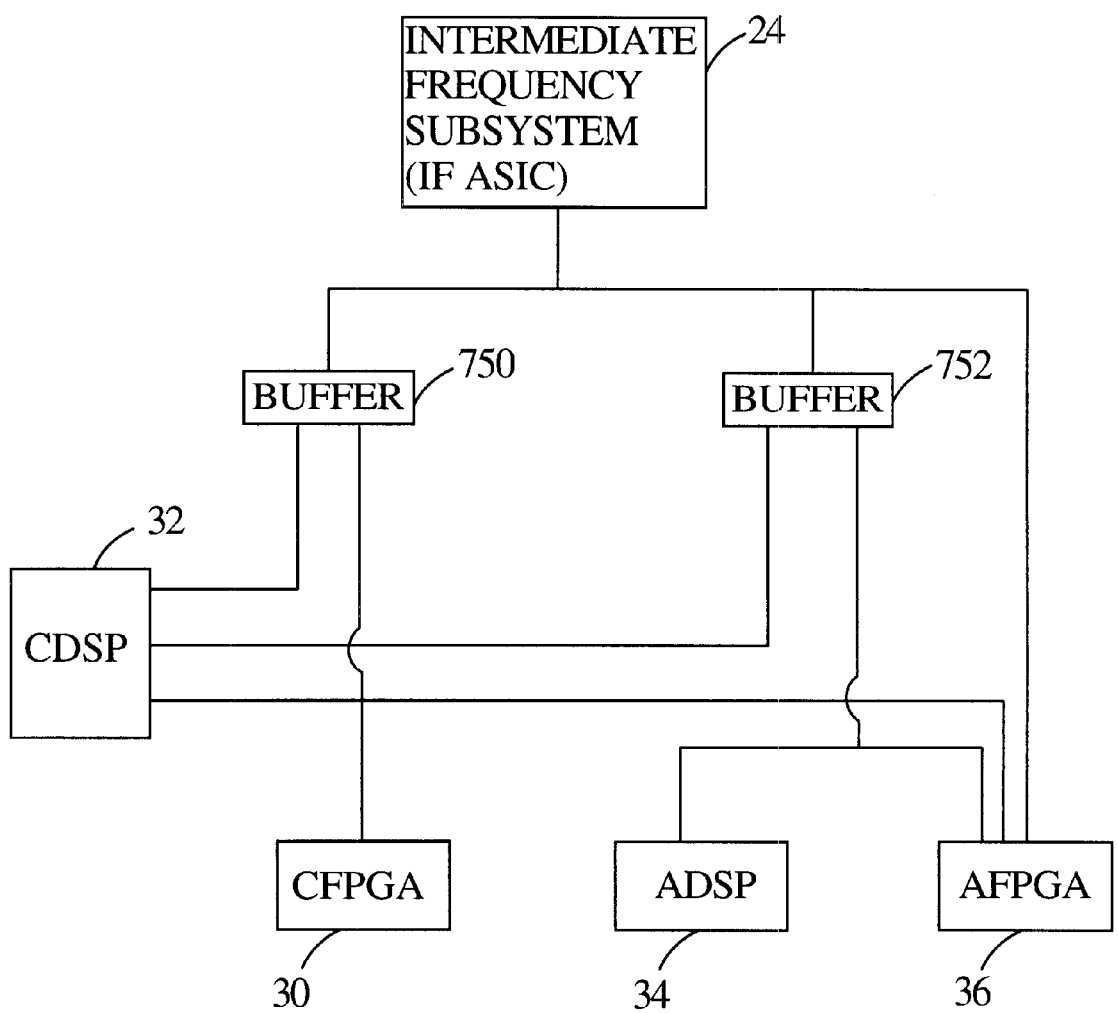
FIG. 62 includes a buffered arrangement for the IF ASIC.

In FIG. 62, a pair of buffers 750 and 752 are connected to the input and the output of the IF ASIC 24 to provide access to the IF ASIC 24 on a multiplex or switched basis. A portion of the radio frequency communications system, including the CDSP32, CFPGA 30, ADSP 43 and AFPGA 36, are coupled to the buffers 750 and 752, while the AFPGA 36 is also directly coupled to the IF ASIC 24. The CDSP 32 controls the input and output of the buffers 750 and 752 on a multiples or switched basis, the CFPGA 30, the ADSP 34 and the AFPGA 36. In this arrangement two separate signal process arrangements can be configured to process signals into and out of the buffers on a multiplexed or switched basis. For example, the CFPGA can be configured to run a fast program at a high timing rate of 20 Khz that requires almost continuous access to the IF ASIC 24, such as those involved in timing, sync detection, carrier tracking, AGC, etc., while the ADSP 34 and the AFPGA 36 to run a slower process that involves processing blocks of data at a time at for example a rate of 20 hz such as that involved in ARQ. The buffers 750 and 752 can be controlled by the CDSP 32 to be multiplexed or switched to provide signals to, or receive signals from the IF ASIC, as required by the two signal processing arrangements. Hence, the CFPGA 30 can have almost continuous access to the IF ASIC 24, and only be periodically interrupted as required for the slower process run by the AFPGA 34 and the ADSP 34.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A field configurable digital intermediate frequency modulator circuit comprising:
 a configurable digital numerical controlled oscillator for providing a cosine output digital intermediate carrier frequency and a sine output digital intermediate carrier frequency, and having input circuits responsive to the digital signals for controlling the center frequency of oscillation, for controlling the frequency offset and for controlling the phase offset;

first and second configurable digital signal conditioning circuits adapted to receive digital input baseband signals for up sampling and filtering the input baseband digital signals;

first and second configurable digital mixer circuits for receiving the cosine intermediate frequency carrier and the sine intermediate frequency carrier, respectively, and for receiving the output digital signals from the first and second digital signal conditioning circuits for modulation with the cosine and sine intermediate carrier frequencies;

a digital summing circuit for summing the output of the first and second mixers to provide a combined digital intermediate frequency modulated output signal, and a control circuit coupled between one of the digital signal conditioning circuits and one of the mixer circuits, responsive to the digital signals for selectively coupling the output of one of the digital signal conditioning circuits to one of the mixer circuits, the numerical controlled oscillator frequency offset input, and the numerical controlled oscillator phase offset input circuit.

2. A field configurable digital intermediate frequency modulator circuit as defined in claim 1 wherein:

the control circuit comprises a gating circuit responsive to digital control signals designating angle modulation mode of operation for coupling the digital signal conditioning circuit to the numerical controlled oscillator offset input circuits.

3. A field configurable digital intermediate frequency modulator circuit as defined in claim 2 wherein:

the control circuit comprises a gating circuit responsive to digital control signals designating frequency modulation mode of operation for coupling the digital signal conditioning circuit to the numerical controlled oscillator frequency offset input circuit.

4. A field configurable digital intermediate frequency modulator circuit as defined in claim 2 wherein:

the control circuit comprises a gating circuit responsive to digital control signals designating phase modulation mode of operation for coupling the digital signal conditioning circuit to the numerical controlled oscillator phase offset input circuit.

5. A field configurable digital intermediate frequency modulator circuit as defined in claim 2 wherein:

the other mixer circuit is responsive to digital control signals designating the frequency modulation mode of operation to become deactivated.

6. A field configurable digital intermediate frequency modulator circuit as defined in claim 2 wherein:

the digital signal sample rate from the digital signal conditioning circuit coupled by the gating circuit to the frequency offset input is approximately at a center frequency rate for the angle modulation mode of operation.

7. An angle modulator circuit comprising:

a digital baseband signal conditioning circuit including an up sampling circuit for increasing a sample rate of the digital baseband signals to approximately a center frequency of the numerical controlled oscillator for angle modulation, a digital numerical controlled oscillator for providing an output digital intermediate carrier frequency and having input circuits responsive to the upconverted baseband digital signals for controlling the center intermediate frequency and for controlling angle offset;

and circuit means for coupling the upconverted baseband signals output from the conditioning circuit to an angle offset input of the numerical controlled oscillator wherein the numerical controlled oscillator provides a digital output intermediate frequency that is angle modulated by the digital baseband signals.

8. An angle modulator circuit as defined in claim 7 wherein:

the conditioning circuit includes series coupled digital filter and interpolator circuits that up sample the baseband sample rate.

9. An angle modulation circuit as defined in claim 8 wherein:

the conditioning circuit includes a series coupled PRIR filter, a CFIR filter and a CIC filter interpolator circuit.

10. An angle modulation circuit as defined in claim 7 wherein:

the circuit means couples the output of the conditioning circuit to a frequency offset input wherein the numerical controlled oscillator provides a digital output intermediate frequency that is frequency modulated by the digital baseband signals.

11. An angle modulation circuit as defined in claim 7 wherein:

the circuit means couples the output of the conditioning circuit to the phase offset input wherein the numerical controlled oscillator provides a digital output intermediate frequency that is phase modulated by the digital base band signals.

12. A method of angle modulating digital baseband signal with a digital intermediate frequency comprising:

increasing a sample rate of the digital baseband signals to approximately a rate of the center frequency modulation intermediate frequency, and applying the digital baseband signals at the increased sample rate to an angle offset control input of a numerical controlled oscillator.

13. A method as defined in claim 12 wherein:

the increasing sample rate step includes a conditioning step for conditioning the baseband digital signals for frequency modulation.

14. A method as defined in claim 12 wherein:

the increasing sample rate step includes a conditioning step for conditioning the baseband digital signals for phase modulation.

15. A method as defined in claim 12 wherein:

the conditioning step includes a filter process including series coupled PFIR, CFIR and CIC filters.

16. A digital intermediate frequency digital signal processing circuit that is adapted to be field configurable into plural modulator and demodulator modes of operation comprising:

a configurable digital signal processing circuit for sampling and filtering digital baseband signals;

a configurable digital numerical controlled oscillator for receiving baseband signals from said digital signal processing circuit and for providing digital intermediate frequency carrier signals in response thereto;

a configurable digital mixer circuit for receiving the digital intermediate frequency carrier signals and, control circuit means for receiving configuration commands for configuring the intermediate frequency digital signal processing circuit for a plurality of modulator and demodulator modes of operation, and responsive to the configuration commands for configuring the digital numerical controlled oscillator, the digital signal processing circuit, and the digital mixer circuit to function in the selected modulator and demodulator mode of operation.

17. A field configurable digital intermediate frequency digital signal processing circuit as defined in claim 16 wherein:

the control circuit means configures the digital signal processing circuit with the modulator mode of operation to receive multi-bit baseband digital signals after being processed by the digital signal processing circuit and applies the processed multi-bit baseband digital signals to the digital mixer circuit to output intermediate frequency modulated multi-bit digital signals, and the control circuit means configures mixer circuit in the demodulator mode of operation to receive intermediate frequency modulated multi-bit digital signals and apply baseband multi-bit digital signals to the digital signal processing circuit.

18. A field configurable digital intermediate frequency digital signal processing circuit as defined in claim 17 wherein:

the control circuit means receives commands for the modulator and demodulator modes of operation as well as commands for operation with a plurality of signaling schemes, and the control circuit means configures the intermediate frequency digital signal processing circuit for the selected modulator and demodulator modes of operation and for the selected signaling scheme.

19. A field configurable digital intermediate frequency digital signal processing circuit as defined in claim 18 wherein:

the configurable digital numerical controlled oscillator provides a first output digital intermediate frequency carrier signal having a first phase and a second digital intermediate frequency carrier signal having a second phase different from the first phase;

the digital signal processing circuit includes first and second configurable digital signal processing circuits;

the mixer circuit includes first and second configurable digital mixer circuits for receiving the first digital intermediate frequency carrier signal and the second digital intermediate frequency carrier signal, respectively, and the control circuit configures the digital numerical controlled oscillator, the first and second digital signal processing circuits, and the first and second digital mixer circuits to function in the selected modulator and demodulator mode of operation.

20. A field configurable digital intermediate frequency digital signal processing circuit as defined in claim 19 wherein:

the first and second digital signal processing circuits and the first and second digital mixer circuits are configurable to function in both the modulator and demodulator modes of operation.

21. A field configurable digital intermediate frequency digital signal processing circuit as defined in claim 20 wherein:

the same first and second digital signal processing circuits are configured to process baseband digital signals in the modulation mode of operation and configured to process intermediate frequency modulated digital signals in the demodulator mode of operation.

22. A field configurable digital intermediate frequency digital signal processing circuit as defined in claim 21 wherein:

the first and second digital signal processing circuits process digital signals in opposite directions when configured in the modulator and demodulator modes of operation.

* * * * *